US010658484B2

(12) United States Patent
Leobandung

(10) Patent No.: US 10,658,484 B2
(45) Date of Patent: May 19, 2020

(54) NON-PLANAR FIELD EFFECT TRANSISTOR DEVICES WITH WRAP-AROUND SOURCE/DRAIN CONTACTS

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 16/411,541

(22) Filed: May 14, 2019

(65) Prior Publication Data

US 2019/0273144 A1    Sep. 5, 2019

Related U.S. Application Data

(62) Division of application No. 15/822,724, filed on Nov. 27, 2017.

(51) Int. Cl.
*H01L 29/775* (2006.01)
*H01L 29/66* (2006.01)
(Continued)

(52) U.S. Cl.
CPC .... *H01L 29/42392* (2013.01); *H01L 29/0673* (2013.01); *H01L 29/41733* (2013.01); *H01L 29/66439* (2013.01); *H01L 29/66545* (2013.01); *H01L 29/66772* (2013.01); *H01L 29/66818* (2013.01); *H01L 29/775* (2013.01); *H01L 29/78618* (2013.01); *H01L 29/78654* (2013.01); *H01L 29/78696* (2013.01); *H01L 2029/7858* (2013.01)

(58) Field of Classification Search
CPC ..... H01L 29/775; H01L 29/42; H01L 29/423; H01L 29/42392; H01L 29/66; H01L 29/78
USPC ........................................................ 257/369
See application file for complete search history.

(56) References Cited

U.S. PATENT DOCUMENTS 6,303,962 B1    10/2001  Gardner et al.
7,060,580 B2    6/2006   Cho et al.
(Continued)

OTHER PUBLICATIONS

List of IBM Patents or Patent Applications Treated as Related.

*Primary Examiner* — Fazli Erdem
(74) *Attorney, Agent, or Firm* — Vazken Alexanian; Ryan, Mason & Lewis, LLP

(57) ABSTRACT

Non-planar field effect transistor (FET) devices having wrap-around source/drain contacts are provided, as well as methods for fabricating non-planar FET devices with wrap-around source/drain contacts. A method includes forming a non-planar FET device on a substrate, which includes a semiconductor channel layer, and a gate structure in contact with upper and sidewall surfaces of the semiconductor channel layer. First and second source/drain regions are formed on opposite sides of the gate structure in contact with the semiconductor channel layer. First and second recesses are formed in an isolation layer below bottom surfaces of the first and second source/drain regions, respectively. A layer of metallic material is deposited to fill the first and second recesses in the isolation layer with metallic material and form first and second source/drain contacts which surround the first and second source/drain regions.

20 Claims, 43 Drawing Sheets

(51) Int. Cl.
  *H01L 29/78* (2006.01)
  *H01L 29/423* (2006.01)
  *H01L 29/06* (2006.01)
  *H01L 29/786* (2006.01)
  *H01L 29/417* (2006.01)

(56) References Cited

U.S. PATENT DOCUMENTS

| | | |
|---|---|---|
| 7,115,479 B2 | 10/2006 | Lin et al. |
| 7,135,699 B1 | 11/2006 | Atanackovic |
| 7,893,506 B2 | 2/2011 | Chau et al. |
| 7,923,743 B2 | 4/2011 | Bojarczuk, Jr. et al. |
| 8,313,999 B2 | 11/2012 | Cappellani et al. |
| 8,611,953 B2 | 12/2013 | Jordan et al. |
| 8,753,942 B2 | 6/2014 | Kuhn et al. |
| 9,257,289 B2 | 2/2016 | Leobandung et al. |
| 9,281,198 B2 | 3/2016 | Adam et al. |
| 9,362,355 B1 | 6/2016 | Cheng et al. |
| 9,412,843 B2 | 8/2016 | Harley et al. |
| 9,685,521 B2 | 6/2017 | Leobandung et al. |
| 10,049,938 B2 | 8/2018 | Wang et al. |
| 2004/0063289 A1 | 4/2004 | Ohta |
| 2009/0315120 A1 | 12/2009 | Shifren et al. |
| 2013/0341704 A1* | 12/2013 | Rachmady ........ H01L 29/66545 257/327 |
| 2014/0001441 A1 | 1/2014 | Kim et al. |
| 2014/0001520 A1 | 1/2014 | Glass et al. |
| 2014/0017890 A1 | 1/2014 | Cohen et al. |
| 2014/0092506 A1 | 4/2014 | Ahsan et al. |
| 2014/0145312 A1 | 5/2014 | Wang et al. |
| 2014/0209865 A1* | 7/2014 | Pillarisetty ........ H01L 29/42392 257/29 |
| 2014/0225065 A1* | 8/2014 | Rachmady ........ H01L 29/42392 257/24 |
| 2015/0123215 A1 | 5/2015 | Obradovic et al. |
| 2015/0295084 A1 | 10/2015 | Obradovic et al. |
| 2016/0064286 A1 | 3/2016 | Dilliway et al. |
| 2016/0071729 A1 | 3/2016 | Hatcher et al. |
| 2016/0148936 A1 | 5/2016 | Xu et al. |
| 2018/0090582 A1 | 3/2018 | Adusumilli et al. |
| 2018/0226490 A1* | 8/2018 | Le .......................... B82Y 10/00 |
| 2019/0172941 A1* | 6/2019 | Rachmady ........ H01L 29/41791 |

* cited by examiner

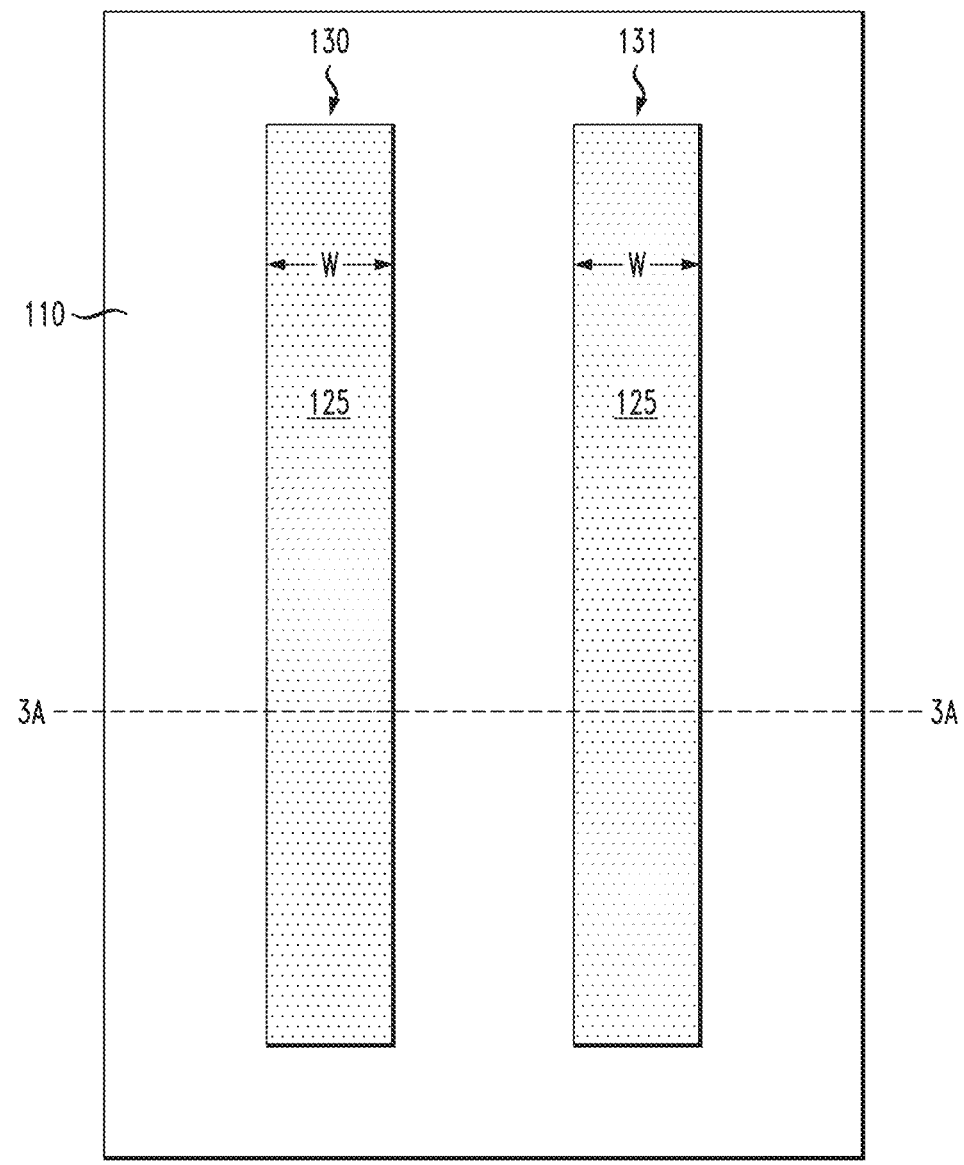

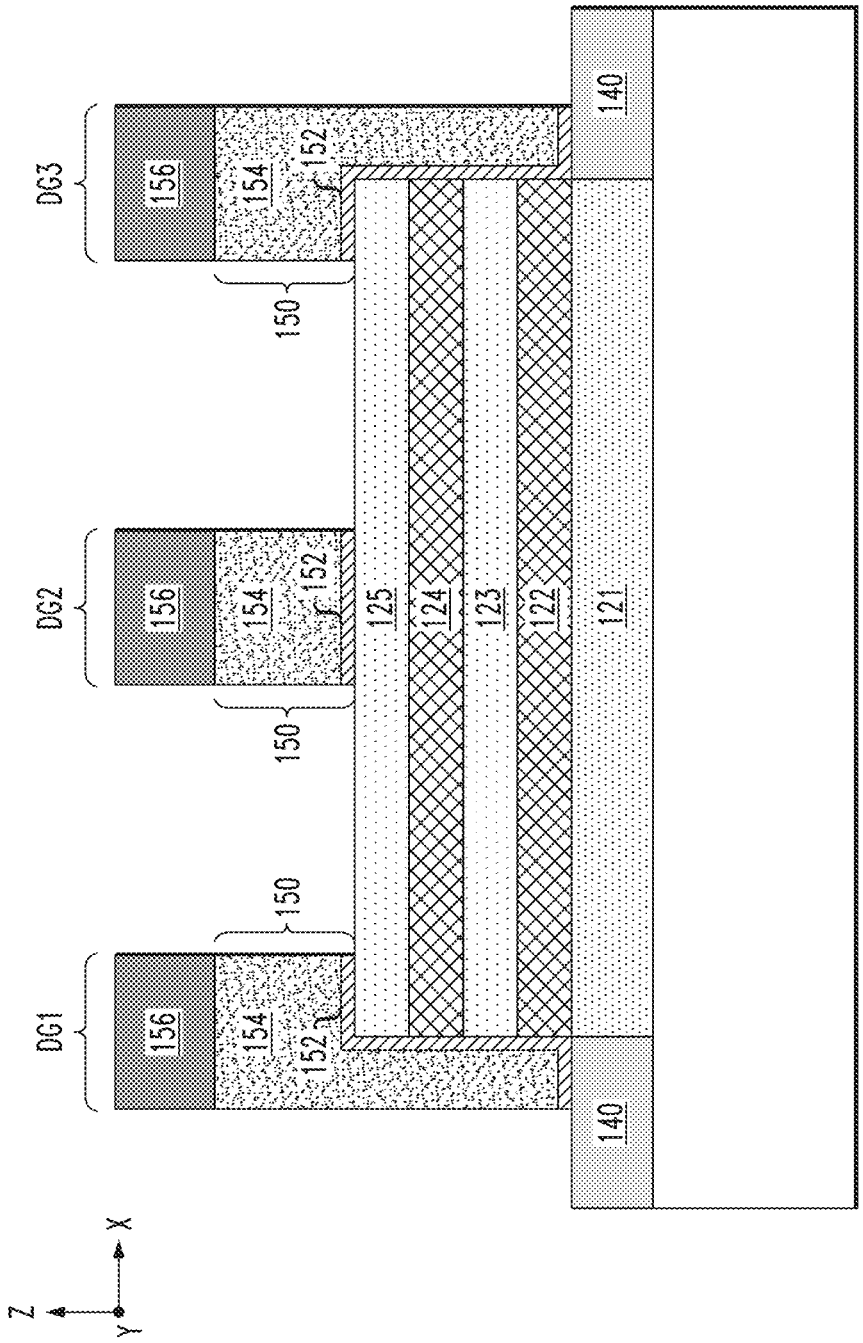

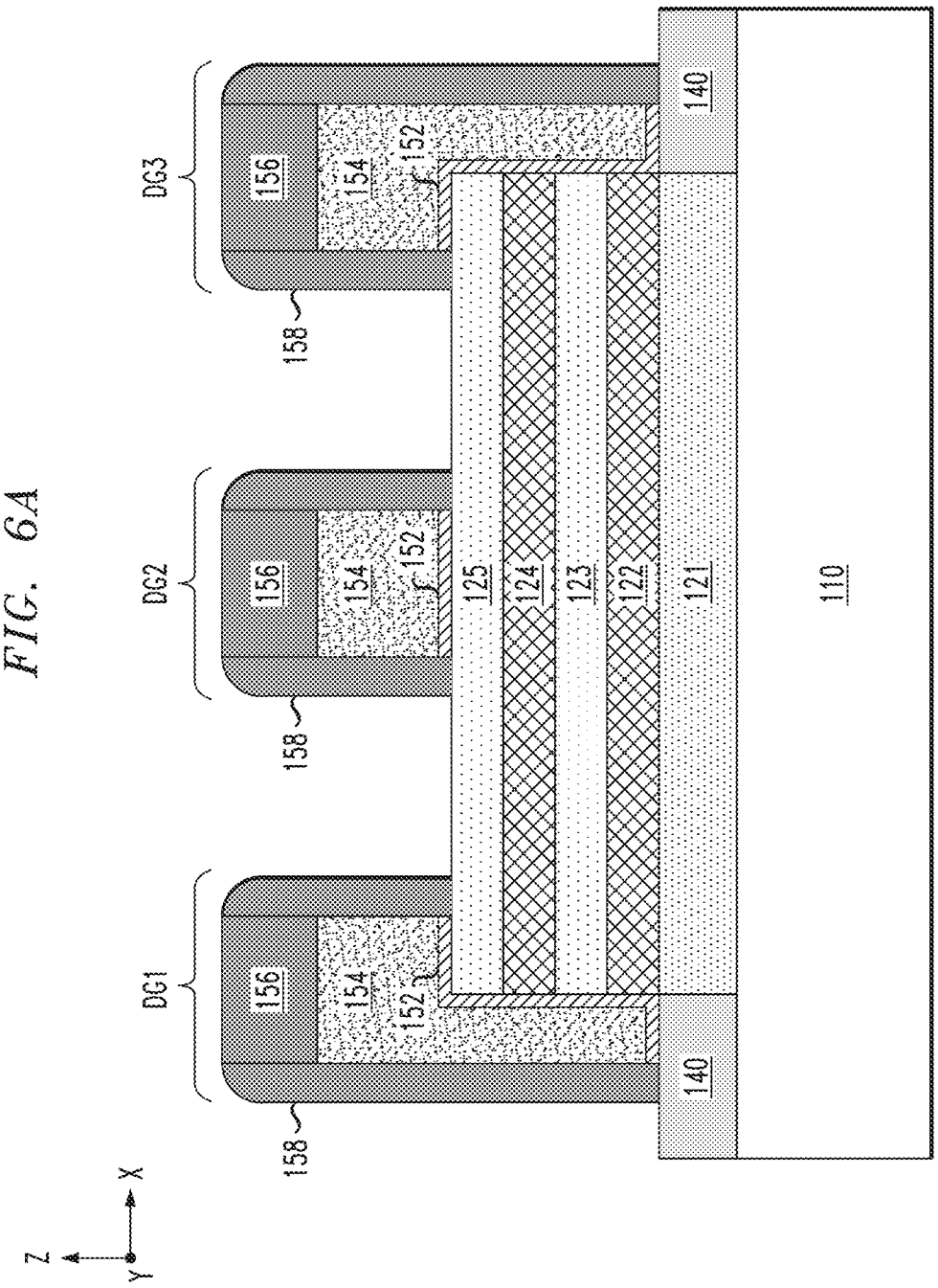

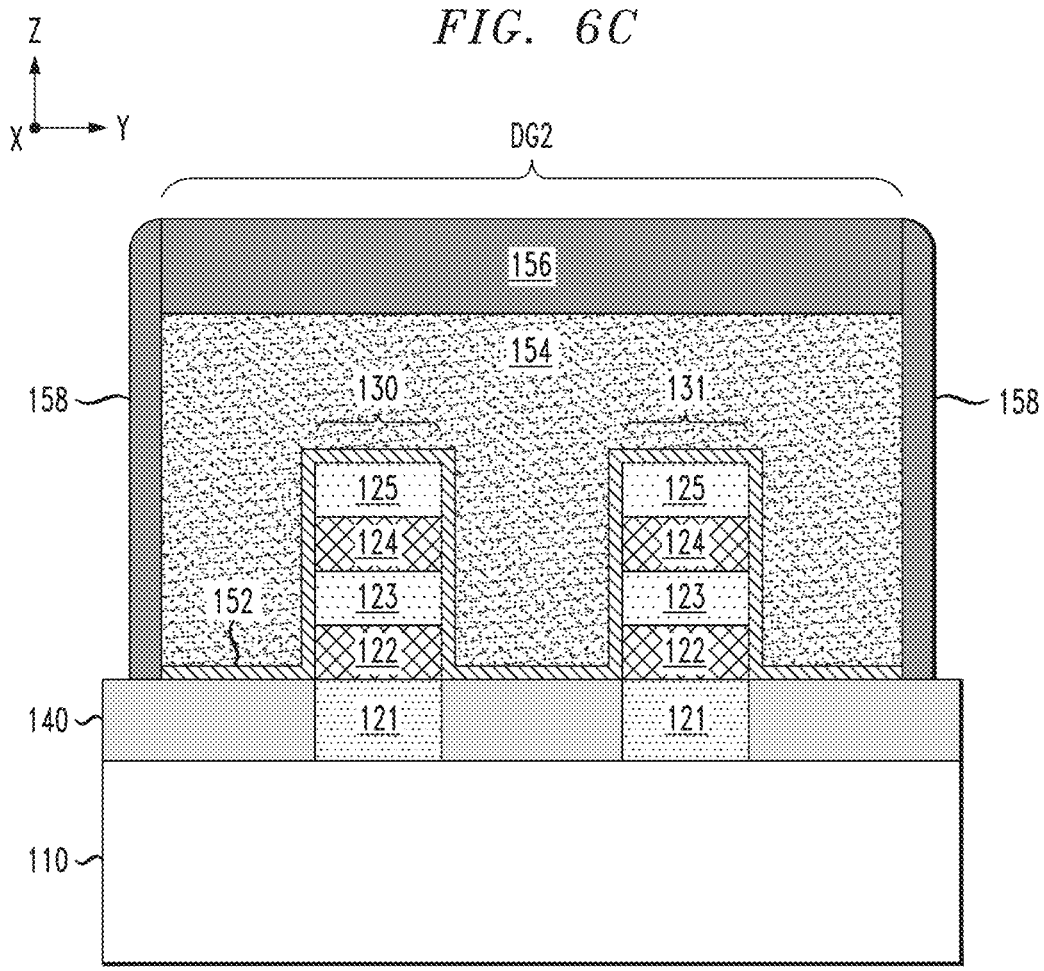

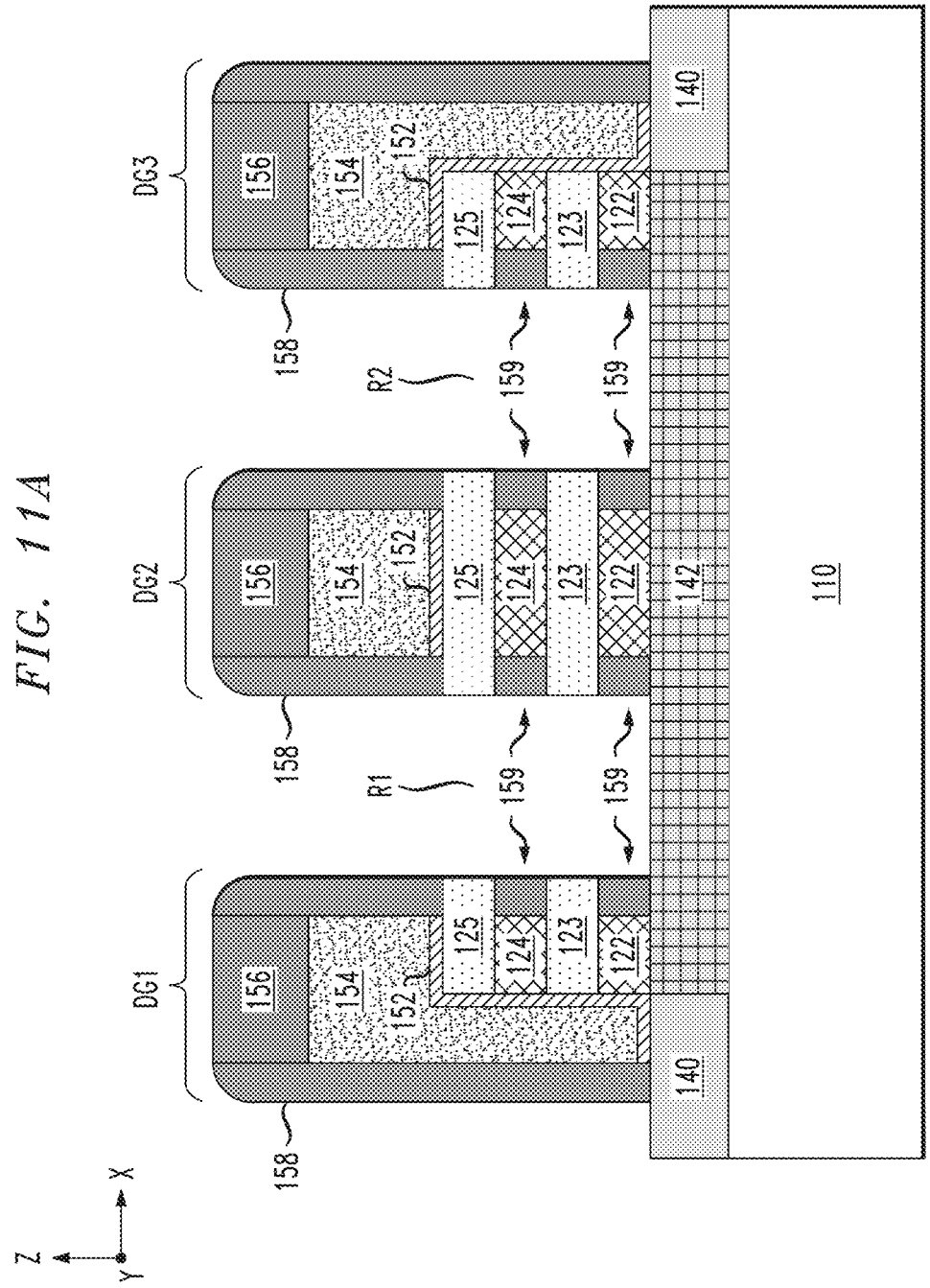

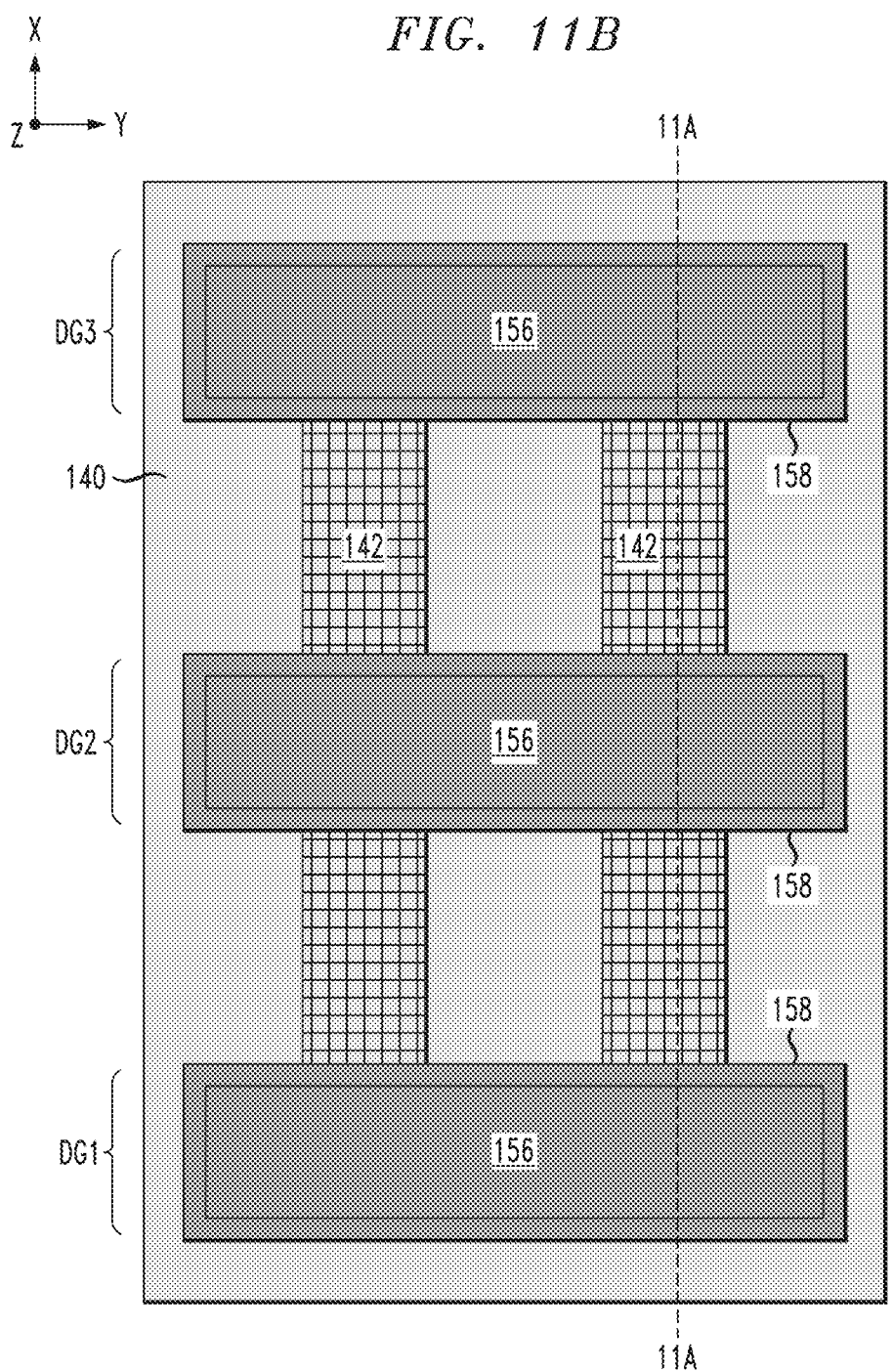

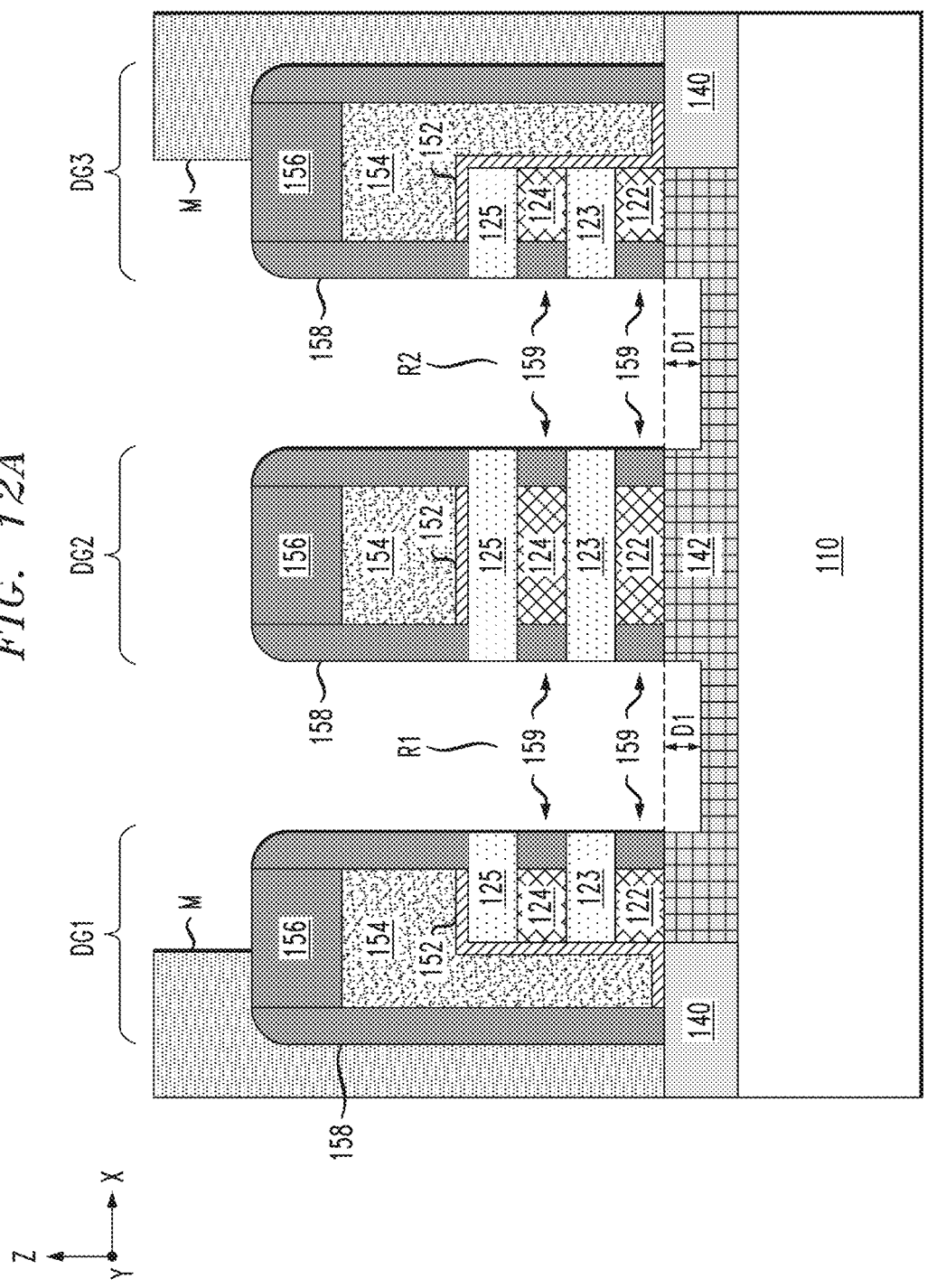

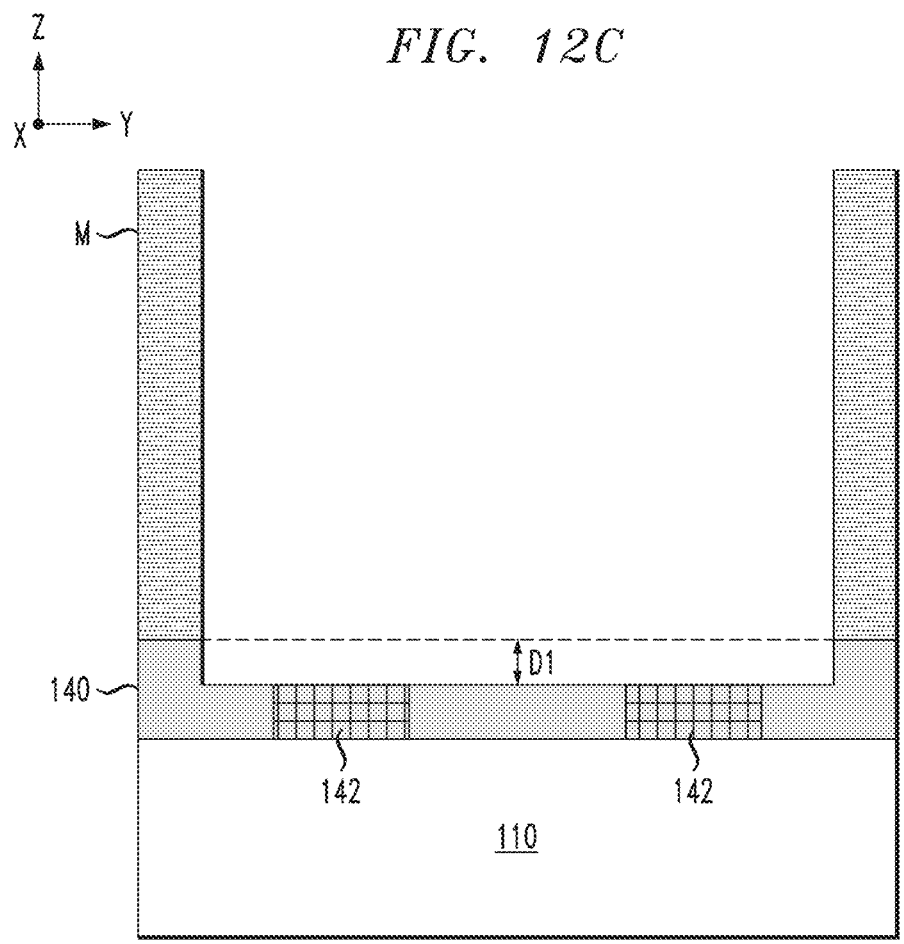

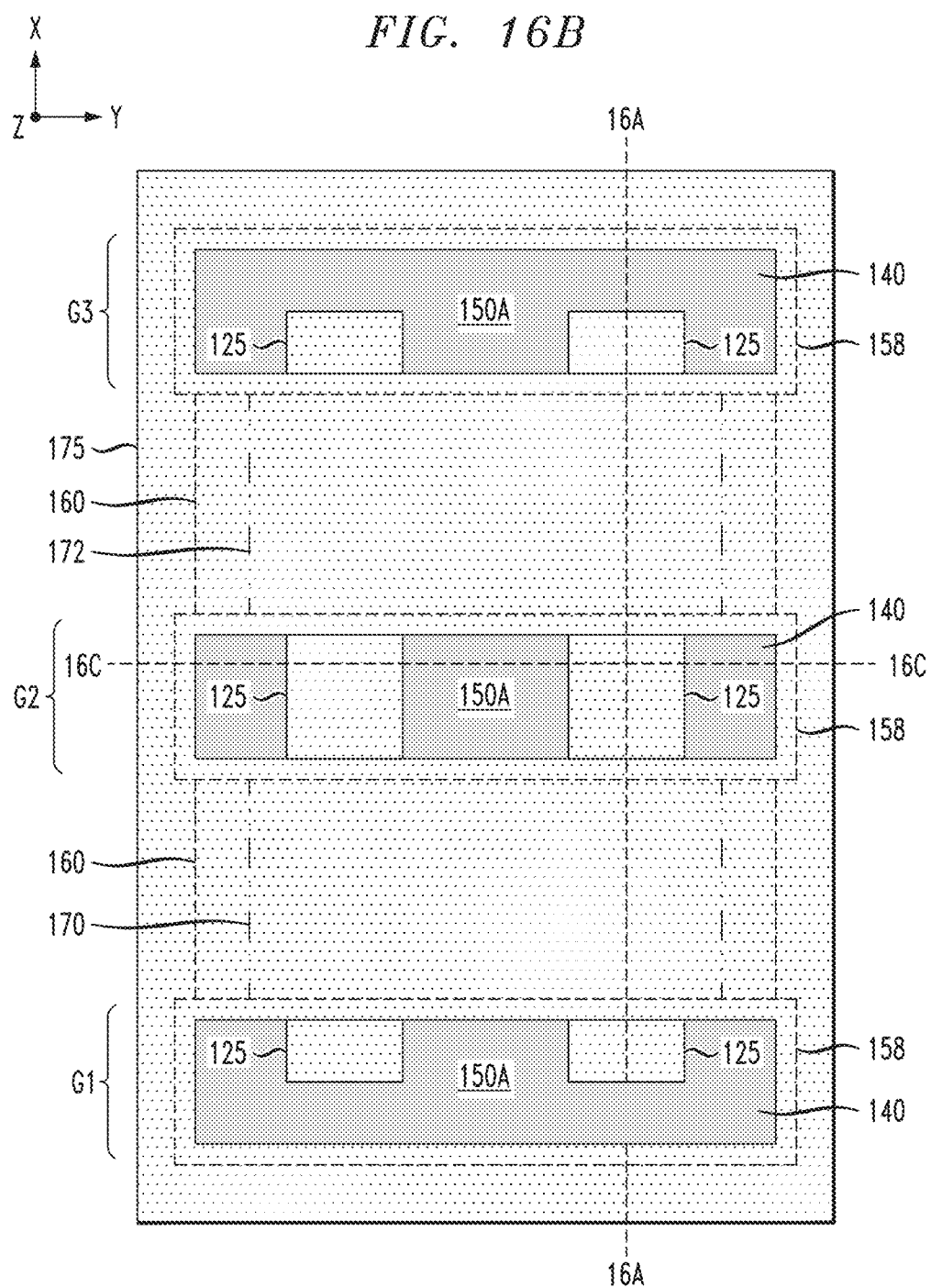

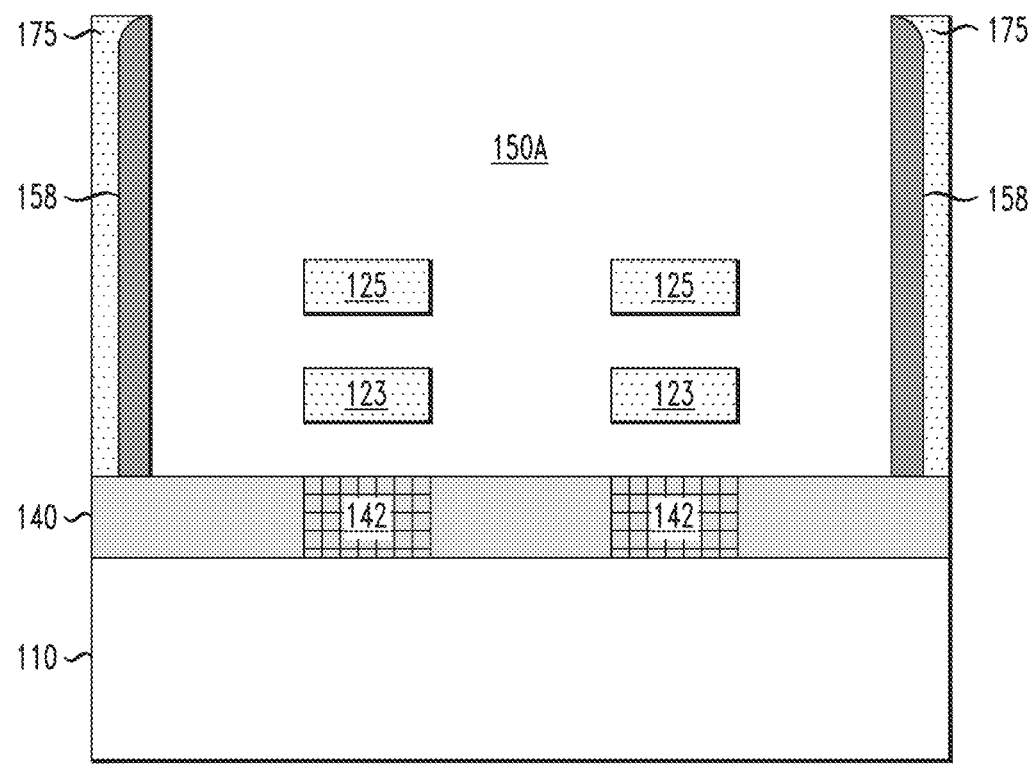

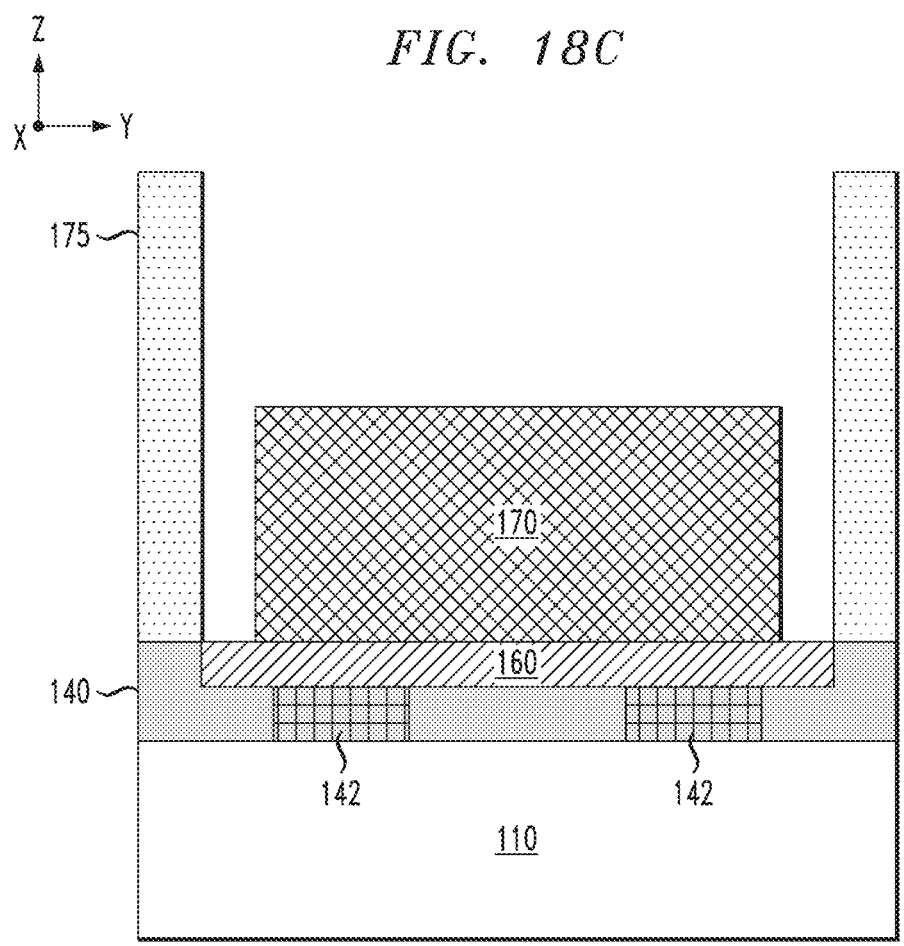

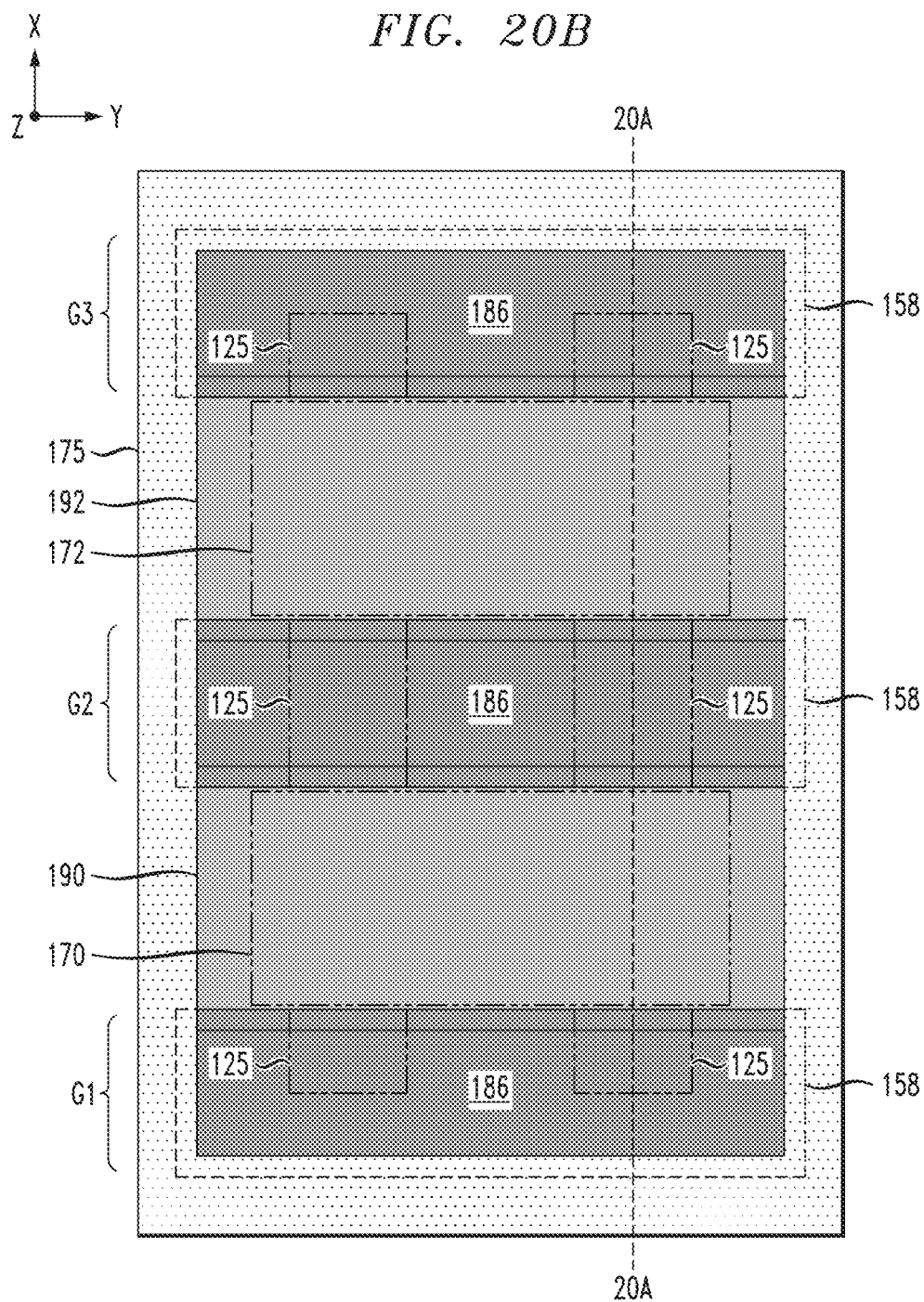

NON-PLANAR FIELD EFFECT TRANSISTOR DEVICES WITH WRAP-AROUND SOURCE/DRAIN CONTACTS

TECHNICAL FIELD

This disclosure relates generally to semiconductor fabrication techniques and, in particular, to structures and methods for fabricating non-planar field-effect transistor (FET) devices.

BACKGROUND

Continued innovations in semiconductor process technologies are enabling higher integration densities and device scaling. As the semiconductor industry moves towards the 7-nm technology node and beyond, semiconductor FET device structures must be scaled to smaller dimensions to provide increased device width per footprint area. In this regard, non-planar FET devices such as nanosheet FET devices, nanowire FET devices, vertical FET devices, Fin-FET devices, etc., are considered to be a viable option for continued CMOS scaling. In general, a nanowire FET device comprises a device channel which comprises one or more nanowire layers in a stacked configuration, wherein each nanowire comprises an elongated semiconductor layer that has a width which is substantially the same or slightly larger than a thickness of the elongated semiconductor layer. A nanosheet FET device is similar to a nanowire FET device sheet in that a device channel comprises one or more nanosheet layers in a stacked configuration, but wherein each nanosheet layer has a width which is substantially greater than a thickness of the nanosheet layer. In nanowire/nanosheet FET devices, a common gate structure is formed above and below each nanowire/nanosheet layer in the stacked configuration, thereby increasing the FET device width (or channel width), and thus the drive current, for a given footprint area. One challenge in fabricating nanowire/nanosheet FET devices is the ability to effectively reduce various parasitic elements in highly-scaled FET device structures. Such parasitic elements include, but are not limited to, parasitic capacitances between gate structures and surrounding features (e.g., substrate) and parasitic resistances between source/drain regions and source/drain contacts, etc. The parasitic elements cause leakage current, power dissipation, and otherwise contribute to degraded device performance.

SUMMARY

Embodiments of the invention include semiconductor devices comprising non-planar FET devices with wrap-around source/drain contacts, and methods for fabricating non-planar FET devices with wrap-around source/drain contacts, which serve to reduce parasitic resistances between source/drain regions and the wrap-around source/drain contacts.

In one embodiment, a method is provided for fabricating a semiconductor device. The method comprises: forming a non-planar FET device on a semiconductor substrate, wherein the non-planar FET device comprises a semiconductor channel layer, and a gate structure in contact with at least an upper surface and sidewall surfaces of the semiconductor channel layer; forming a first source/drain region which is disposed adjacent to a first side of the gate structure and in contact with the semiconductor channel layer; forming a second source/drain region which is disposed adjacent to a second side of the gate structure, opposite the first side of the gate structure, and in contact with the semiconductor channel layer; forming a first recess in an isolation layer below a bottom surface of the first source/drain region; forming a second recess in the isolation layer below a bottom surface of the second source/drain region; and depositing a layer of metallic material to fill the first and second recesses in the isolation layer with metallic material and form first and second source/drain contacts which surround the first and second source/drain regions, respectively. The first source/drain contact is formed in contact with an upper surface, sidewalls surfaces, and the bottom surface of the first source/drain region, and the second source/drain contact is formed in contact with an upper surface, sidewall surfaces, and the bottom surface of the second source/drain region.

In another embodiment, a method for fabricating a semiconductor device comprises: forming a nanowire stack structure on a semiconductor substrate, wherein the nanowire stack structure comprises a first sacrificial semiconductor layer disposed on the semiconductor substrate, a second sacrificial semiconductor layer disposed on the first sacrificial semiconductor layer, and a semiconductor channel layer disposed on the second sacrificial semiconductor layer; forming a first isolation layer on the semiconductor substrate, wherein the first isolation layer comprises a thickness which is substantially equal to a thickness of the first sacrificial semiconductor layer of the nanowire stack structure; forming a dummy gate structure over a portion of the nanowire stack structure; etching exposed portions of the nanowire stack structure, which are not covered by the dummy gate structure, down to an upper surface of the first sacrificial semiconductor layer of the nanowire stack structure; laterally recessing exposed sidewall surfaces of the second sacrificial semiconductor layer to form recesses in sidewalls of the nanowire stack structure, wherein the lateral recessing is performed by etching the second sacrificial semiconductor layer selective to the first sacrificial semiconductor layer and the semiconductor channel layer; filling the recesses with dielectric material to form embedded gate sidewall spacers; etching away the first sacrificial semiconductor layer of the nanowire stack structure to form an opening that is surrounded by the first isolation layer; filling the opening with an insulating material to form a second isolation layer; forming a first recess region in the first and second isolation layers on a first side of the gate structure, and forming a second recess region in the first and second isolation layers on the second side of the gate structure; filling the first and second recess regions with a sacrificial material which has etch selectivity with respect to the first and second isolation layers, to form first and second dummy source/drain contact layers; forming a first source/drain region and a second source/drain region over the first dummy source/drain contact layer and the second dummy source/drain contact layer, respectively; replacing the dummy gate structure with a metal gate structure; etching away the first and second dummy source/drain contact layers selective to the first and second isolation layers to form first and second recesses below the first and second source/drain regions; and depositing a layer of metallic material to fill the first and second recesses with metallic material and form first and second source/drain contacts which surround the first and second source/drain regions, respectively.

In another embodiment, a semiconductor device comprises: a non-planar FET device formed on a semiconductor substrate, wherein the non-planar FET device comprises a semiconductor channel layer, and a gate structure in contact with at least an upper surface and sidewall surfaces of the semiconductor channel layer; a first source/drain region disposed adjacent to a first side of the gate structure and in contact with the semiconductor channel layer; a second source/drain region disposed adjacent to a second side of the gate structure, opposite the first side of the gate structure, and in contact with the semiconductor channel layer; a first recess formed in an isolation layer below a bottom surface of the first source/drain region; a second recess formed in the isolation layer below a bottom surface of the second source/drain region; a first source/drain contact formed in contact with an upper surface, sidewalls surfaces, and the bottom surface of the first source/drain region; and a second source/drain contact formed in contact with an upper surface, sidewalls surfaces, and the bottom surface of the second source/drain region, wherein the first and second source/drain contacts comprise metallic material that is disposed within the first and second recesses in the isolation layer to make contact with the bottom surfaces of the first and second source/drain regions.

Other embodiments will be described in the following detailed description of embodiments, which is to be read in conjunction with the accompanying figures.

BRIEF DESCRIPTION OF THE DRAWINGS

FIGS. 2 through 20B schematically illustrate a process flow for fabricating the semiconductor device of FIGS. 1A, 1B, 1C and 1D, according to an embodiment of the invention, wherein:

FIG. 2 is a schematic cross-sectional side view of the semiconductor device at an initial stage of fabrication in which a stack of epitaxial semiconductor layers is formed on a semiconductor substrate;

FIGS. 3A and 3B are schematic views of the semiconductor structure of FIG. 2 after patterning the stack of epitaxial semiconductor layers to form a plurality of nanowire stack structures;

FIGS. 5A, 5B, and 5C are schematic views of the semiconductor structure shown in FIGS. 4A and 4B after forming dummy gate stack structures with hard mask capping layers, which overlap portions of the nanowire stack structures;

FIGS. 6A, 6B, and 6C are schematic views of the semiconductor structure of FIGS. 5A, 5B, and 5C, respectively, after forming gate sidewall spacers on sidewalls of the dummy gate stack structures;

FIG. 8 is a schematic cross-sectional side view of the semiconductor structure shown in FIG. 7A after laterally recessing exposed sidewall surfaces of the sacrificial epitaxial semiconductor layers of the nanowire stack structures to form recesses in the sidewalls of the nanowire stack structures;

FIG. 9 is a schematic cross-sectional side view of the semiconductor structure shown in FIG. 8 after filling the recesses with dielectric material to form embedded gate insulating spacers on the sidewalls of the nanowire stack structures;

FIG. 10 is a schematic cross-sectional side view of the semiconductor structure shown in FIG. 9 after removing a bottom sacrificial epitaxial semiconductor layer of the nanowire stack structures to form an open region surrounded by the first isolation layer;

FIGS. 11 and 11B are schematic views of the semiconductor structure shown in FIG. 10 after filling the open region with insulating material to form a second isolation layer that is coplanar with the first isolation layer;

FIGS. 12A, 12B and 12C are schematic views of the semiconductor structure of FIGS. 11A and 11B after forming an etch mask and vertically recessing exposed portions of the first and second isolation layers between adjacent dummy gate structures to form recessed regions;

FIGS. 16A, 16B, and 16C are schematic views of the semiconductor structure shown in FIGS. 15A and 15B after removing the dummy gate structures and removing the remaining sacrificial epitaxial semiconductor layers of the nanowire stack structures to release the epitaxial semiconductor channel layers;

FIGS. 18A, 18B, and 18C are schematic views of the semiconductor structure shown in FIGS. 17A and 17B after patterning the pre-metal dielectric layer to expose upper and sidewall surfaces of the source/drain regions between adjacent gate structures and end portions of the underlying dummy source/drain contact layers adjacent to the sidewall surfaces of the first and second source/drain regions;

FIGS. 20A and 20B are schematic views of the semiconductor structure shown in FIGS. 19A and 19B, respectively, after forming wrap-around source/drain contacts that surround the upper, sidewall, and bottom surfaces of the first and second source/drain regions.

DETAILED DESCRIPTION

Figure 1A:
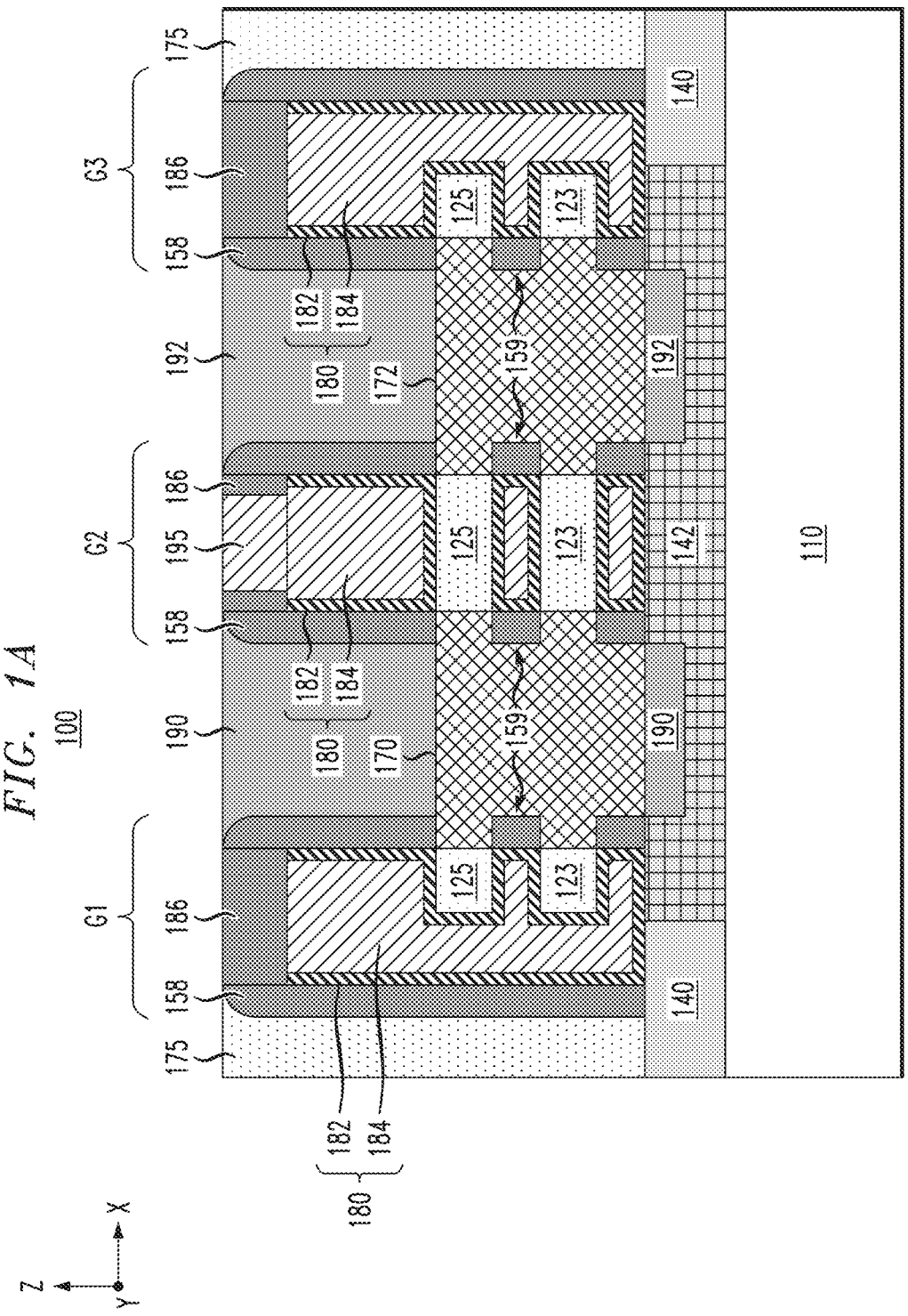
FIGS. 1A, 1B, 1C, and 1D are schematic views of a semiconductor device comprising a nanowire FET device with wrap-around source/drain contacts, according to an embodiment of the invention.

Embodiments of the invention will now be described in further detail with regard to semiconductor devices comprising non-planar FET devices with wrap-around source/drain contacts, and methods for fabricating non-planar FET devices with wrap-around source/drain contacts. For purposes of illustration, embodiments of the invention will be described in the context of nanowire FET devices, although the fabrication techniques discussed herein can be readily applied to fabricate other types of non-planar FET devices such as nanosheet FET devices and FinFET devices.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

To provide spatial context to the different structural orientations of the semiconductor structures shown throughout the drawings, XYZ Cartesian coordinates are shown in each of the drawings. The terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or a Y-direction of the Cartesian coordinates shown in the drawings.

Figure 1B:
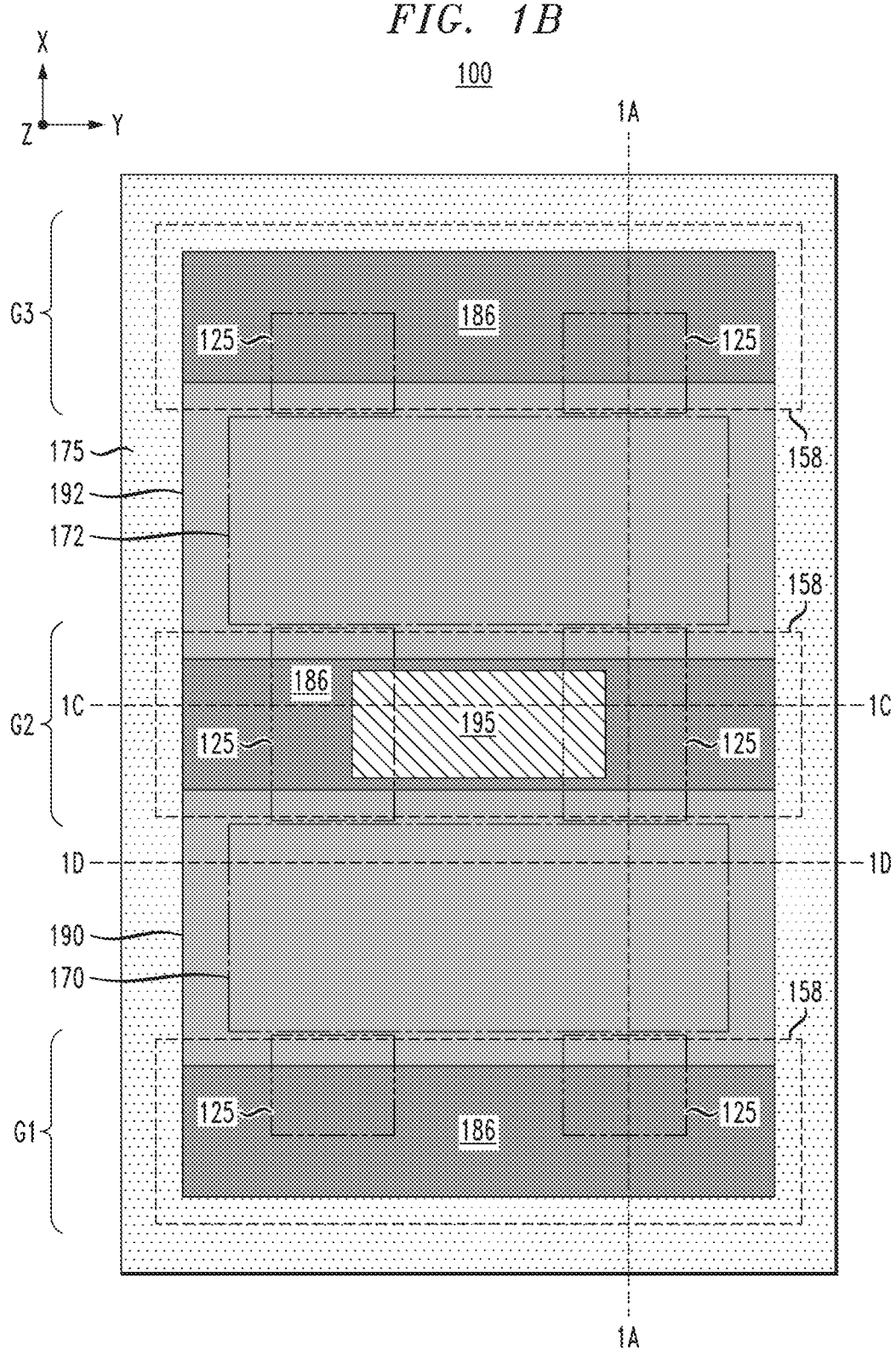
Figure 1C:
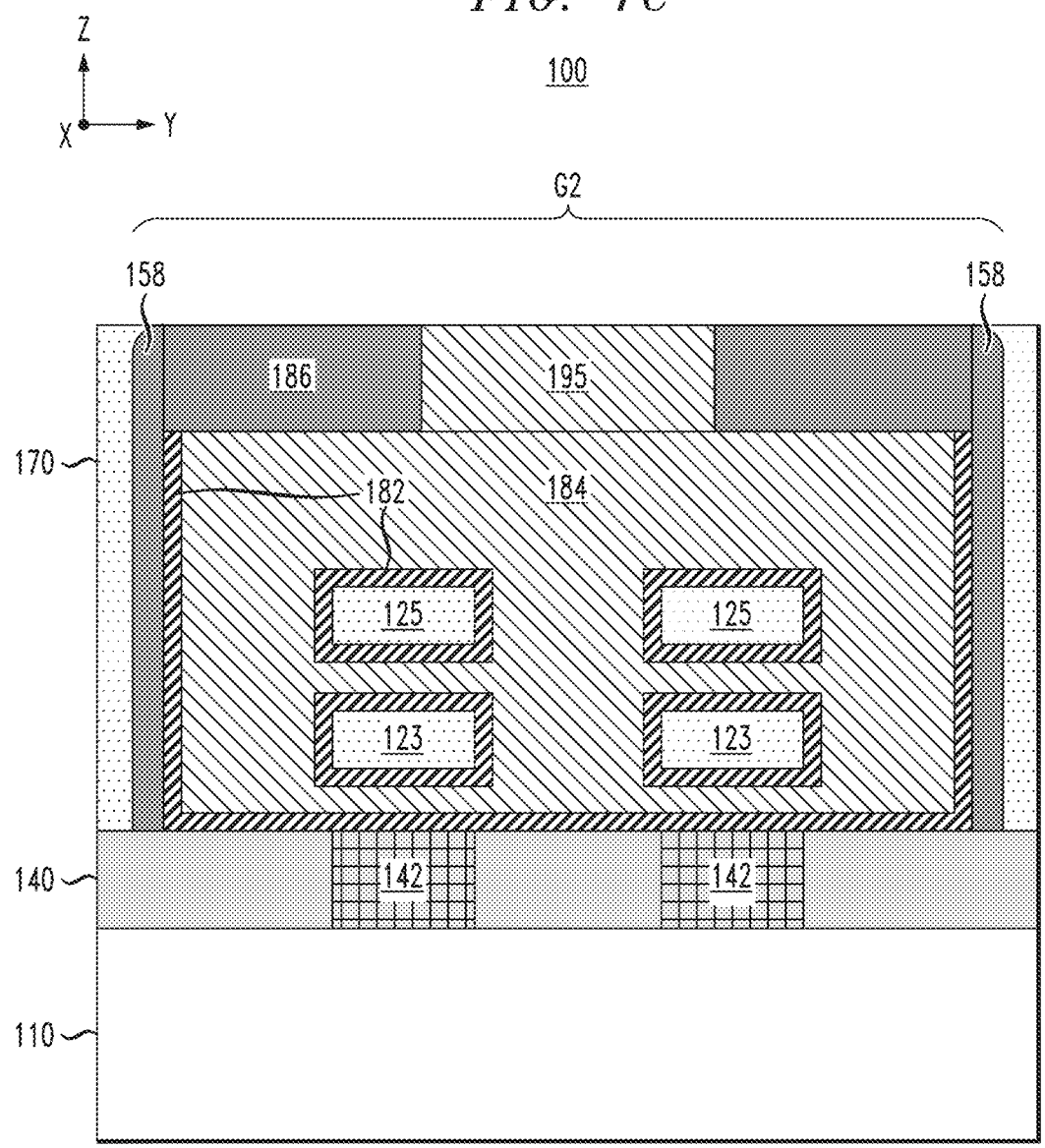
Figure 1D:
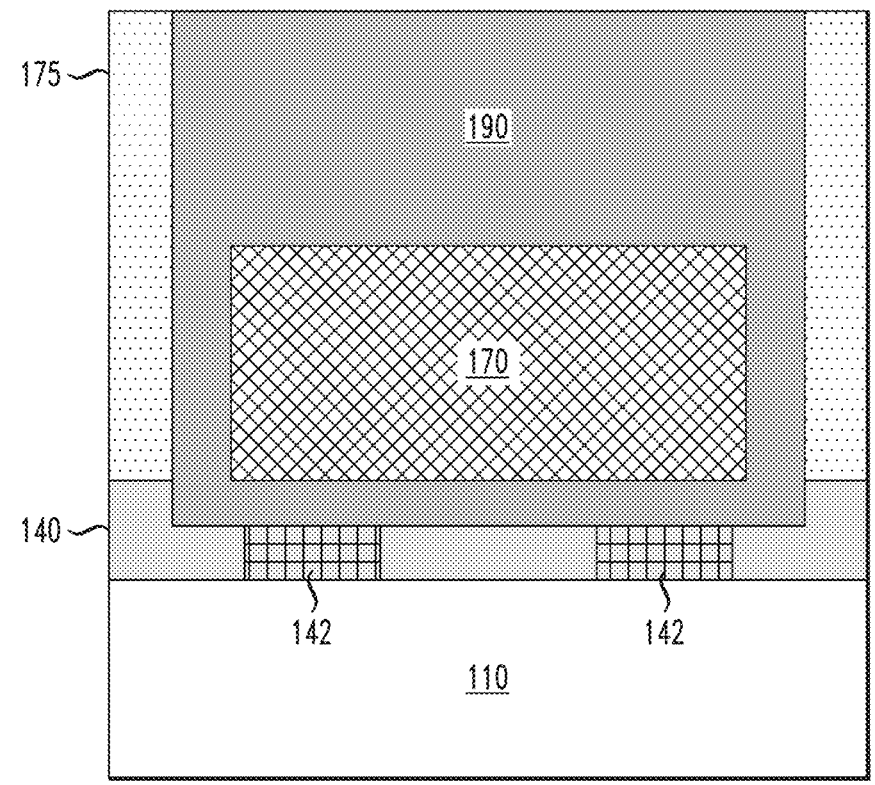

FIGS. 1A, 1B, 1C, and 1D are schematic views of a semiconductor device 100 comprising a non-planar FET device with wrap-around source/drain contacts, according to an embodiment of the invention. In particular, FIG. 1A is a schematic cross-sectional side view of the semiconductor device 100 along an X-Z plane, FIG. 1B is schematic top plan view (X-Y plane) of the semiconductor device 100 shown in FIGS. 1A, 1C, and 1D, and FIGS. 1C and 1D are schematic cross-sectional side views of the semiconductor device 100 along different Y-Z planes. In the context of FIG. 1B, it is to be noted that FIG. 1A is a cross-sectional side view of the semiconductor device 100 along line 1A-1A shown in FIG. 1B, FIG. 1C is a cross-sectional side view of the semiconductor device 100 along line 1C-1C shown in FIG. 1B, and FIG. 1D is a cross-sectional side view of the semiconductor device 100 along line 1D-1D shown in FIG. 1B.

As collectively shown in FIGS. 1A, 1B, 1C, and 1D, the semiconductor device 100 comprises a substrate 110, a first isolation layer 140, a second isolation layer 142, and a nanowire FET device disposed on the first and second isolation layers 140 and 142. The nanowire FET device comprises a stack of nanowire semiconductor channel layers 123 and 125, gates G1, G2, and G3 formed over the nanowire semiconductor channel layers 123 and 125, a first source/drain region 170, and a second source/drain region 172. The gates G1, G2, and G3 comprise gate insulating sidewall spacers 158 and 159, metal gate structures 180, and gate capping layers 186. The metal gate structures 180 comprise high-k gate dielectric layers 182 and gate electrode layers 184. The nanowire FET device is embedded in a pre-metal dielectric (PMD) layer 175.

In the example embodiment FIGS. 1A-1D, the middle gate G2 comprises a functional gate structure of the nanowire FET device, while the gates G1 and G3 are non-functional gate structures that are utilized for purposes of, e.g., facilitating the formation of the first and second source/drain regions 170 and 172, isolating the first and second source/drain regions 170 and 172, etc. As shown in FIGS. 1A and 1C, the nanowire semiconductor channel layers 123 and 125 are disposed in a stacked configuration with the end portions of the nanowire semiconductor channel layers 123 and 125, which are encapsulated by the metal gate structure 180 of the gate G2, extending between, and connected to, the first and second source/drain regions 170 and 172.

In one embodiment, the first and second source/drain regions 170 and 172 comprise merged epitaxial semiconductor layers that are epitaxially grown on the end portions of the nanowire semiconductor channel layers 123 and 125 which are exposed on the sidewalls of the gates G1, G2 and G3. In particular, as shown in FIG. 1A, the first source/drain region 170 is disposed between the gates G1 and G2, and is formed by epitaxially growing semiconductor material on the end portions of the nanowire semiconductor channel layers 123 and 125 exposed on the sidewalls of the gates G1 and G2. Similarly, the second source/drain region 172 is disposed between the gates G2 and G3, and is formed by epitaxially growing semiconductor material on the end portions of the nanowire semiconductor channel layers 123 and 125 exposed on the sidewalls of the gates G2 and G3. It is to be understood that the term "source/drain region" as used herein means that a given source/drain region can be either a source region or a drain region, depending on the application or circuit configuration.

As shown in FIGS. 1A and 1C, the metal gate structure 180 of the functioning gate G2 encapsulates the nanowire semiconductor channel layers 123 and 125, thereby serving as a common gate structure that is formed above, below, and around each nanowire layer in the stacked configuration. In this configuration, the nanowire semiconductor channel layers 123 and 125 collectively serve as a FET channel layer of the nanowire FET device, thereby increasing the FET device width (or channel width), and thus the drive current of the FET device, for a given footprint area. The metal gate structure 180 of the functioning gate G2 is electrically isolated from the substrate 110 by the first and second isolation layers 140 and 142.

On the other hand, the nanowire semiconductor channel layers 123 and 125 of the first and third gates (non-functioning) G1 and G3 have end portions which terminate inside the metal gate structures 180 of the gates G1 and G3 and, thus, are not exposed on the opposing sidewalls of the gates G1 and G3. As such, the nanowire semiconductor channel layers 123 and 125 of the non-functioning G1 and G3 are not functional FET channel layers of the nanowire FET device, but merely serve as semiconductor structures for initiating epitaxial growth of the semiconductor material which forms the first and second source/drain regions 170 and 172. The metal gate structures 180 of the non-functioning gates G1 and G2 are electrically isolated from the substrate 110 by the first and second isolation layers 140 and 142.

As further shown in FIGS. 1A, 1B, 1C, and 1D, the semiconductor device 100 comprises a first source/drain contact 190, a second source/drain contact 192, and a gate contact 195. The gate contact 195 is formed through the gate capping layer 186 of the functioning gate G2 in contact with the metal gate structure 180 of the functioning gate G2. The gates G1 and G3 are non-functioning gate structures and, therefore, no gate contacts are formed in contact to the metal gate structures 180 of the gates G1 and G3. The first source/drain contact 190 is disposed between the gates G1 and G2 in contact with the first source/drain region 170, and the second source/drain contact 192 is disposed between the gates G2 and G3 in contact with the second source/drain region 172.

As shown in FIGS. 1A and 1D, the first source/drain contact 190 comprises a wrap-around contact that is formed in contact with the upper, sidewall, and bottom surfaces of the first source/drain region 170, and the second source/drain contact 192 comprises a wrap-around contact that is formed in contact with the upper, sidewall, and bottom surfaces of the second source/drain region 172. As compared to conventional non-planar FET designs in which the vertical source/drain contacts are formed in contact with only upper portions of the source drain regions, the structural configuration of the wrap-around source/drain contacts 190 and 192 serves to increase the surface area of contact between the source/drain contacts 190 and 192 and the respective source/drain regions 170 and 172, thereby reducing the parasitic resistance between source/drain regions 170 and 172 and the source/drain contacts 190 and 192.

Figure 2:
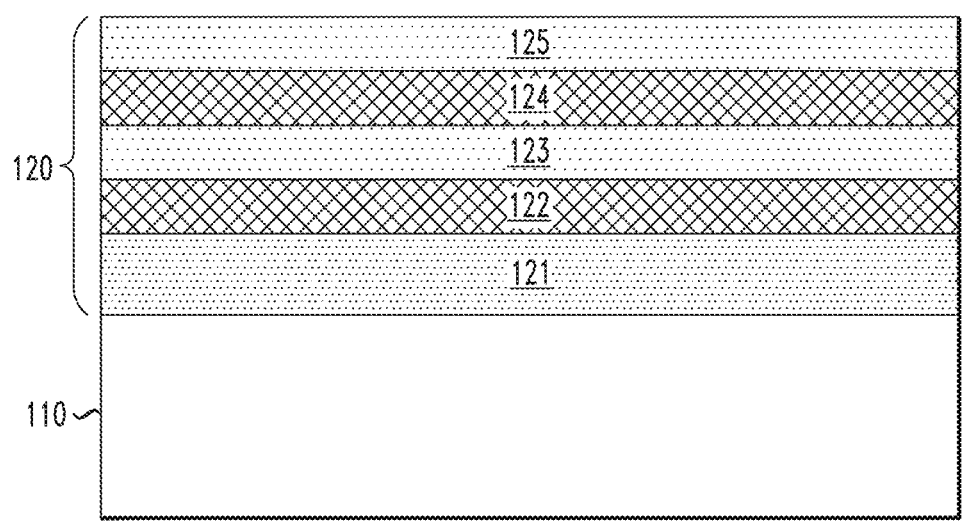

Methods for fabricating the semiconductor device 100 shown in FIGS. 1A, 1B, 1C, and 1D will now be discussed in further detail with reference to FIG. 2 through FIG. 20B, which schematically illustrate the semiconductor device 100 at various stages of fabrication. To begin, FIG. 2 is a schematic cross-sectional side view of the semiconductor device 100 at initial stage of fabrication in which a stack of epitaxial semiconductor layers 120 is formed on a semiconductor substrate 110. While the semiconductor substrate 110 is illustrated as a generic substrate layer, it is to be understood that the semiconductor substrate 110 may comprise one of different types of semiconductor substrate structures and materials.

For example, in one embodiment, the semiconductor substrate 110 can be a bulk semiconductor substrate (e.g., wafer) that is formed of silicon (Si) or germanium (Ge), or other types of semiconductor substrate materials that are commonly used in bulk semiconductor fabrication processes such as a silicon-germanium alloy, compound semiconductor materials (e.g. III-V), etc. In another embodiment, the semiconductor substrate 110 may be an active semiconductor layer of an SOI (silicon-on-insulator) substrate, GeOI (germanium-on-insulator) substrate, or other type of semiconductor-on-insulator substrate, which comprises an insulating layer (e.g., oxide layer) disposed between a base substrate layer (e.g., silicon substrate) and the active semiconductor layer (e.g., Si, Ge, etc.) in which active circuit components are formed as part of a front-end-of-line (FEOL) structure. It is to be noted that in each drawing, the X-Y plane represents a plane that is parallel to the plane of the semiconductor substrate 110 (e.g., wafer) being processed.

The stack of epitaxial semiconductor layers 120 comprises a first semiconductor layer 121 epitaxially grown on a surface of the semiconductor substrate 110, a second semiconductor layer 122 epitaxially grown on the first semiconductor layer 121, a third semiconductor layer 123 epitaxially grown on the second semiconductor layer 122, a fourth semiconductor layer 124 epitaxially grown on the third semiconductor layer 123, and a fifth semiconductor layer 125 epitaxially grown on the fourth semiconductor layer 124. In one embodiment, the first, second and fourth semiconductor layers 121, 122, and 124 comprise sacrificial semiconductor layers, and the third and fifth semiconductor layers 123 and 125 serve as semiconductor channel layers of a nanowire FET device to be subsequently formed.

In one embodiment, the semiconductor layers 121, 122, 123, 124, and 125 are formed of single crystal (monocrystalline) semiconductor materials, which are epitaxially grown using known methods such as CVD (chemical vapor deposition), MOCVD (metal-organic CVD), LPCVD (Low Pressure CVD), MBE (molecular beam epitaxy), VPE (vapor-phase epitaxy), LPE (liquid-phase epitaxy) or other known epitaxial growth techniques which are suitable for the given process flow. The type of materials that are utilized to form the semiconductor layers 121, 122, 123, 124, and 125 will depend on various factors such as the type of FET device (p-type, or n-type), and the desired level of etch selectivity between the semiconductor layers, as well as provide sufficient lattice matching between the materials of the semiconductor layers to ensure proper (e.g., defect-free) epitaxial growth of the crystalline semiconductor layers 121, 122, 123, 124 and 125.

For example, in one embodiment, the semiconductor layers 123 and 125 are formed of epitaxial silicon (Si), which is suitable to serve as semiconductor channel layers of an n-type FET device. When the semiconductor layers 123 and 125 (alternatively referred to as "semiconductor channel layers") are formed of crystalline Si, the semiconductor layers 121, 122, and 124 which serve as sacrificial layers (alternatively referred to as "sacrificial semiconductor layers"), can be formed of an epitaxial silicon-germanium (SiGe) alloy. This allows the epitaxial SiGe material of the sacrificial semiconductor layers 121, 122, and 124 to be etched selective to the epitaxial Si material of the semiconductor channel layers 123 and 125 in a subsequent process step to "release the semiconductor channel layers 123 and 125. Furthermore, the Ge concentration of the bottom sacrificial semiconductor layer 121 is greater than the Ge concentration of the sacrificial semiconductor layers 122 and 124 so that the bottom sacrificial semiconductor layer 121 can be etch selective to the other semiconductor layers 122, 123, 124 and 125, for reasons as will be discussed in further detail below. For example, in one embodiment wherein the semiconductor channel layers 123 and 124 are formed of epitaxial Si (no germanium), the bottom sacrificial semiconductor layer 121 can be an SiGe layer with a Ge concentration of 50%, while the sacrificial semiconductor layers 122 and 124 can be SiGe layers with a Ge concentration of 25%.

In other embodiments, for p-type FET device, the semiconductor channel layers 123 and 125 can be formed of an epitaxial SiGe material with a desired Ge concentration (optimized for device performance), and the sacrificial semiconductor layers 121, 122 and 124 can be formed of a sacrificial semiconductor material (e.g., Si) that can be etched selective to the semiconductor channel layers 124 and 125, and also allow the bottom sacrificial semiconductor layer 121 to be etched selective to the other sacrificial semiconductor layers 122 and 124.

While the stack of epitaxial semiconductor layers 120 is shown to include two semiconductor channel layers 123 and 125, in other embodiments of the invention, the stack of epitaxial semiconductor layers 120 can be fabricated with one semiconductor channel layer (e.g., layer 123), or three or more semiconductor channel layers with additional sacrificial semiconductor layers disposed between the additional semiconductor channel layers. Further, in one embodiment of the invention, the semiconductor channel layers 123 and 125 are formed with a thickness in a range of about 10 nm to about 20 nm, although the semiconductor channel layers 123 and 125 can be formed with other thickness ranges, depending on the application. In addition, in one embodiment, the sacrificial semiconductor layers 122 and 124 are formed with a thickness that is the same or similar to the thickness of the semiconductor channel layers 123 and 125. Further, in one embodiment, the bottom sacrificial semiconductor layer 121 is formed with a thickness that is greater than a thickness of the other layers 122, 123, 124 and 125, for reasons as will be discussed in further detail below. For example, in one embodiment, the bottom sacrificial semiconductor layer 121 is formed with a thickness that is about 100 nm or greater.

Figure 3A:
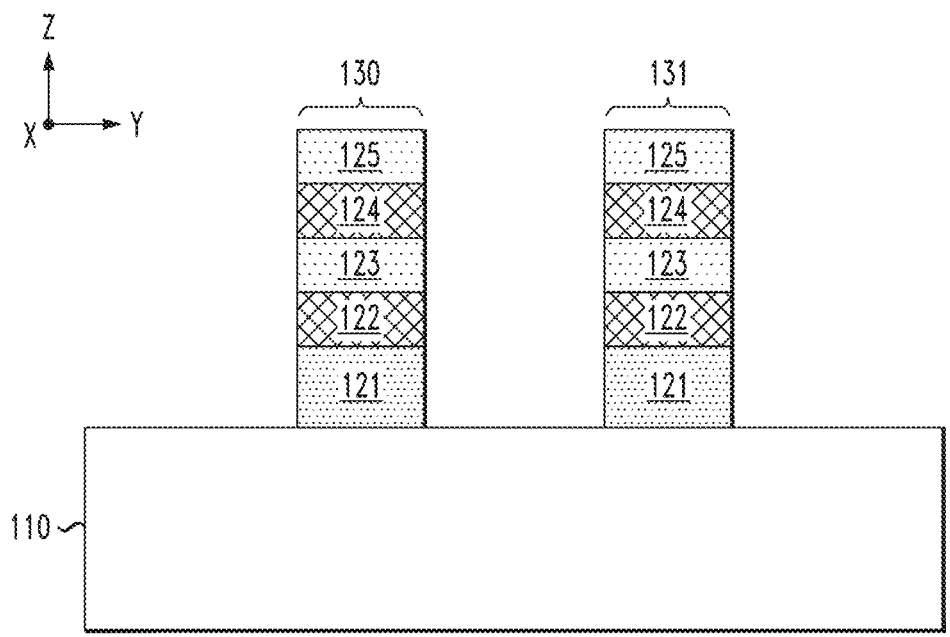

A next phase of the process flow comprises patterning the stack of epitaxial semiconductor layers 120 to define nanowire stack structures for nanowire FET devices in different regions of the semiconductor substrate 110. For example, FIGS. 3A and 3B are schematic views of the semiconductor structure of FIG. 2 after patterning the stack of epitaxial semiconductor layers 120 to form a plurality of nanowire stack structures 130 and 131. In particular, FIG. 3A is a schematic cross-sectional schematic side view (Y-Z plane) of the semiconductor structure shown in FIG. 2 after etching the stack of epitaxial semiconductor layers 120 to form the nanowire stack structures 130 and 131, and FIG. 3B is a schematic top plan view (X-Y plane) of the semiconductor structure shown in FIG. 3A, wherein line 3A-3A in FIG. 3B denotes a cross-sectional view of the semiconductor structure shown in FIG. 3A.

In one embodiment, the nanowire stack structures 130 and 131 can be patterned by forming an etch mask (e.g., a photoresist mask or a hard mask) on an upper surface of the stack of epitaxial semiconductor layers 120, wherein the etch mask comprises an image of the nanowire stack structures 130 and 131 to be transferred into the stack of semiconductor layers 120 using a sequence of one or more dry etch processes (e.g., reactive ion etching (RIE)). The etch mask can be formed using any suitable patterning process including, but not limited to, a photolithography process, or a multi-patterning process such as a sidewall image transfer (SIT) process, a self-aligned double patterning (SADP) process, a self-aligned quadruple pattering (SAQP), etc.

In one embodiment of the invention as shown in FIGS. 3A and 3B, the stack of epitaxial semiconductor layers 120 is etched down to the upper surface of the semiconductor substrate 110. The etching can be performed using one or more sequential dry etch processes, such as a RIE (reactive ion etch) process, with etch chemistries that are suitable to etch the materials of the semiconductor layers 121, 122, 123, 124 and 125. The resulting nanowire stack structures 130 and 131 shown in FIGS. 3A and 3B comprise elongated fin structures of width W. In one embodiment, the width W of the nanowire stack structures 130 and 131 is about the same or slighter greater than a thickness of the semiconductor channel layers 123 and 125. For example, if the semiconductor channel layers 123 and 125 are formed with a thickness of 10 nm, the width W of the nanowire stack structures 130 and 131 can be in a range of 10 nm to about 20 nm. For nanosheet FET devices, the stack of epitaxial semiconductor layers 120 can be etched to form nanosheet stack structures with a width (e.g., 30 nm or more) which is relativity much larger than a thickness (e.g., 10 nm) of the semiconductor channel layers 123 and 125. For FinFET devices, the layers 122, 123, 124 and 125 are replaced by a single semiconductor layer formed on the bottom sacrificial semiconductor layer 121.

Figure 4A:
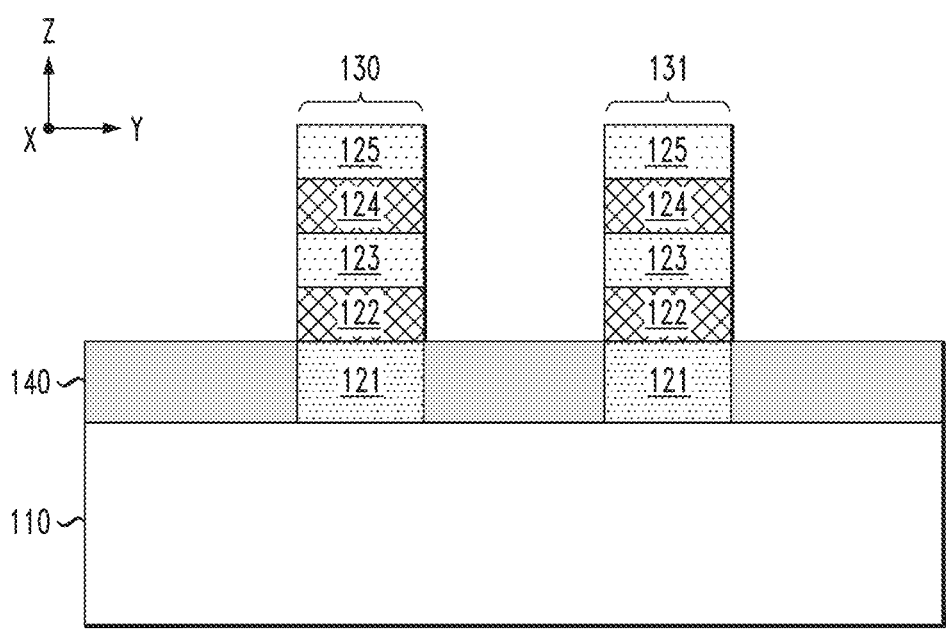
FIGS. 4A and 4B are schematic views of the semiconductor structure shown in FIGS. 3A and 3B, respectively, after forming a first isolation layer.
Figure 4B:
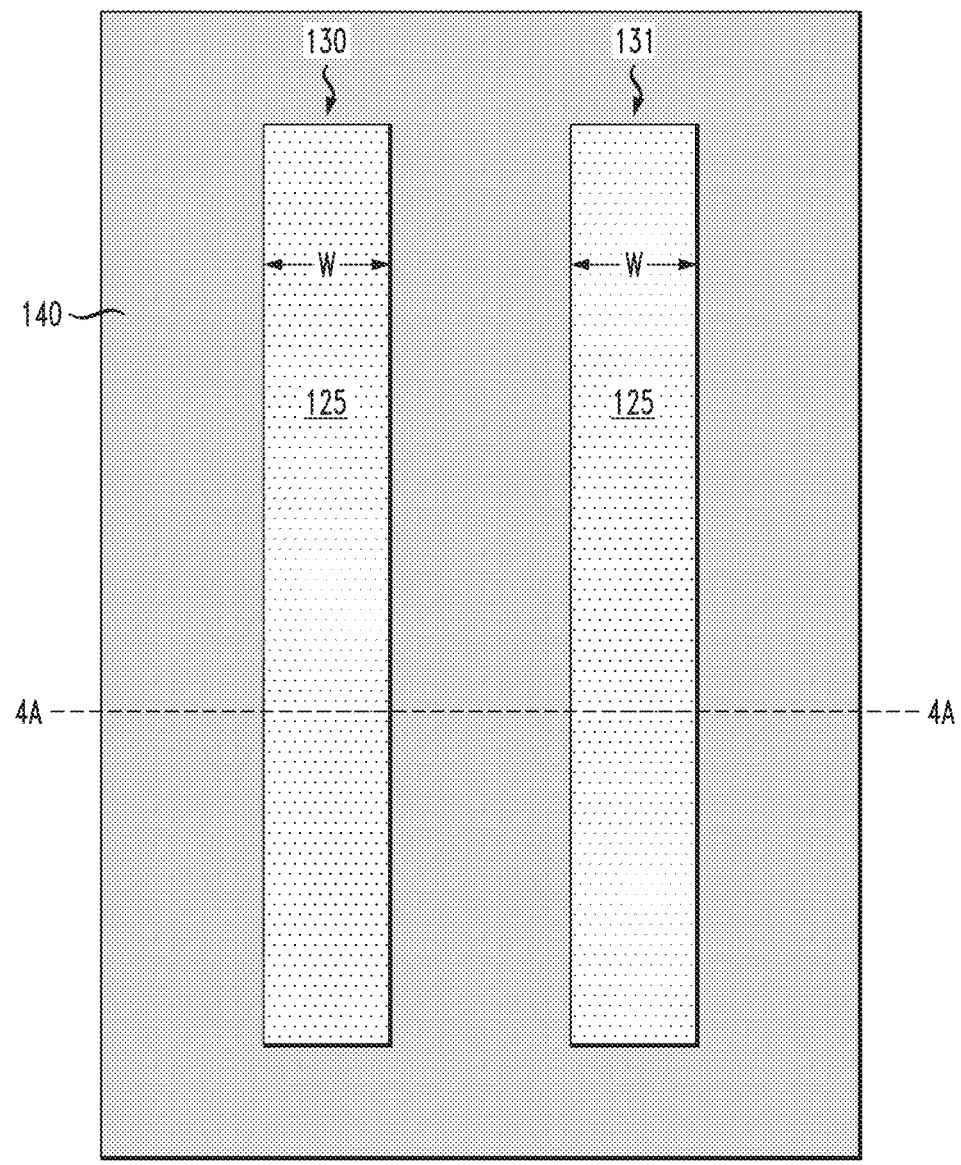

Next, FIGS. 4A and 4B are schematic views of the semiconductor structure shown in FIGS. 3A and 3B, respectively, after forming the first isolation layer 140 on the semiconductor substrate 110. In one embodiment, the first isolation layer 140 can be formed by a process which comprises depositing a layer of insulating material over the surface of the semiconductor structure to cover the nanowire stack structures 130 and 131, planarizing the surface of the semiconductor structure (via chemical mechanical polishing (CMP)) down to an upper surface of the nanowire stack structures 130 and 131 to remove the overburden insulating material, and then performing an etch process to recess the remaining layer of insulating material down to a target level which defines a thickness of the first isolation layer 140 on the surface of the substrate 110. In one embodiment, the first isolation layer 140 is formed with a thickness that is substantially equal to the thickness of the bottom sacrificial semiconductor layer 121, as schematically shown in FIG. 4A. The first isolation layer 140 can be formed of any type of insulating material, such an oxide material, which is suitable for the given fabrication process flow. The insulating material (e.g., silicon oxide) can be deposited and patterned using known techniques.

Figure 5B:
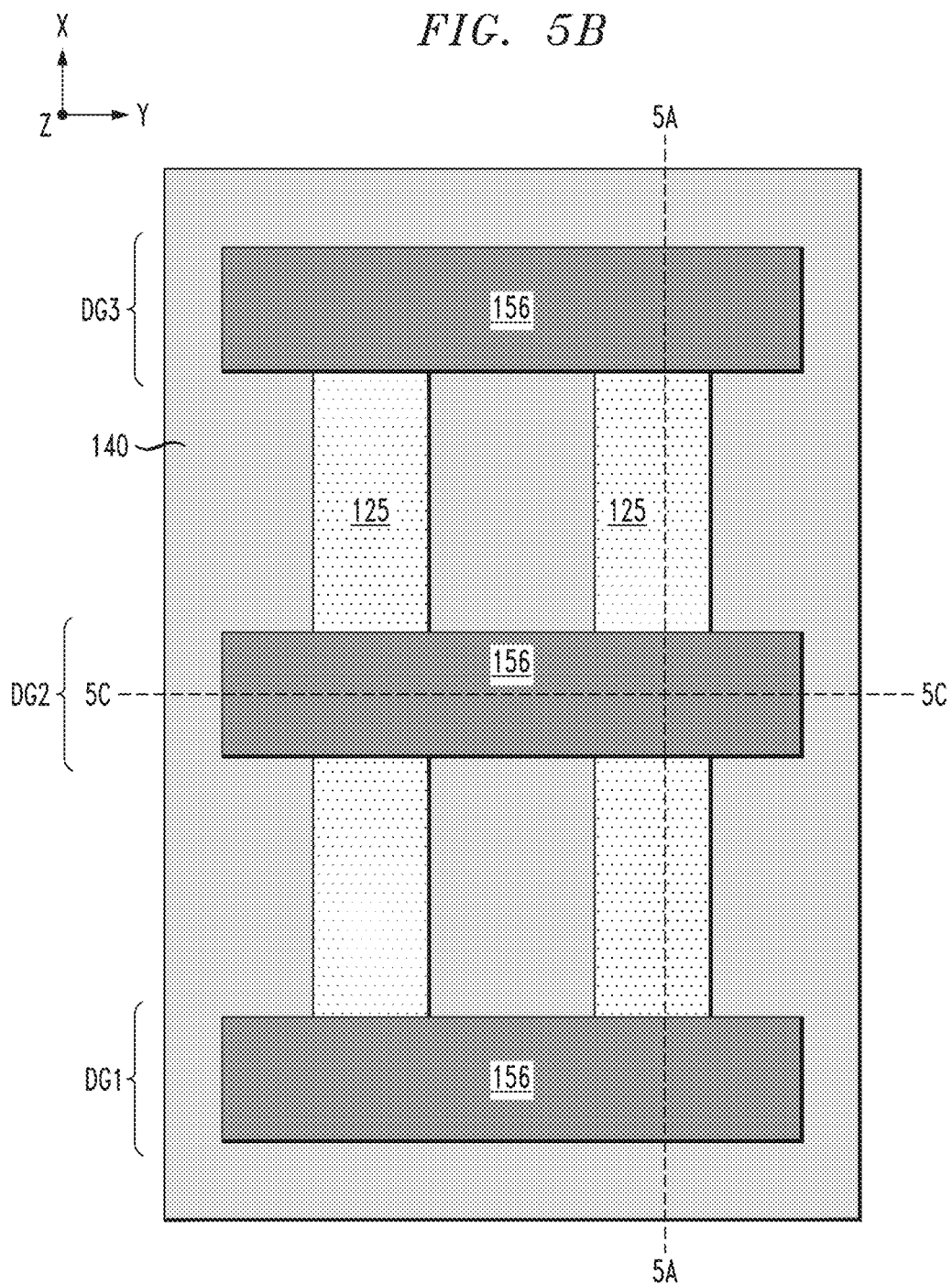

A next phase of the fabrication process comprises forming dummy gate structures over the nanowire stack structures 130 and 131 using a process flow as schematically illustrated in FIGS. 5A through 6B. In particular, FIGS. 5A, 5B, and 5C are schematic views of the semiconductor structure shown in FIGS. 4A and 4B after forming dummy gate stack structures 150 with hard mask capping layers 156, which overlap portions of the nanowire stack structures 130 and 131. FIG. 5B is schematic top plan view (X-Y plane) of the semiconductor structure, while FIG. 5A is a cross-sectional side view of the semiconductor structure along line 5A-5A shown in FIG. 5B, and FIG. 5C is a cross-sectional side view of the semiconductor structure along line 5C-5C shown in FIG. 5B.

Figure 5C:
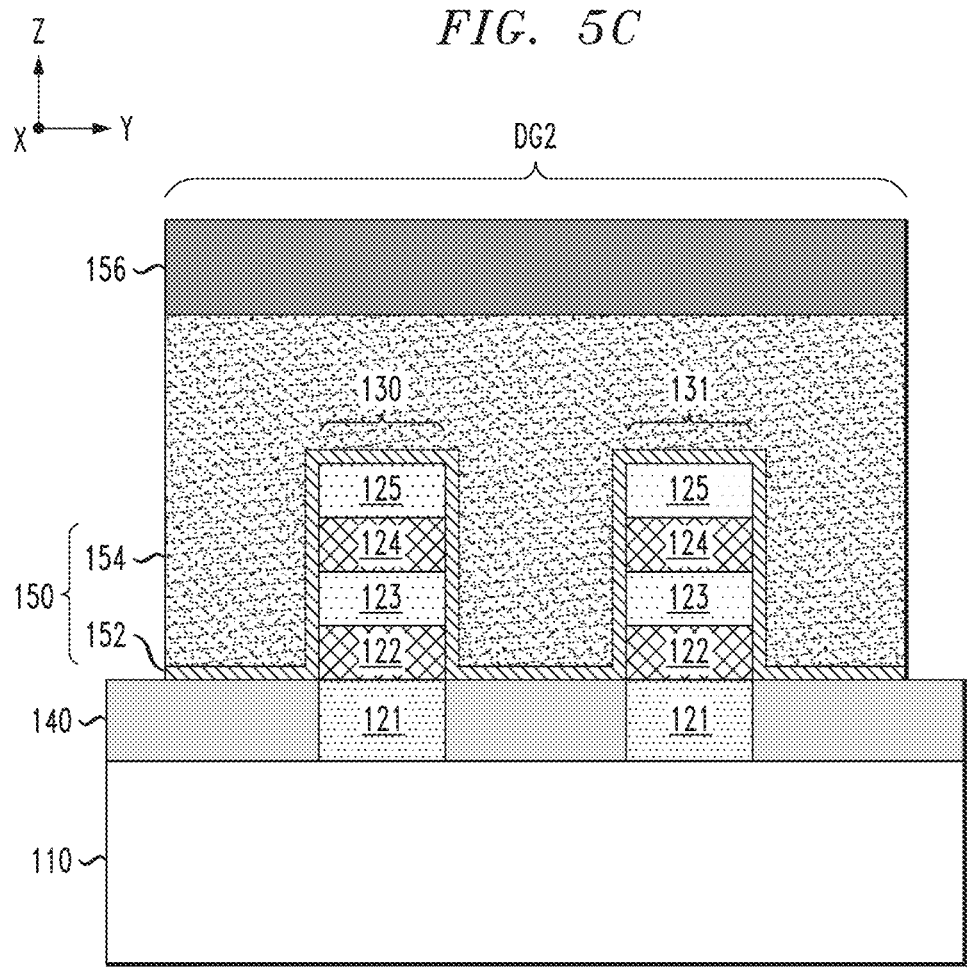

As shown in FIGS. 5A and 5C, each dummy gate stack structure 150 comprises a sacrificial oxide layer 152 and a sacrificial polysilicon (or amorphous silicon) gate layer 154. The dummy gate stack structures 150 are formed using known techniques. For example, a thin conformal layer of silicon oxide is deposited over the entire surface of the semiconductor structure shown in FIGS. 4A and 4B, and a layer of polysilicon (or alternatively, amorphous silicon) is blanket deposited over the conformal layer of silicon oxide, and then planarized using known techniques. A hard mask layer is formed on the planarized surface of the polysilicon layer by depositing a layer of dielectric material (e.g., SiOCN, SiOC, SiBCN). The hard mask layer is then pattered to form the gate capping layers 156, which collectively define an image of the dummy gate stack structures 150. The gate capping layers 156 are utilized as an etch hardmask to anisotropically etch (e.g., RIE) the sacrificial polysilicon and oxide layers down to the semiconductor channel layer 125 and the first isolation layer 140, and thereby form the dummy gate stack structures 150.

Figure 6B:
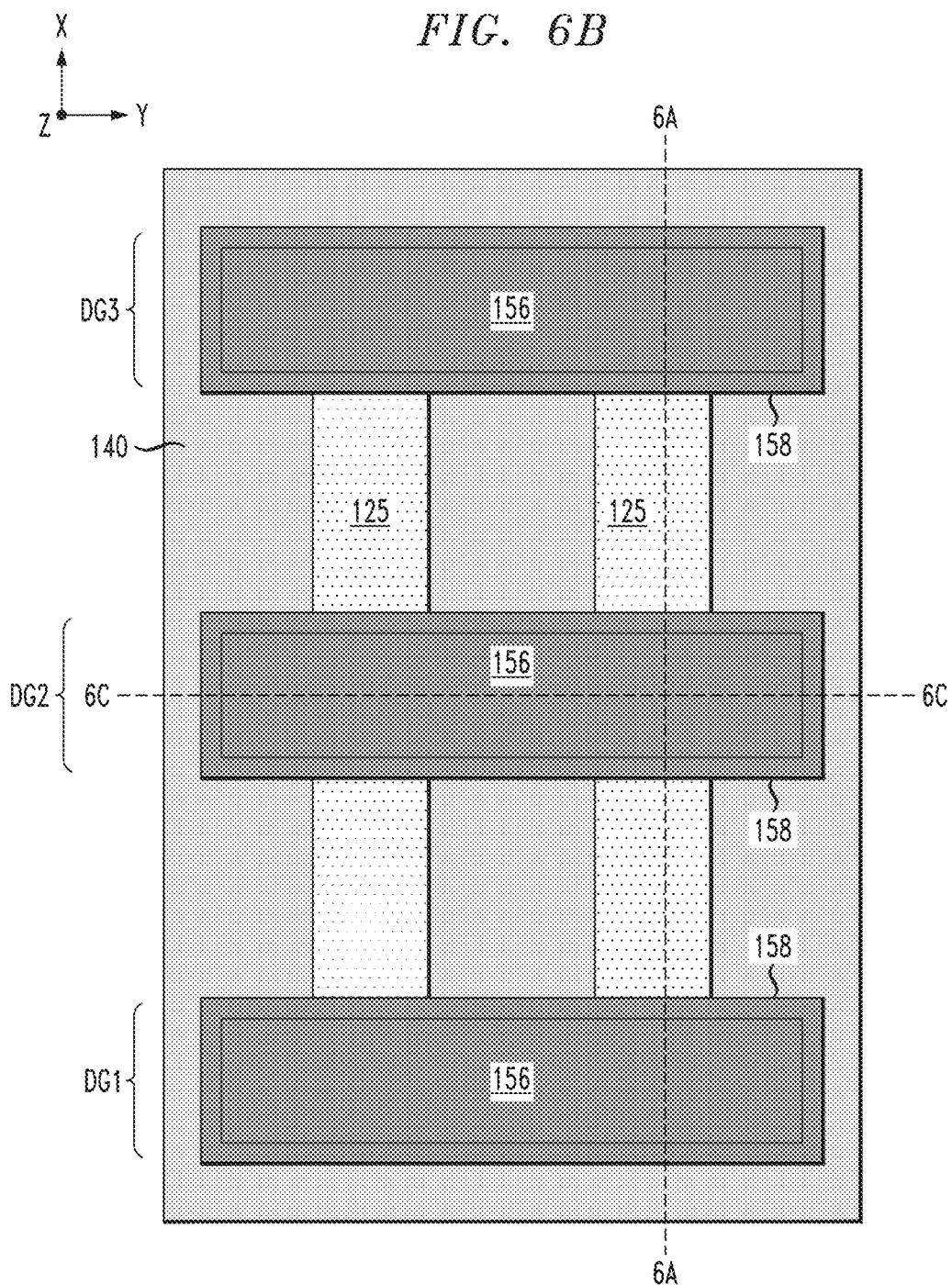

Next, FIGS. 6A, 6B, and 6C are schematic views of the semiconductor structure of FIGS. 5A, 5B, and 5C, respectively, after forming gate sidewall spacers 158 on sidewalls of the dummy gate stack structures 150. The gate sidewall spacers 158 are formed by depositing a conformal layer of dielectric material over the entire surface of the semiconductor structure. The conformal layer of dielectric material can be formed of SiN, SiBCN, SiCO, SiCON, or any other type of dielectric material that is commonly used to form insulating gate sidewall spacers of FET devices, and deposited using known techniques such as atomic layer deposition (ALD), CND and PVD. The conformal layer of dielectric material is then pattered by performing an anisotropic dry etch process, such as RIE, to etch down the conformal layer of dielectric material in a vertical direction. This etch process is performed selective to the semiconductor materials of the nanowire stack structures 130 and 131 and the first isolation layer 140. The etch process results in the formation of the gate insulating spacers 158 on the vertical sidewall surfaces of the dummy gate stack structures 150 and capping layers 156, thereby forming dummy gate structures DG1, DG2 and DG3. A replacement metal gate (RMG) process is performed at a later stage of the fabrication process to convert the dummy gate structures DG1, DG2, and DG2 to the metal gate structures G1, G2, and G3, respectively, shown in FIGS. 1A~1D.

At some point in the vertical etch process to form the sidewall spacers 158, the portions of the conformal layer of dielectric material on the lateral surfaces of the semiconductor structure (e.g., on the upper surface of the capping layers 156, the exposed upper surfaces of the semiconductor channel layer 125, and the first isolation layer 140) will be fully etched away, but the anisotropic dry etch process continues to recess the gate capping layers 156 and pull down the vertical portions of the conformal layer of dielectric material on the sidewalls of the gate capping layers 156 and on the sidewalls of the nanowire stack structures 130 and 131. The anisotropic dry etch process is terminated when all of the dielectric material is removed from vertical sidewall surfaces of the exposed portions of the nanowire stack structures 130 and 131, as shown in FIG. 6A. In this regard, the gate capping layers 156 (etch hardmask) are initially formed with a thickness that is greater than a vertical height of the patterned nanowire stack structures 130 and 131 to ensure that when the dielectric material on the vertical sidewall surfaces of the nanowires stack structures 130 and 131 is fully recessed/pulled down to the exposed surface of the first isolation layer 140, a portion of the gate capping layers 156 (with reduced thickness) remains on top of the dummy gate stack structures 150, with the insulating sidewall spacer 158 fully covering the vertical sidewall surfaces of the dummy gate stack structures 150, as shown in FIG. 6C, for example.

Figure 7A:
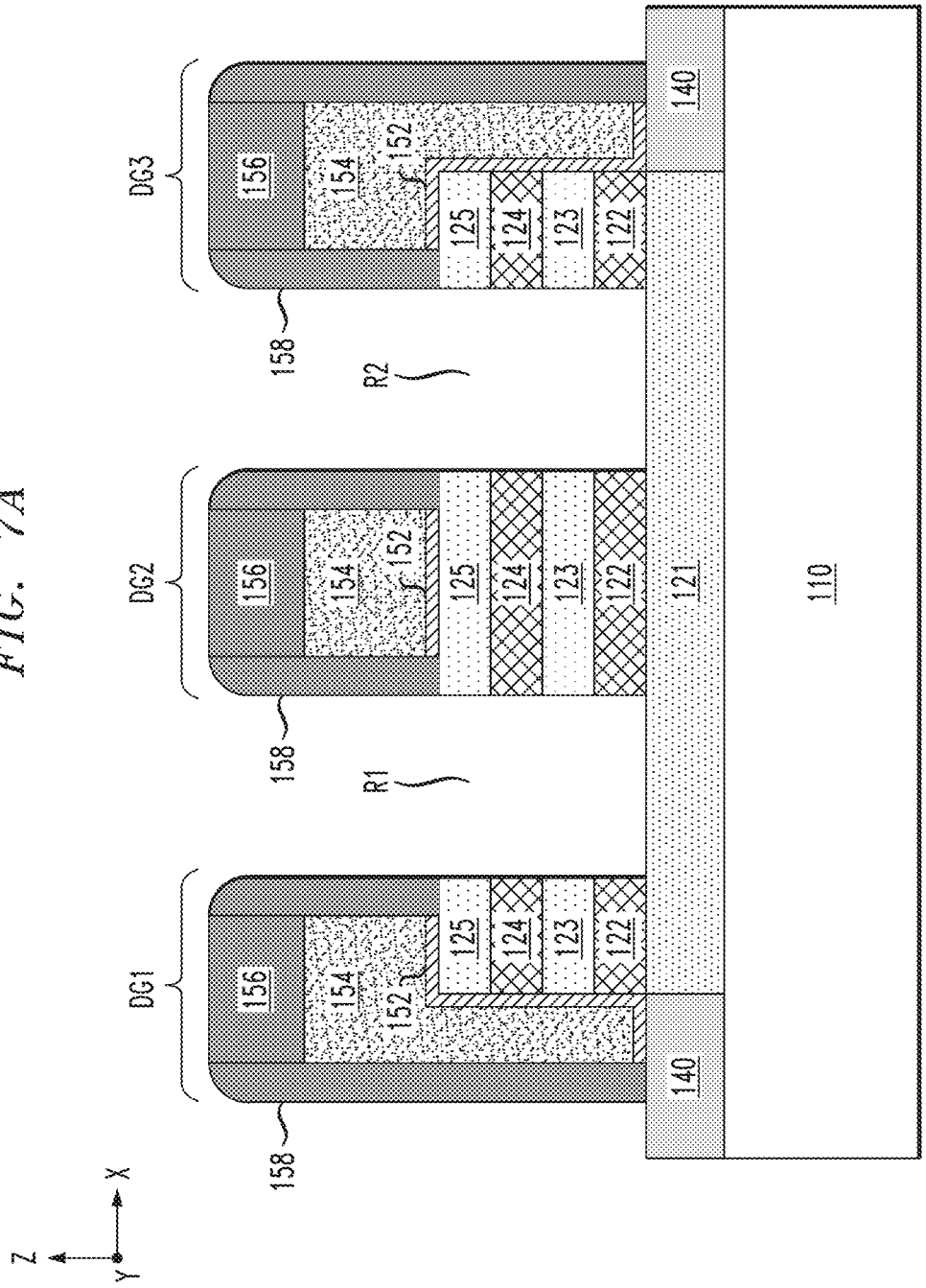
FIGS. 7A and 7B are schematic views of the semiconductor structure shown in FIGS. 6A and 6B, respectively, after recessing exposed portions of the nanowire stack structures between adjacent dummy gate structures.
Figure 7B:
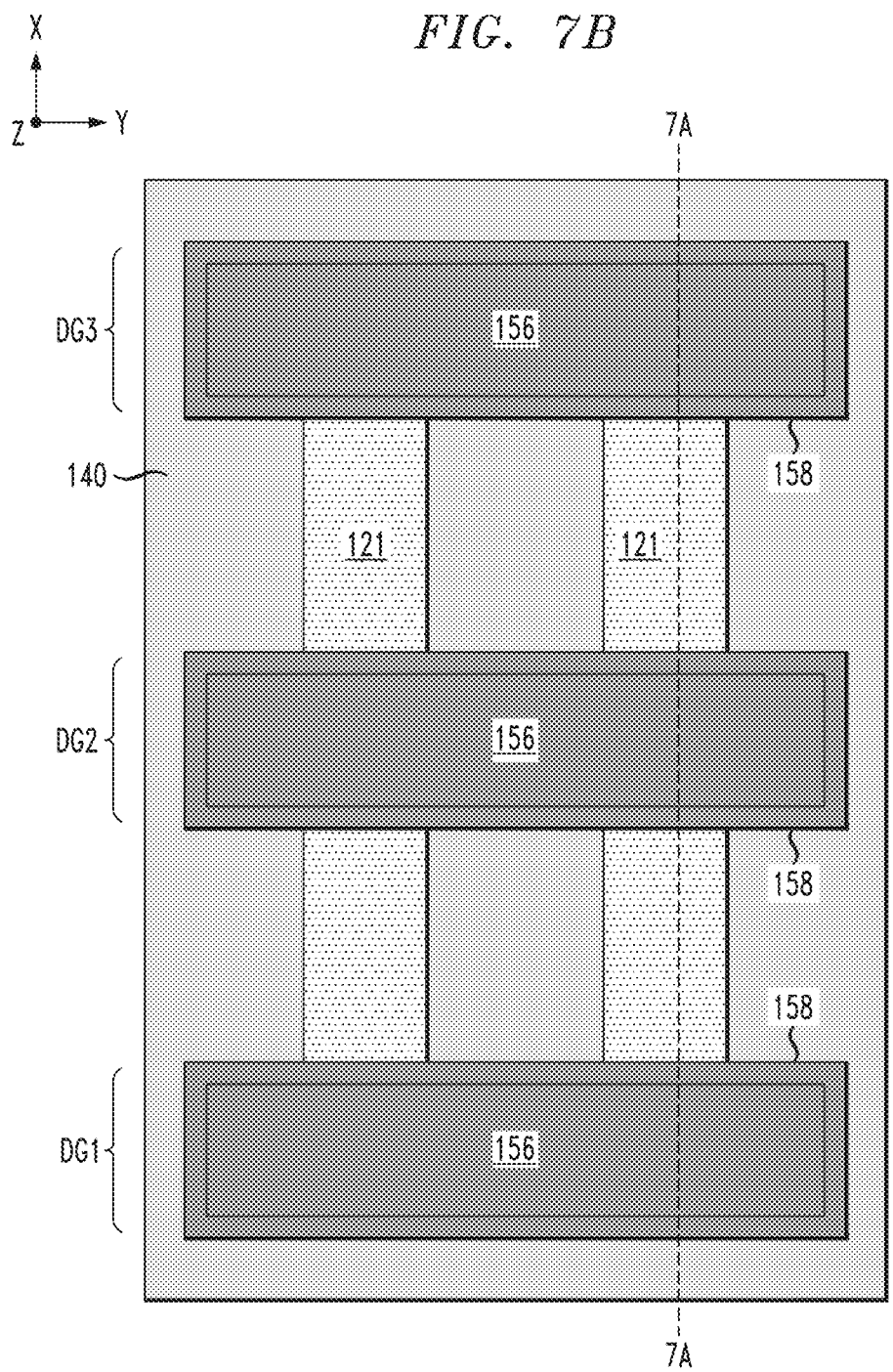

FIGS. 7A and 7B are schematic views of the semiconductor structure shown in FIGS. 6A and 6B, respectively, after recessing exposed portions of the nanowire stack structures 130 and 131 between adjacent dummy gate structures DG1, DG2 and DG3. In particular, in one embodiment of the invention, a directional RIE process is performed to recess exposed portions of the nanowire stack structures 130 and 131 down to the first sacrificial semiconductor layer 121 to form recessed regions R1 and R2 in which source/drain regions are formed in a subsequent phase of the fabrication process. With this recess process, the semiconductor materials (e.g., Si, and SiGe 25%) of the semiconductor layers 122, 123, 124 and 125 are etched selective to the semiconductor material (e.g., SiGe 50%) of the bottom sacrificial semiconductor layer 121.

Figure 8:
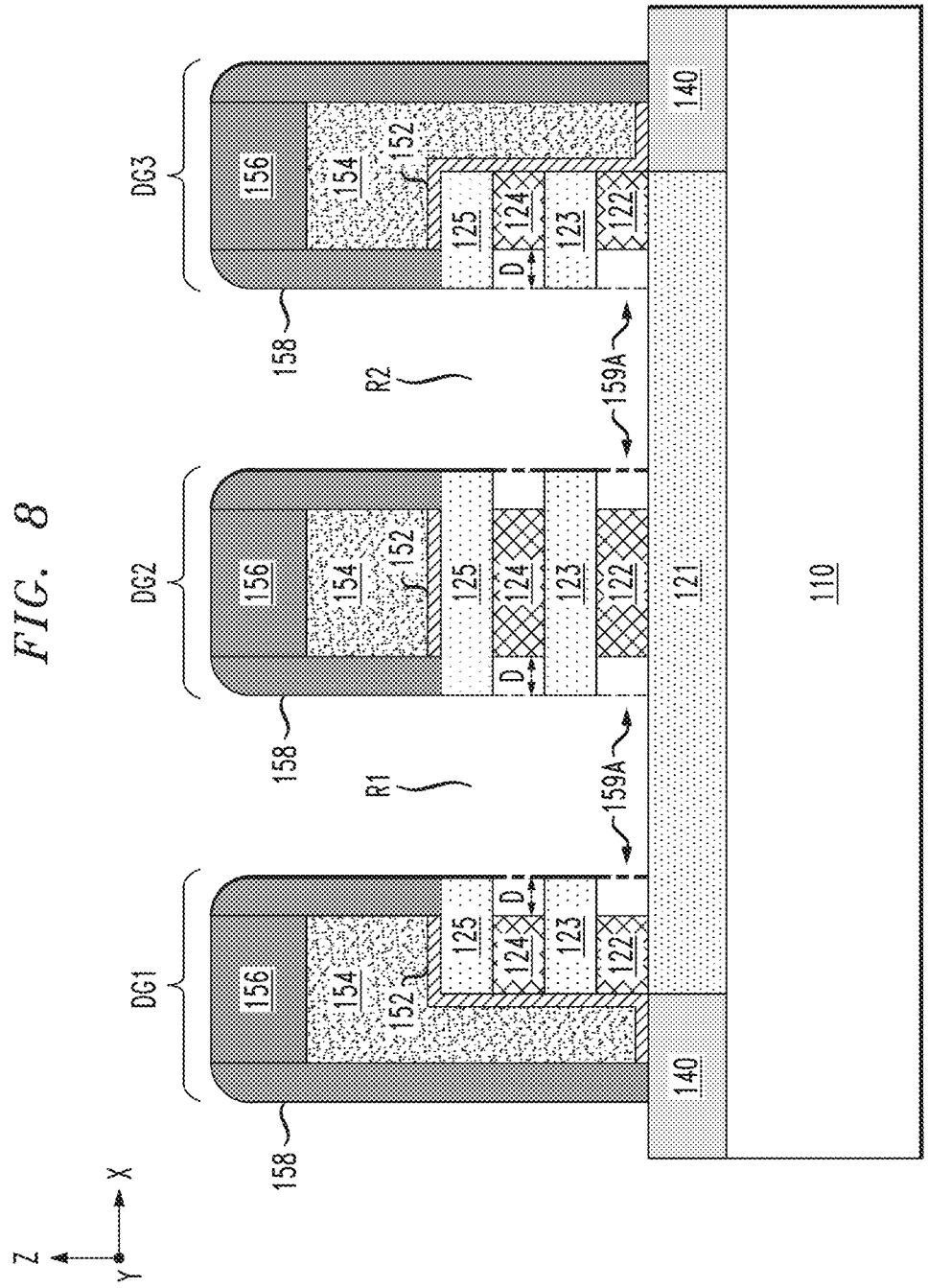

Next, FIG. 8 is a schematic cross-sectional side view of the semiconductor structure shown in FIG. 7A after laterally recessing exposed sidewall surfaces of sacrificial semiconductor layers 122 and 124 of the nanowire stack structures 130 and 131 to form recesses 159A in the sidewalls of the nanowire stack structures 130 and 131. As shown in FIG. 8, the exposed sidewall surfaces of the sacrificial semiconductor layers 122 and 124 are laterally recessed to a depth, D (in the Y-direction). The amount of lateral recess (depth D) is controlled through a timed etch. In one embodiment, the depth D is substantially equal to the thickness of the gate insulating spacers 158 of the dummy gate structures DG1, DG2, DG3.

In one embodiment of the invention, the lateral etch process can be performed using an isotropic wet etch process with an etch solution that is suitable to etch the semiconductor material (e.g., SiGe 25%) of the sacrificial semiconductor layers 122 and 124 selective to the semiconductor material (e.g., Si) of the semiconductor channel layers 123 and 125 and the semiconductor material (e.g., SiGe 50%) of the bottom sacrificial semiconductor layer 121. In another embodiment, an isotropic dry plasma etch process can be performed to laterally etch the exposed sidewall surfaces of the sacrificial semiconductor layers 122 and 124 selective to the materials of the other semiconductor layers 121, 123, and 125 of the nanowires stack structures 130 and 131.

Figure 9:
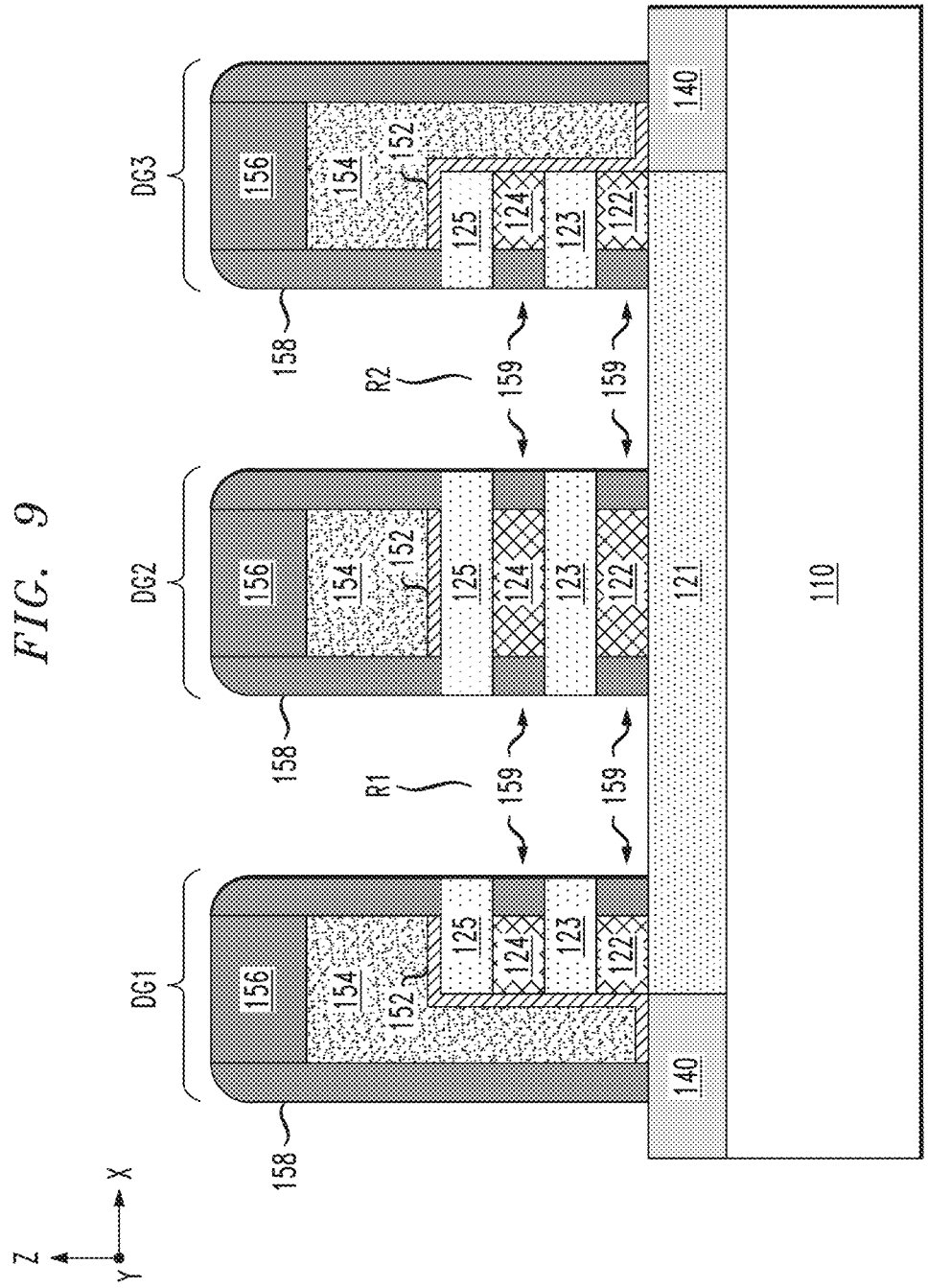

Next, FIG. 9 is a schematic cross-sectional side view of the semiconductor structure shown in FIG. 8 after filling the recesses 159A with dielectric material to form embedded gate insulating spacers 159 on the sidewalls of the patterned nanowire stack structures 130 and 131. In one embodiment, the embedded gate insulating spacers 159 are formed by depositing a conformal layer of dielectric material over the semiconductor structure until the recesses 159A are filled with dielectric material, followed by an etch back to remove excess dielectric material on the upper surface of the bottom sacrificial semiconductor layer 121 and the horizontal and vertical surfaces of the dummy gate structures DG1, DG2, and DG3, to thereby expose the vertical sidewalls of the semiconductor channel layers 123 and 125, resulting in the semiconductor structure shown in FIG. 9.

In one embodiment, the embedded gate insulating spacers 159 are formed of the same dielectric material used to form the gate insulating spacers 158. For example, the embedded gate insulating spacers 159 can be formed of SiN, SiBCN, SiCO, SiBCN, SiCON, or any other type of dielectric material (e.g., a low-k dielectric material having a k of less than 5) which is commonly used to form insulating gate sidewall spacers of FET devices. In one embodiment, the dielectric material is conformally deposited using a highly conformal deposition process, such as ALD, to ensure that the recesses 159A are sufficiently filled with dielectric material. Other deposition methods such as CVD and PVD can be utilized to deposit a highly conformal layer of dielectric material to fill the recesses 159A. The conformal layer of dielectric material can be etched back using an isotropic wet etch process to remove the excess dielectric material on the sidewalls of the patterned nanowire stack structures 130 and 131 and expose the sidewalls of the semiconductor channel layers 123 and 125, while leaving the dielectric material in the recesses 159A to form the embedded gate insulating spacers 159. The wet etch process may include, but is not limited to, buffered hydrofluoric acid (BHF), diluted hydrofluoric acid (DHF), hydrofluoric nitric acid (HNA), phosphoric acid, HF diluted by ethylene glycol (HFEG), hydrochloric acid (HCl), or any combination thereof.

Figure 10:
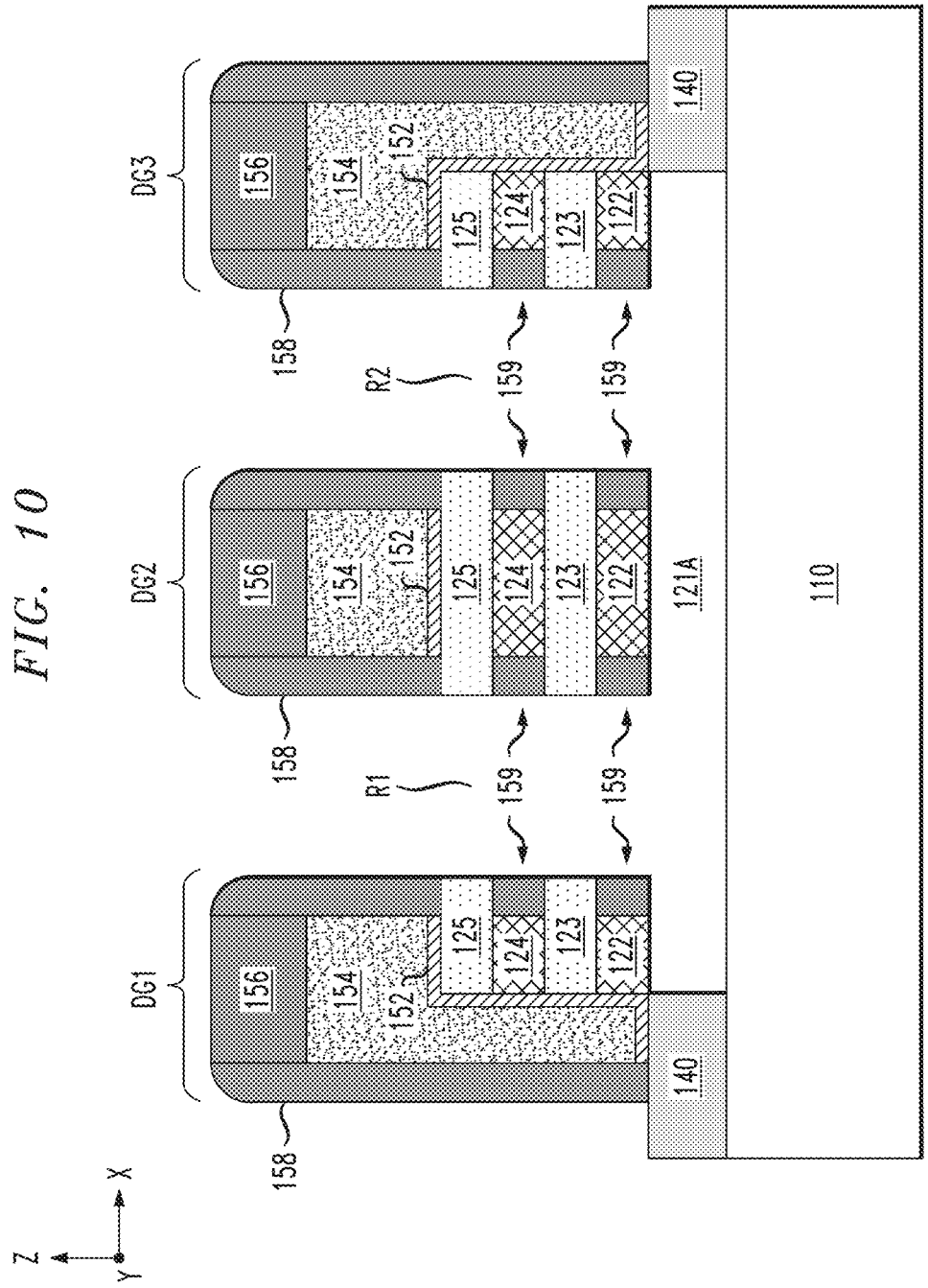

Next, FIG. 10 is a schematic cross-sectional side view of the semiconductor structure shown in FIG. 9 after removing the bottom sacrificial semiconductor layer 121 to form an open region 121A surrounded by the first isolation layer 140. The etch process can be performed using an isotropic etch process (wet etch or dry etch) having an etch chemistry which is configured to etch away the material of the bottom sacrificial semiconductor layer 121 selective to the materials of the surrounding structures 110, 122, 123, 125, and 140, 156, 158, and 159. Following removal of the bottom sacrificial semiconductor layer 121, the open region 121A is filled with an insulating material to form the second isolation layer 142. In particular, FIGS. 1A and 11B are schematic views of the semiconductor structure shown in FIG. 10 after filling the open region 121A with insulating material to form the second isolation layer 142 which is coplanar with the first isolation layer 140. FIG. 11B is schematic top plan view (X-Y plane) of the semiconductor structure shown in FIG. 11A, and FIG. 11A is a cross-sectional side view of the semiconductor structure along line 11A-11A shown in FIG. 11B.

In one embodiment, the second isolation layer 142 is formed of the same or similar insulating material (e.g., oxide) as the first isolation layer 140. The second isolation layer 142 can be formed by blanket depositing a layer of insulating material to cover the dummy gate structures DG1, DG2, and DG3, planarizing the layer of insulating material down to the gate capping layers 156, and then performing a timed recess etch process to recess the insulating layer down to the upper surface of the first isolation layer 140. With this process, the insulating material between the between the dummy gate structures DG1, DG2, and DG3 is recessed down to a level that is substantially coplanar with the upper surface of the first isolation layer 140, thereby forming the second isolation layer 142. As shown in FIGS. 11A and 11B, the second isolation layer 142 is formed to essentially replace the bottom sacrificial semiconductor layer 121.

Figure 12B:
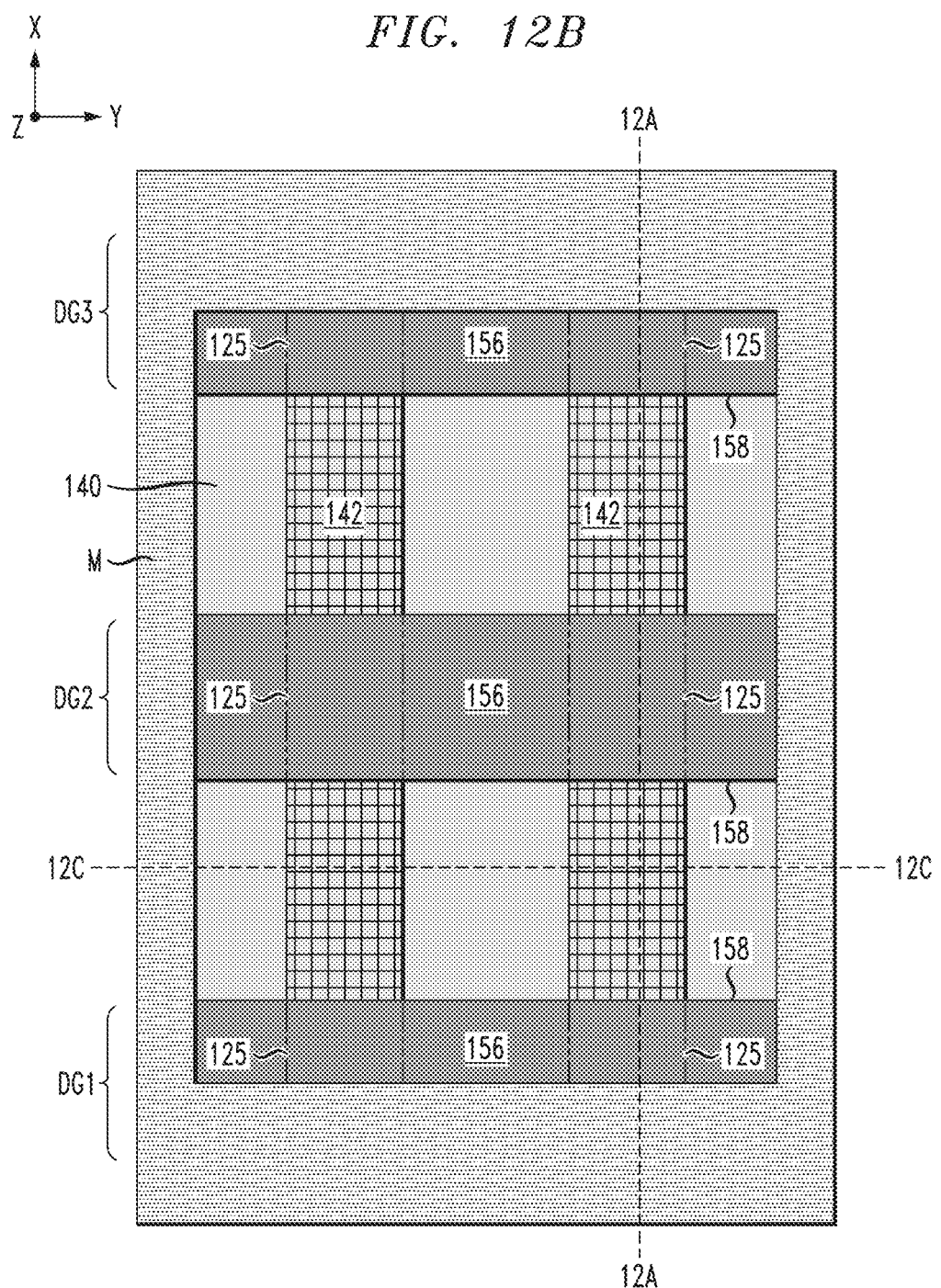

Next, FIGS. 12A, 12B, and 12C are schematic views of the semiconductor structure of FIGS. 11A and 11B after forming an etch mask M and vertically recessing exposed portions of the first and second isolation layers 140 and 142 between adjacent dummy gate structures DG1, DG2, and DG3. FIG. 12B is a schematic top plan view of the semiconductor structure shown in FIG. 12A, which shows the etch mask M having an opening that exposes portions of the first and second isolation layers 140 and 142 between the dummy gate structures DG1, DG2, and DG3. FIG. 12A is a cross-sectional side view of the semiconductor structure along line 12A-12A shown in FIG. 12B, and FIG. 12C is a cross-sectional side view of the semiconductor structure along line 12C-12C shown in FIG. 12B. FIGS. 12A and 12C illustrate that the exposed portions of the isolation layers 140 and 142 are recessed by a depth D1. In one embodiment, the recess depth D1 is about one-half (½) of the thickness of the first and second isolation layers 140 and 142. For example, in one embodiment where the first and second isolation layers have a thickness of about 100 nm, the recess depth is about 50 nm. In this regard, as noted above, the thickness of the bottom sacrificial semiconductor layer 121, which is replaced by the second isolation layer 142, is formed with a sufficient thickness (e.g., 100 nm) so that the isolation layers 140 and 142 can be recessed to a target depth, while a sufficient thickness of insulating material remains between the substrate and the recessed regions of the isolation layers 140 and 142 shown in FIGS. 12A and 12C.

Figure 13A:
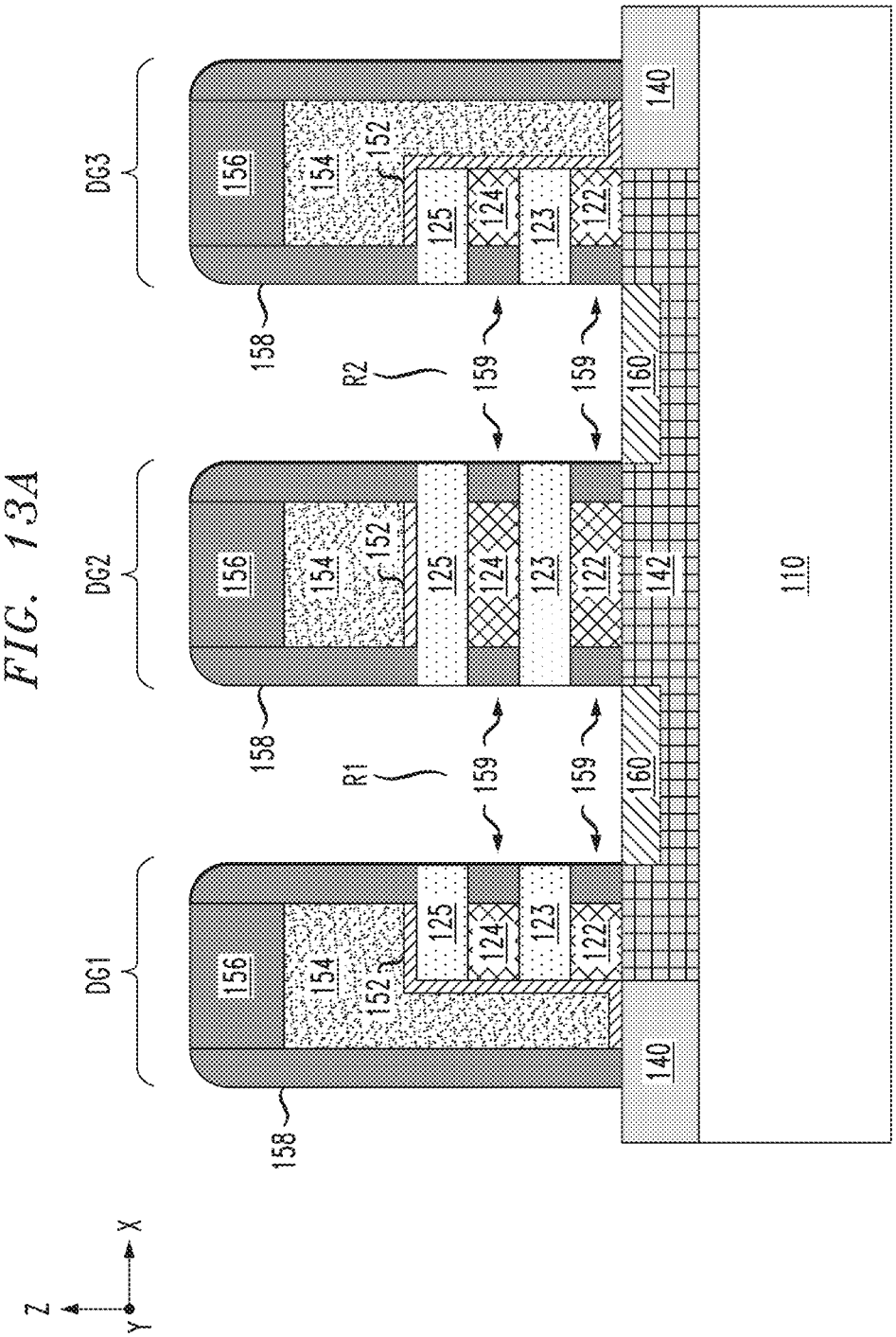
FIGS. 13A and 13B are schematic views of the semiconductor structure shown in FIGS. 12A and 12B, respectively, after forming dummy source/drain contacts in the recessed regions of the first and second isolation layers between adjacent dummy gate structures.
Figure 13B:
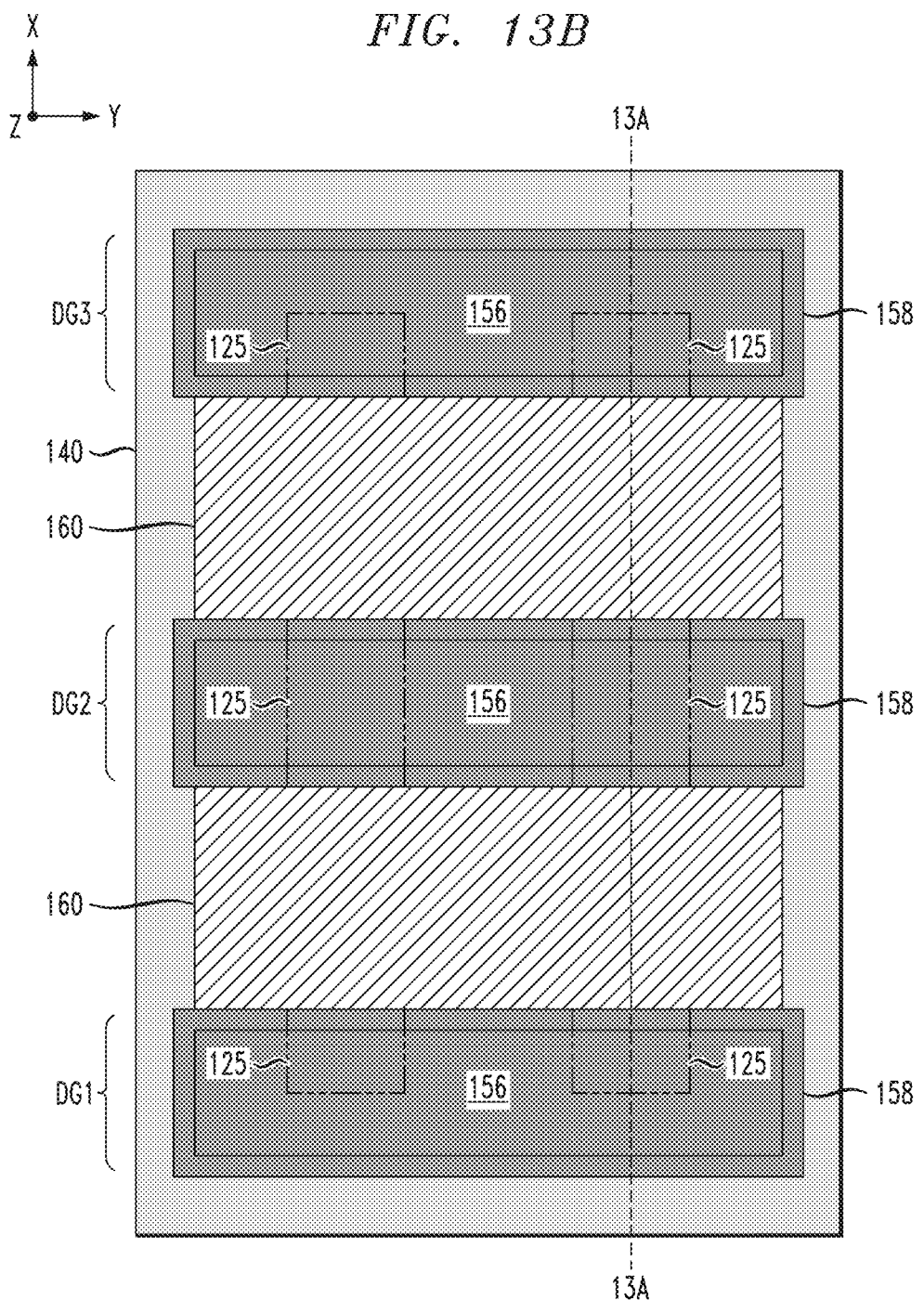

Next, FIGS. 13A and 13B are schematic views of the semiconductor structure shown in FIGS. 12A and 12B, respectively, after forming dummy source/drain contacts 160 in the recessed regions of the first and second isolation layers 140 and 142 between the adjacent dummy gate structures DG1, DG2, and DG3. The dummy source/drain contacts 160 can be formed of any suitable insulating material which can be etched selective to the insulating materials of the first and second isolation layers 140 and 142. For example, the dummy source/drain contacts 160 can be formed of a low-density oxide material, amorphous carbon, etc. In one embodiment, the dummy source/drain contacts 160 are formed by blanket depositing a layer of insulating material to cover the dummy gate structures DG1, DG2, and DG3, planarizing the layer of insulating material down to the dummy gate capping layers 156, and then performing a timed etch process to recess the insulating layer down to a level that level that is substantially coplanar with the upper (non-recessed) surface of the first and second isolation layers 140 and 142, thereby forming the dummy source/drain contacts 160 in the recessed regions between the dummy gate structures DG1, DG2, and DG3.

Figure 14A:
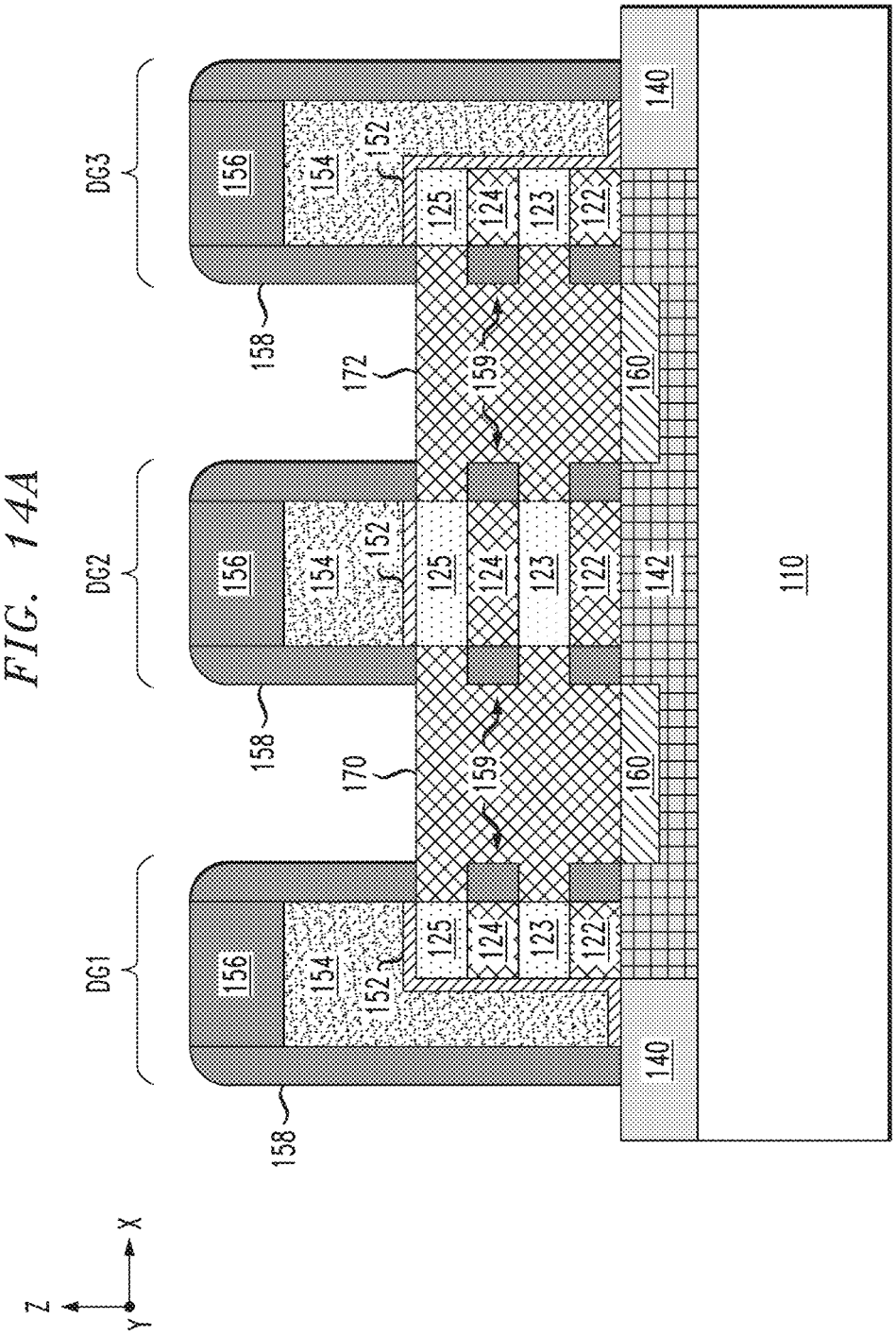
FIGS. 14A and 14B are schematic views of the semiconductor structure shown in FIGS. 13A and 13B, respectively, after forming first and second source/drain regions between adjacent dummy gate structures.
Figure 14B:
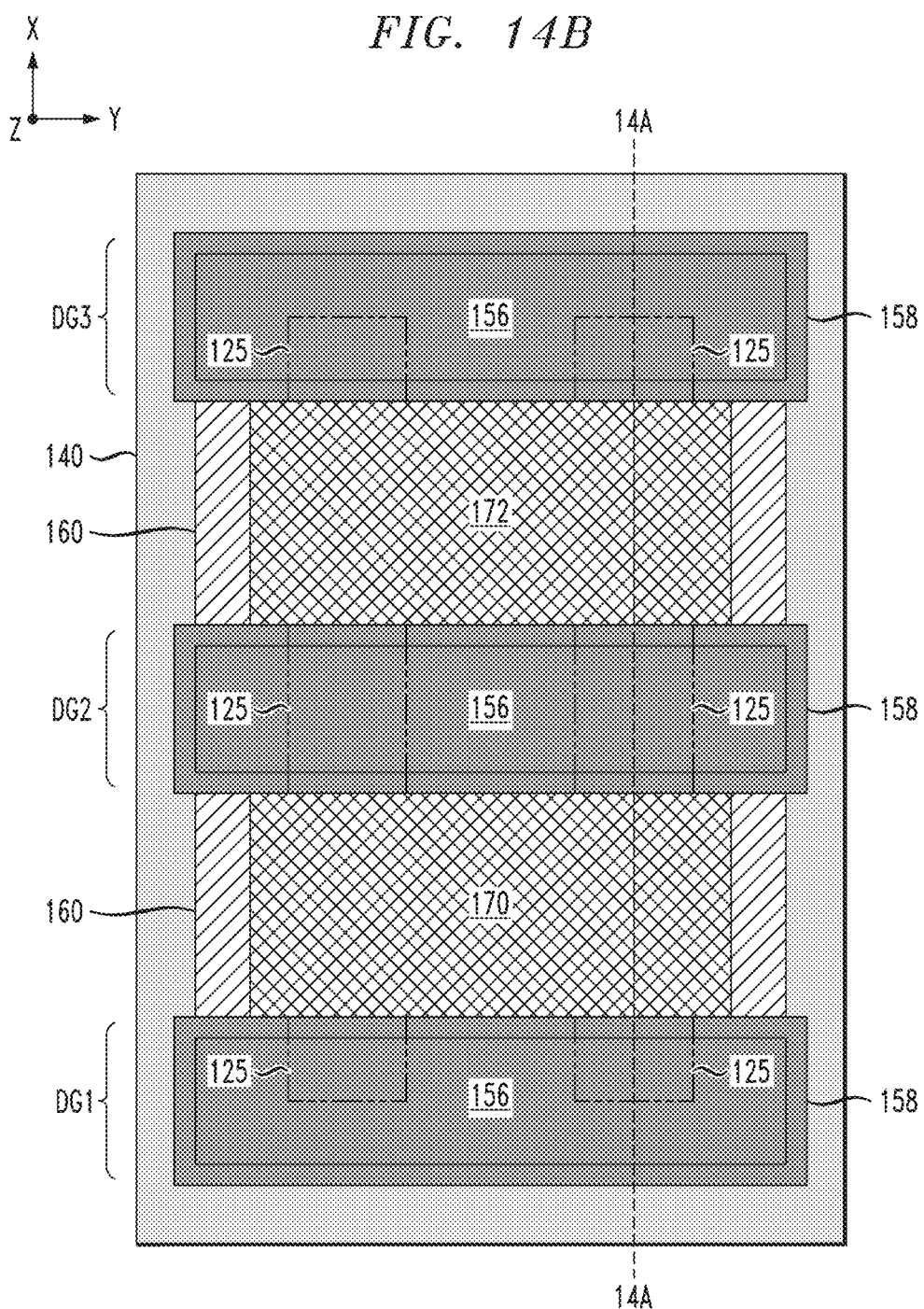

FIGS. 14A and 14B are schematic views of the semiconductor structure shown in FIGS. 13A and 13B, respectively, after forming the first and second source/drain regions 170 and 172 between the dummy gate structures DG1, DG2, and DG3. In one embodiment, the first and second source/drain regions 170 and 172 are formed by epitaxially growing semiconductor material (e.g., epitaxial Si material) on the exposed sidewall surfaces of the semiconductor channel layers 123 and 125 using known techniques such as CVD, MOCVD, LPCVD, MBE, VPE, or other known epitaxial growth techniques which are suitable for the given process flow. The type of epitaxial semiconductor material that is used to form the first and second source/drain regions 170 and 172 will vary depending on various factors including, but not limited to, the type of material of the semiconductor channel layers 123 and 125, the device type (e.g., n-type or p-type) of the nanowire FET device, etc.

The epitaxial growth of the semiconductor material on the exposed surfaces of the semiconductor channel layers 123 and 125 between the adjacent dummy gate structures DG1 and DG2 merges to form the first source/drain region 170, and the epitaxial growth of the semiconductor material on the exposed surfaces of the semiconductor channel layers 123 and 125 between the adjacent dummy gate structures DG2 and DG3 merges to form the second source/drain region 172. As shown in FIG. 14B, the first and second source/drain regions 170 and 172 cover a substantial area of the underlying dummy source/drain contacts 160. While FIG. 14A shows that the first and second source/drain regions 170 and 172 are at a same height as the semiconductor channel layer 125, in other embodiments, the first and second source/drain regions 170 and 172 can be grown thicker such that the upper surfaces of the source/drain regions 170 and 172 are vertically higher than the upper surfaces of the semiconductor channel layers 125, thereby forming "raised" source/drain regions.

Furthermore, in one embodiment, the first and second source/drain regions 170 and 172 are doped using known techniques. For example, in one embodiment, the first and second source/drain regions 170 and 172 are "in-situ" doped during epitaxial growth by adding a dopant gas to the source deposition gas (i.e., the Si-containing gas). Exemplary dopant gases may include a boron-containing gas such as $BH_3$ for pFETs or a phosphorus or arsenic containing gas such as PH$_3$ or AsH$_3$ for nFETs, wherein the concentration of impurity in the gas phase determines its concentration in the epitaxially grown semiconductor material.

In addition, in one embodiment of the invention, a thermal anneal process is performed following the epitaxial growth and in-situ doping of the first and second source/drain regions to cause dopants to be injected into portions of the semiconductor channel layers 123 and 125 in contact with the epitaxial semiconductor material of the first and second source/drain regions 170 and 172. This process effectively results in extending the first and second source/drain regions 170 and 172 into the end portions of the semiconductor channel layers 123 and 125, as schematically illustrated in FIG. 14A. For illustrative purposes, FIG. 14A schematically illustrates that end portions of the semiconductor channel layers 123 and 125 are injected with source/drain dopants, thereby laterally extending the source/drain regions 170 and 172 into the ends of the semiconductor channel layers 123 and 125 at a length which substantially equal to a thickness of the sidewall spacers 158 and 159.

Figure 15A:
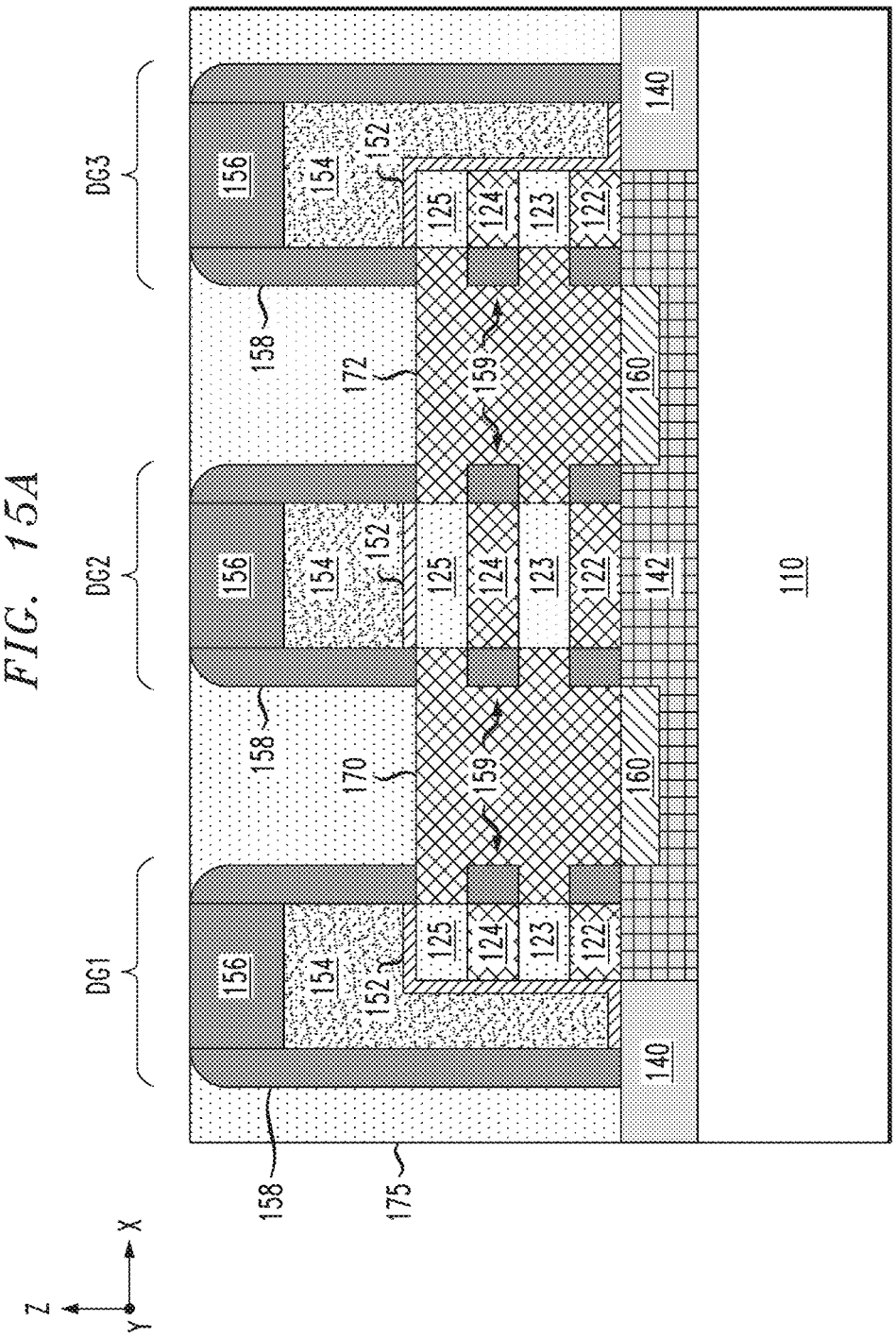
FIGS. 15A, 15B, and 15C are schematic views of the semiconductor structure shown in FIGS. 14A and 14B after forming a pre-metal dielectric layer to encapsulate the dummy gate structures and the first and second source/drain regions.
Figure 15B:
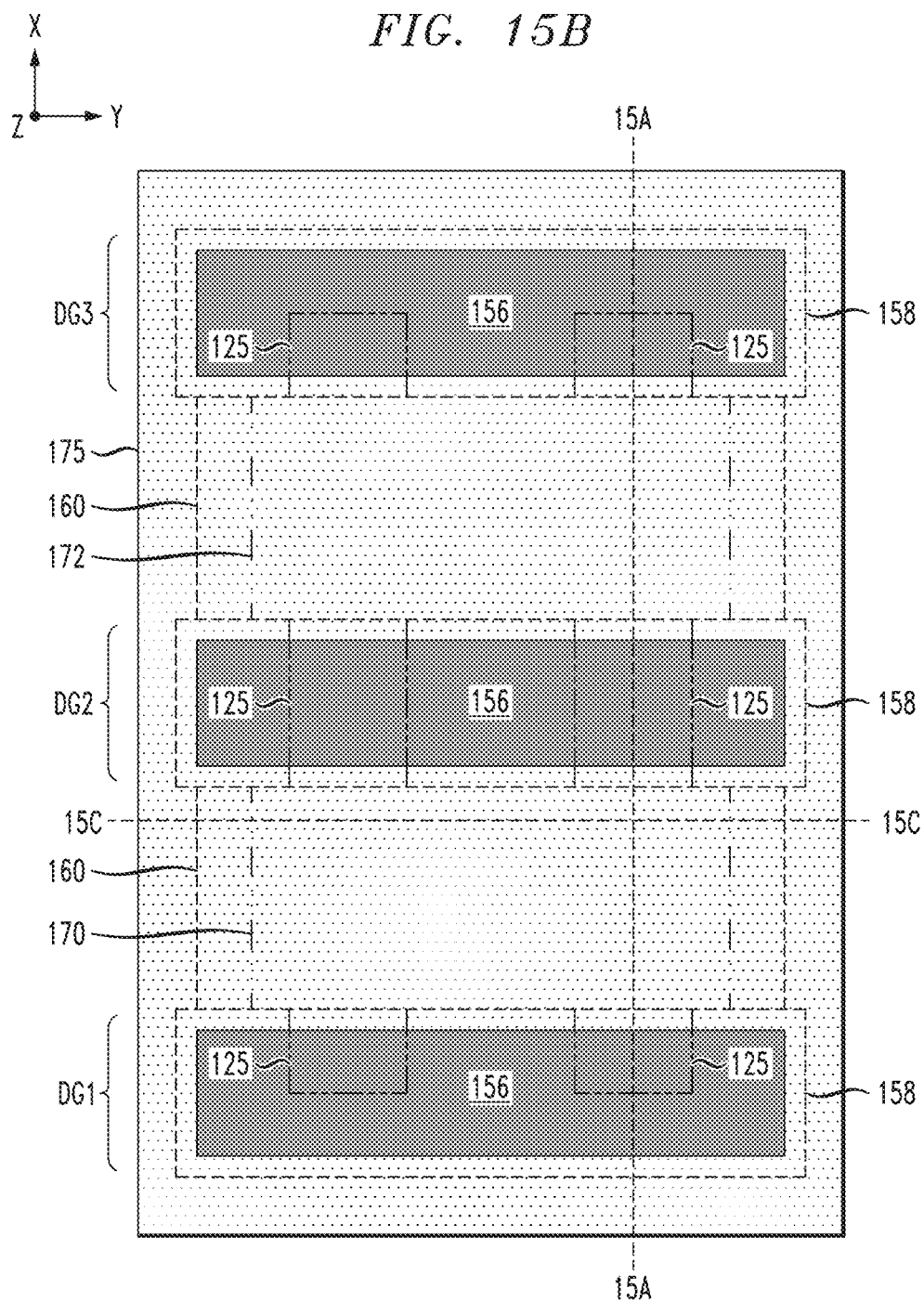
Figure 15C:
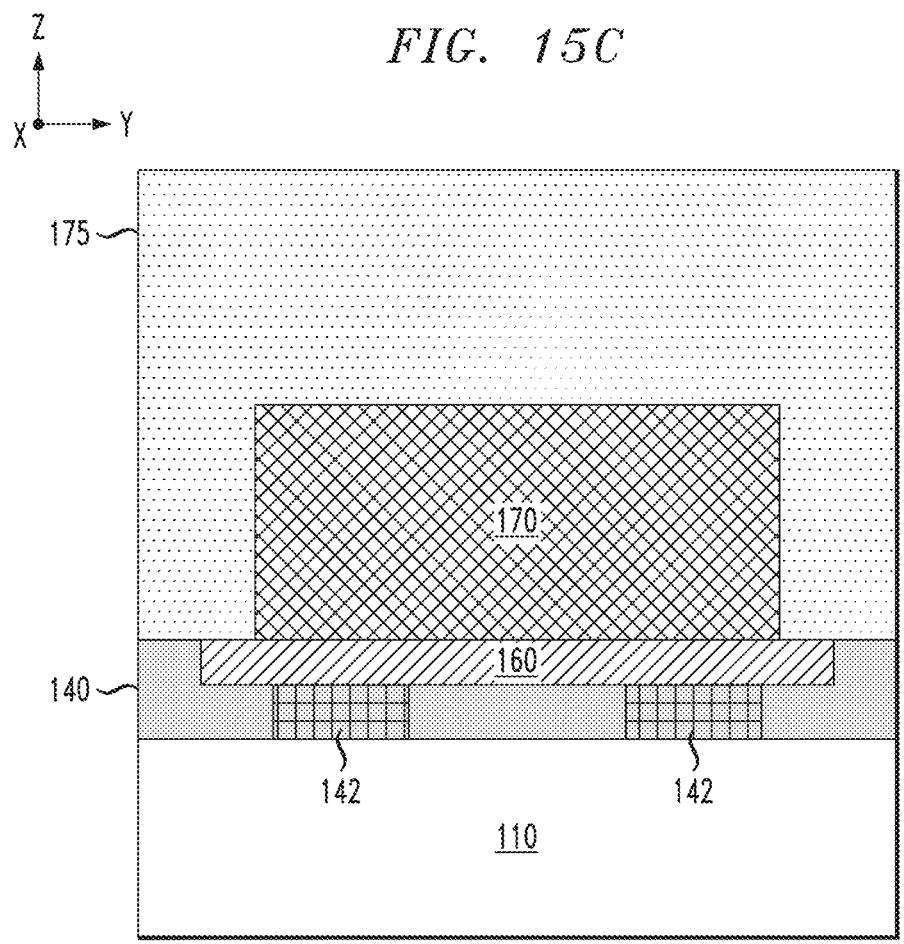

Following the formation of the epitaxial source/drain regions 170 and 172, the process flow continues with covering the source/drain regions 170 and 172 with dielectric/insulating material and commencing a replacement metal gate process. For example, FIGS. 15A, 15B and 15C are schematic views of the semiconductor structure shown in FIGS. 14A and 14B after forming the PMD layer 175 to encapsulate the dummy gate structures DG1, DG2, and DG3, and the first and second source/drain regions 170 and 172 in dielectric/insulating material. FIG. 15B is schematic top plan view (X-Y plane) of the semiconductor structure, while FIG. 15A is a cross-sectional side view of the semiconductor structure along line 15A-15A shown in FIG. 15B, and FIG. 15C is a cross-sectional side view of the semiconductor structure along line 15C-15C shown in FIG. 15B.

In one embodiment, the PMD layer 175 is formed by depositing a layer of dielectric/insulating material over the semiconductor structure of FIGS. 14A and 14B, and planarizing the layer of dielectric/insulating material down to the gate capping layers 156 to form the PMD layer 175. The PMD layer 150 may comprise any suitable insulating/dielectric material that is commonly utilized in FEOL process technologies including, but not limited to, silicon oxide, SiCOH, SiCH, or other types of silicon-based low-k dielectrics (e.g., k less than about 4.0), porous dielectrics, or known ULK (ultra-low-k) dielectric materials (with k less than about 2.5). The dielectric/insulating material of the PMD layer 175 is deposited using known deposition techniques, such as, for example, ALD, CVD, PECVD, PVD, or spin-on deposition. In one embodiment, the layer of dielectric/insulating material is planarized using a standard planarization process such as CMP to remove the overburden dielectric/insulating down to the upper surface of the dummy gate capping layers 156, and thereby form the PMD layer 175.

Figure 16A:
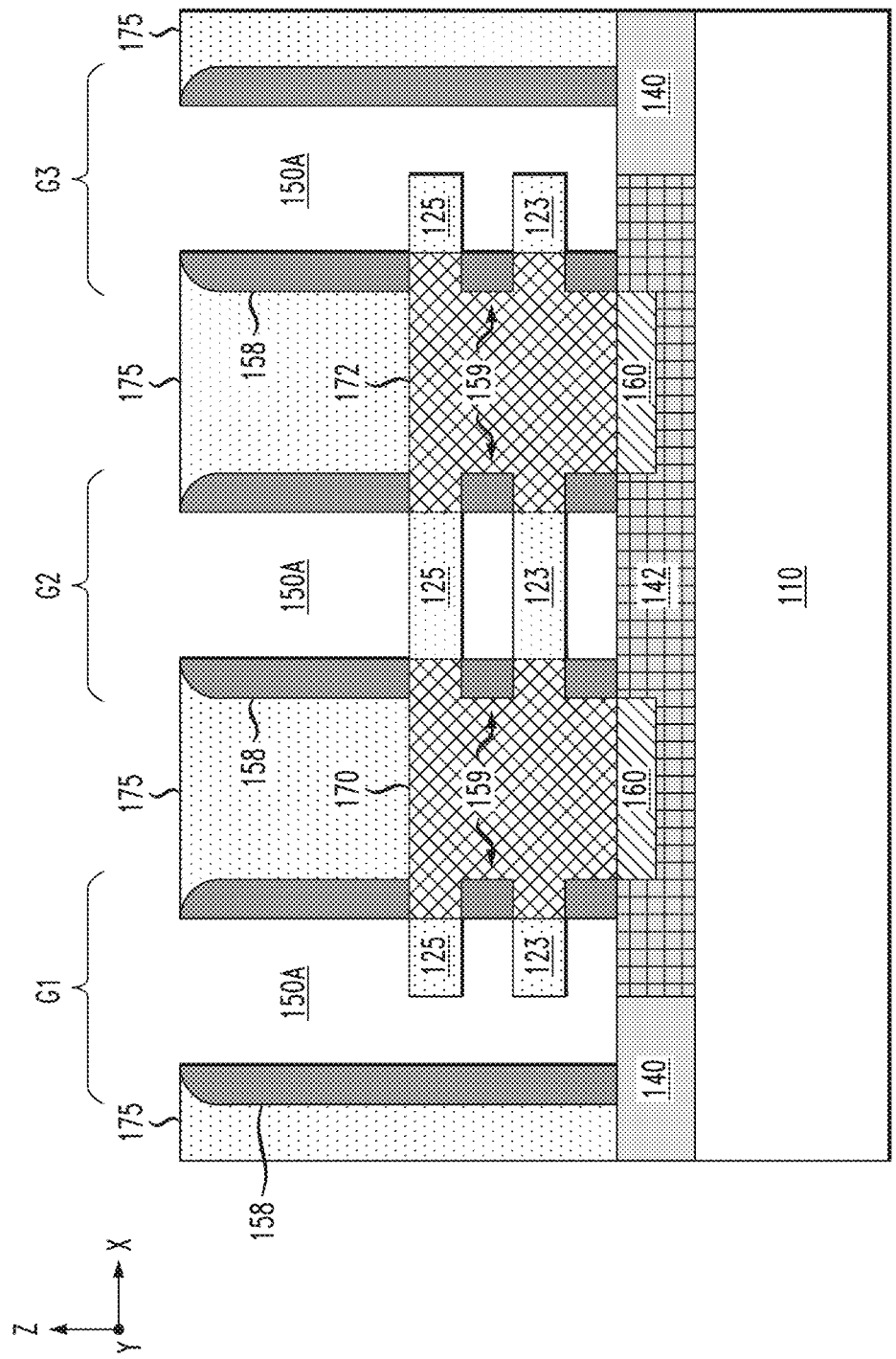

Following the formation of the PMD layer 175, a replacement metal gate process is performed to replace the dummy gate stack structures 150 with metal gate structures. For example, FIGS. 16A, 16B, and 16C are schematic views of the semiconductor structure shown in FIGS. 15A and 15B after removing the dummy gate capping layers 156, the dummy gate stack structures 150 (sacrificial layers 152 and 154), and removing remaining portions of the sacrificial semiconductor layers 122 and 124 to release the epitaxial semiconductor channel layers 123 and 125. FIG. 16B is schematic top plan view (X-Y plane) of the semiconductor structure, while FIG. 16A is a cross-sectional side view of the semiconductor structure along line 16A-16A shown in FIG. 16B, and FIG. 16C is a cross-sectional side view of the semiconductor structure along line 16C-16C shown in FIG. 16B.

The dummy gate capping layers 156, the dummy gate polysilicon layer 154, and the dummy gate oxide layers 152 are etched away using known etching techniques and etch chemistries. For example, after removing the dummy gate capping layers 156, the dummy poly gate layers 154 can be removed using a selective dry etch or wet etch process with suitable etch chemistries, including ammonium hydroxide (NH$_4$OH) or tetramethylammonium hydroxide (TMAH). The etching of the dummy poly gate layers 154 is selective to, e.g., dummy gate oxide layer 152, to thereby protect the semiconductor channel layers 123 and 125 from being etched during the poly etch process. After the polysilicon material is removed, an oxide etch process is performed to etch away the dummy gate oxide layers 152 selective to, e.g., the semiconductor channel layers 123 and 125. In this manner, the sacrificial materials (e.g., dummy polysilicon and oxide layers) of the dummy gate stack structures 150 can be etched away without damaging the semiconductor channel layers 123 and 125.

As shown in FIGS. 16A, 16B, and 16C, the removal of the dummy gate capping layers 156 and the dummy gate stack structures 150 (layers 152 and 154) results in gate recess regions 150A being formed between the gate sidewall spacers 158. The gate recess regions 150A expose the remaining portions of the sacrificial semiconductor layers 122 and 124. An etch process is then performed to selectively etch away the sacrificial semiconductor layers 122 and 124 to release the semiconductor channel layers 123 and 125, thereby allowing the gate recess regions 150A to extend into spaces between and adjacent to the semiconductor channel layers 123 and 125.

The sacrificial semiconductor layers 122 and 124 (e.g., SiGe layers) can be etched away selective to the semiconductor channel layers 123 and 125 (Si layers) using a wet etch process, for example. In one embodiment, the SiGe material of the sacrificial semiconductor layers 122 and 124 can be selectively etched (with high etch selectivity) using a gas phase HCl (hydrochloric acid) or wet etch solution to laterally etch the SiGe material of the sacrificial semiconductor layers 122 and 124 selective to the Si material of the semiconductor channel layers 123 and 125. The gas phase HCl (hydrochloric acid) provides high etch selectivity when, for example, the semiconductor channel layers 123 and 125 are formed of Si or SiGe with a lower Ge concentration than the SiGe material of the sacrificial semiconductor layers 122 and 124.

Figure 17A:
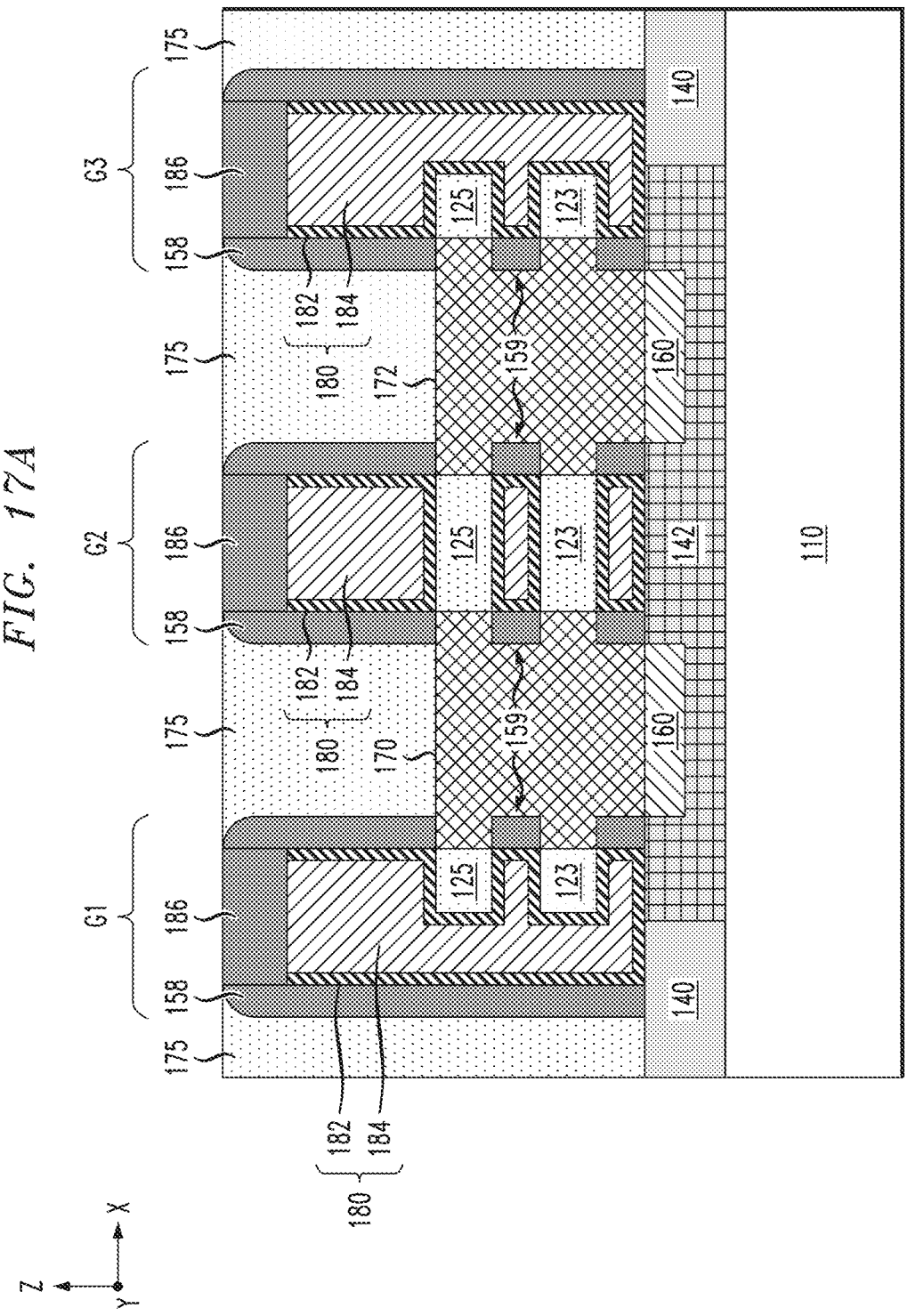
FIGS. 17A and 17B are schematic views of the semiconductor structure shown in FIGS. 16A and 16C, respectively, after forming metal gate structures and gate capping layers.
Figure 17B:
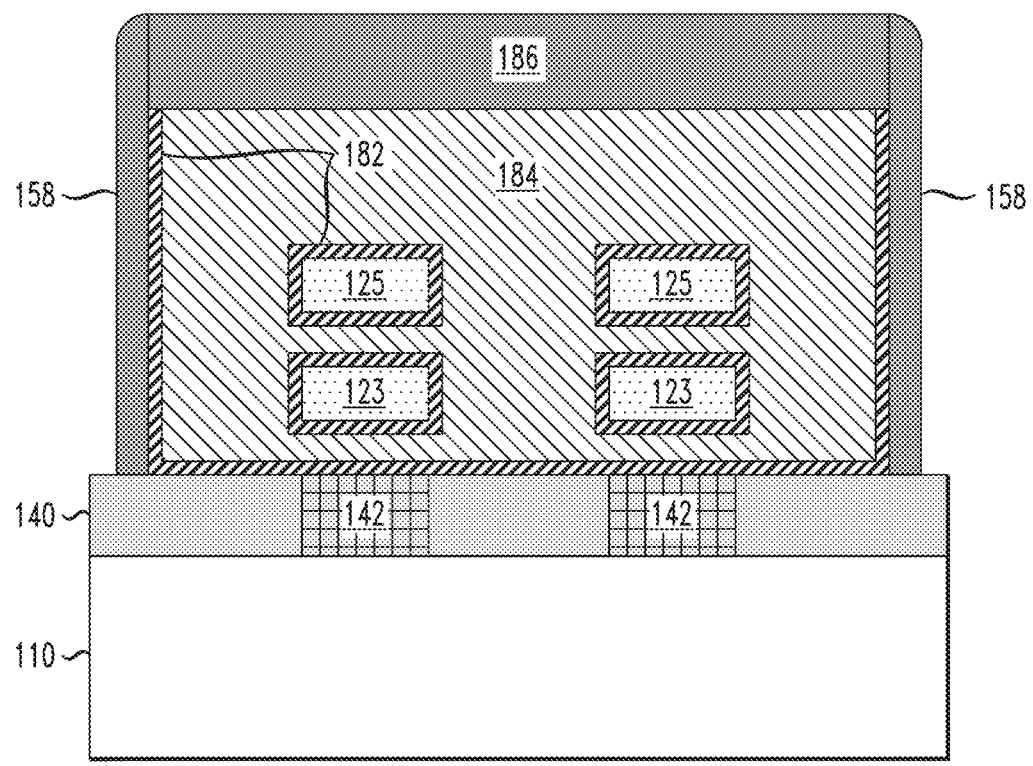

Next, FIGS. 17A and 17B are schematic views of the semiconductor structure shown in FIGS. 16A, 16B, and 16C after forming the metal gate structures 180 and the gate capping layers 186, wherein the metal gate structures 180 include high-k gate dielectric layers 182 and metallic gate electrode layers 184. In one embodiment, the high-k gate dielectric layers 182 are formed by depositing one or more conformal layers of gate dielectric material over the exposed surfaces of the semiconductor structure shown in FIGS. 16A, 16B, and 16C. The gate dielectric material may comprise, e.g., nitride, oxynitride, or oxide or a high-k dielectric material having a dielectric constant of about 3.9 or greater. For example, the conformal gate dielectric material can include silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k dielectric material may further include dopants such as lanthanum, aluminum. In one embodiment of the invention, the conformal layer of gate dielectric material is formed with a thickness in a range of about 0.5 nm to about 2.5 nm, which will vary depending on the target application. The conformal layer of gate dielectric material is deposited using known methods such as ALD, for example, which allows for high conformality of the gate dielectric material An optional conformal layer of work function metal (WFM) may be formed on top of the gate dielectric layers 182, wherein the WFM layer comprises one or more types of metallic materials, including, but not limited to, TiN, TaN, TiAlC, Zr, W, Hf, Ti, Al, Ru, Pa, TiAl, ZrAl, WAl, TaAl, TiAlC, TaC, TiC, TaMgC, or other work function metals or alloys that are commonly used to obtain target work functions which are suitable for the type (e.g., n-type or p-type) of nanowire FET devices that are to be formed. The conformal layer of work function metal is deposited using known methods such as ALD, CVD, etc. In one embodiment, the conformal WFM layer is formed with a thickness in a range of about 2 nm to about 5 nm.

The gate electrode layers 184 are formed by depositing a layer of conductive material to fill the gate recess regions 150A with the conductive material. The gate electrode layers 184 can be formed with a conductive material including, but not limited to, doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The gate electrode layers 184 may further comprise dopants that are incorporated during or after deposition.

The layer of conductive material which forms the gate electrode layers 184 is deposited using a suitable deposition process, for example, CVD, PECVD, PVD, plating, thermal or e-beam evaporation, sputtering, etc. As shown in FIGS. 17A and 17B, the deposition process is performed to ensure that the gate electrode layers 184 fill the gate recess regions 150A including the spaces between the semiconductor channel layers 123 and 125 thereby encapsulating the semiconductor channel layers 123 and 125 within the gate electrode layer 184. In another embodiment, the conductive material that forms the gate electrode layer 184 can serve as a WFM layer.

Following the deposition of the dielectric, WFM and metallic layers which form the metal gate structures 180, a CMP process is performed to polish the surface of the semiconductor structure down to the PMD layer 175, thereby removing overburden materials of the dielectric, WFM and metallic layers which form the metal gate structures 180. An etch process is then performed to recess an upper portion of the metal gate structures 180 down to a target level below the upper surface of the PMD layer 175. A layer of dielectric material is then deposited over the surface of the semiconductor structure to fill the recesses above the metal gate structures 180 with dielectric material, and the semiconductor structure is planarized down to the surface of the PMD layer 175 to remove the overburden dielectric material, and thereby form the gate capping layers 186. The gate capping layers 186 can be formed of a dielectric material such as SiN, SiOCN, SiBCN, etc.

Figure 18A:
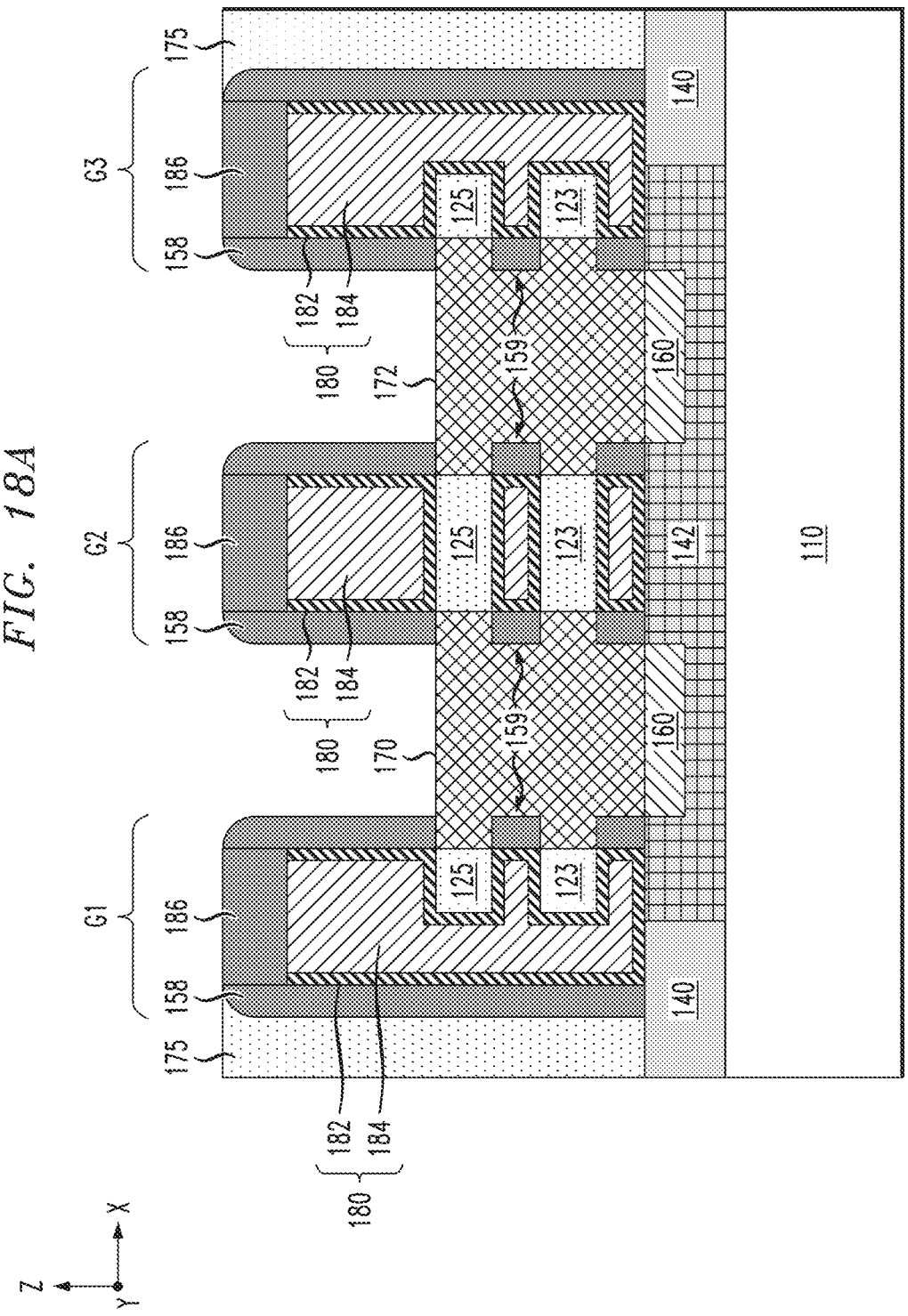

A next phase of the fabrication process comprises forming source/drain contacts which wrap-around the sides and bottom surfaces of the first and second source/drain regions 170 and 172, using a process flow as schematically illustrated in FIGS. 18A through 20B. In particular, FIGS. 18A, 18B, and 18C are schematic side views of the semiconductor structure shown in FIGS. 17A and 17B after patterning the PMD layer 175 to expose upper and sidewall surfaces of the first and second source/drain regions 170 and 172 between the adjacent gate structures G1, G2 and G3. FIG. 18B is schematic top plan view of the semiconductor structures shown in FIGS. 18A and 18C, wherein FIG. 18A is a cross-sectional side view of the semiconductor structure along line 18A-18A shown in FIG. 18B, and FIG. 18C is a cross-sectional side view of the semiconductor structure along line 18C-18C shown in FIG. 18B. As shown in FIGS. 18A, 18B and 18C, the PMD layer 175 is patterned to form an opening which exposes end portions of the underlying dummy source/drain contact layers 160 adjacent to the vertical sidewalls of the first and second source/drain regions 170 and 172.

Figure 18B:
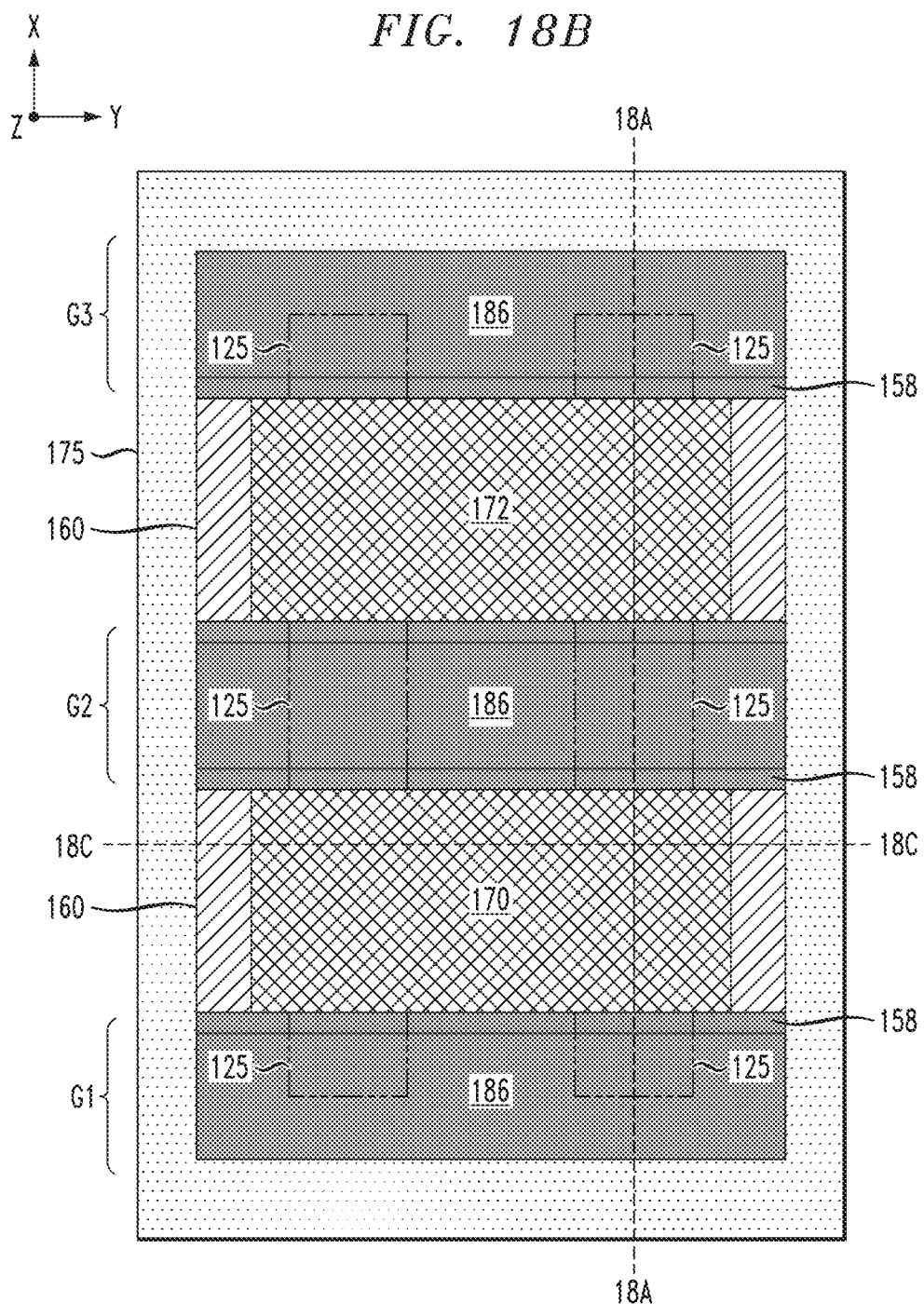
Figure 19A:
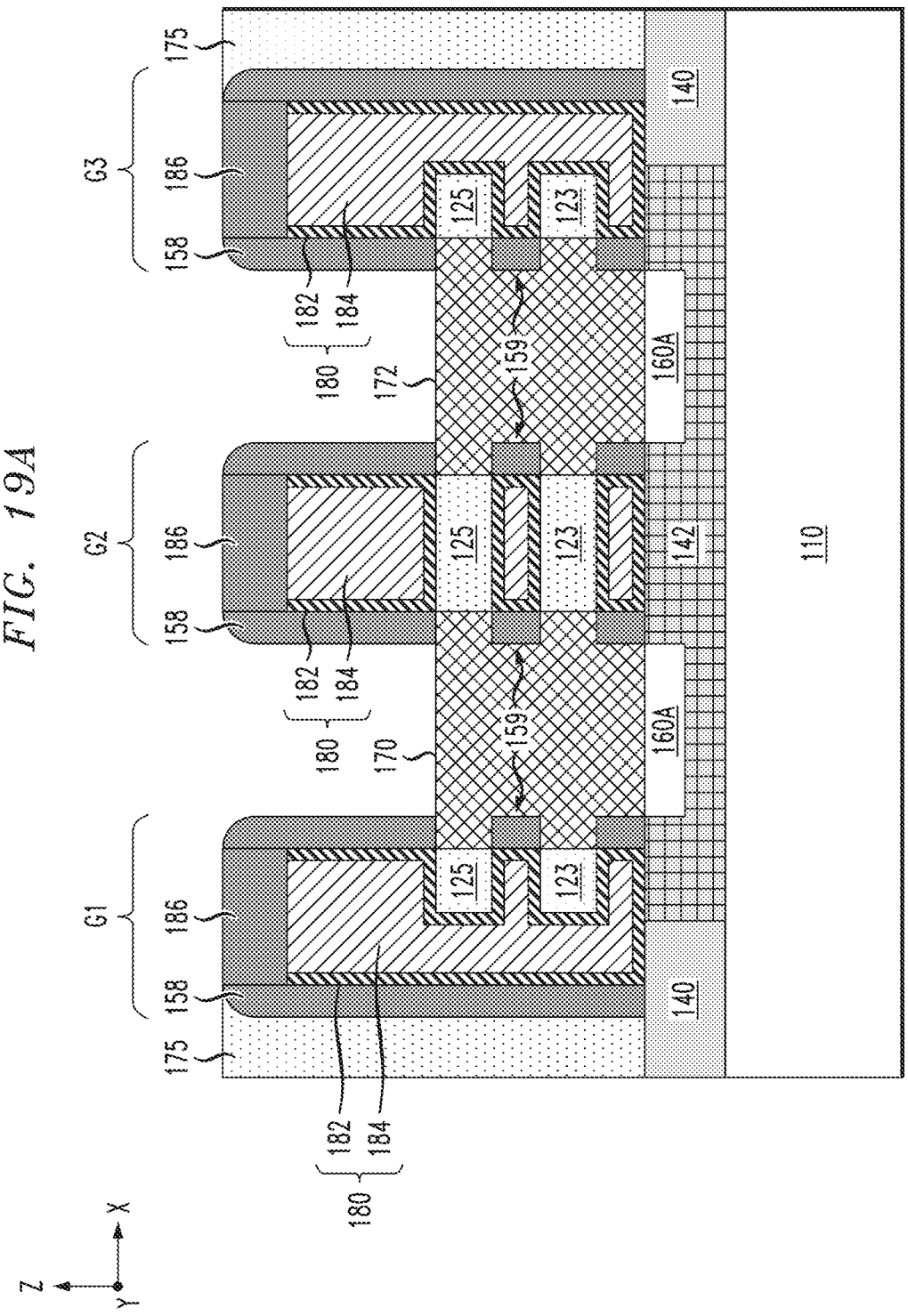
FIGS. 19A, 19B, and 19C are schematic views of the semiconductor structure shown in FIGS. 18A, 18B, and 18C, respectively, after removing the dummy source/drain contacts to form open regions between bottom surfaces of the first and second source/drain regions and the recessed surfaces of the underlying first and second isolation layers.
Figure 19B:
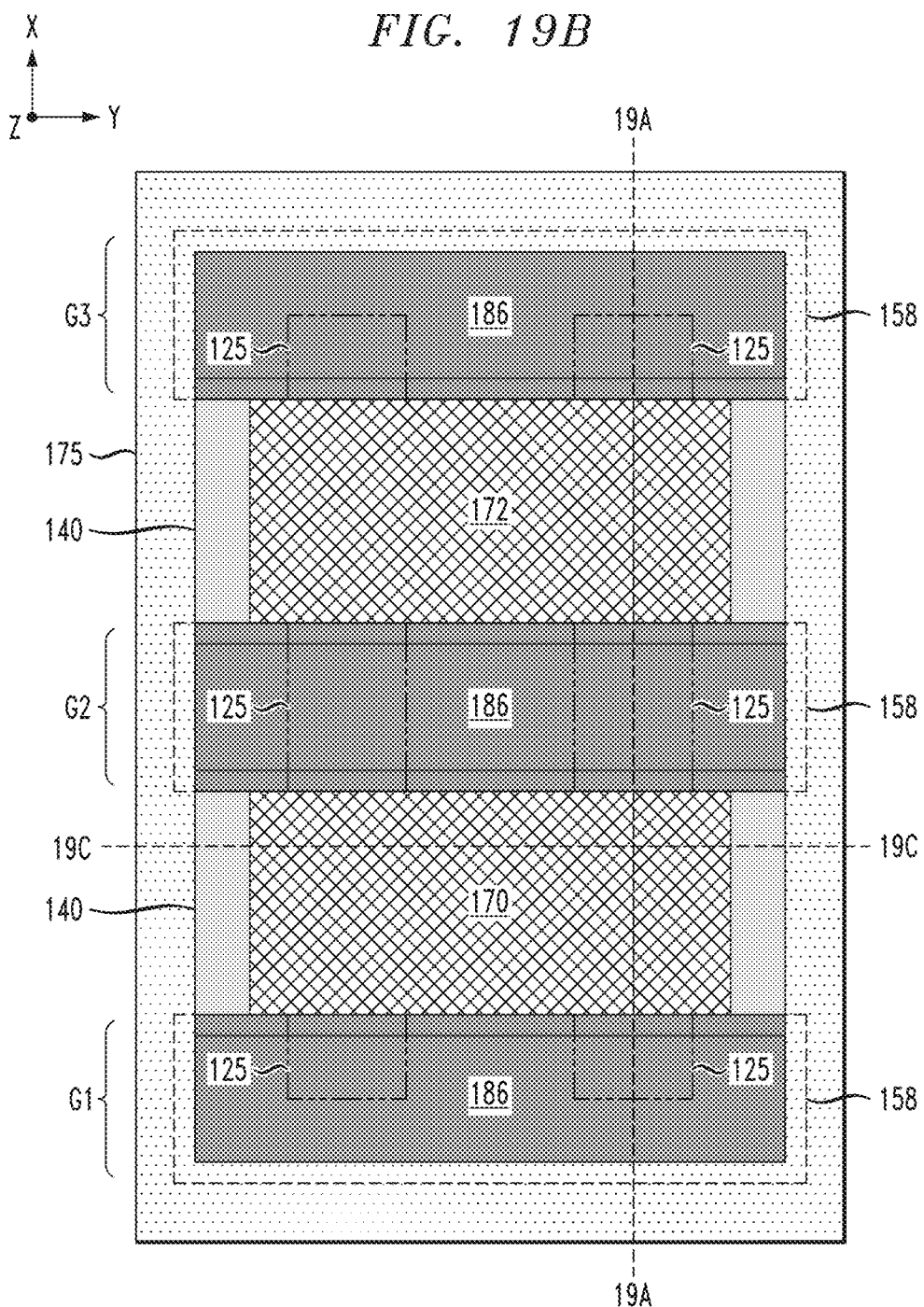
Figure 19C:
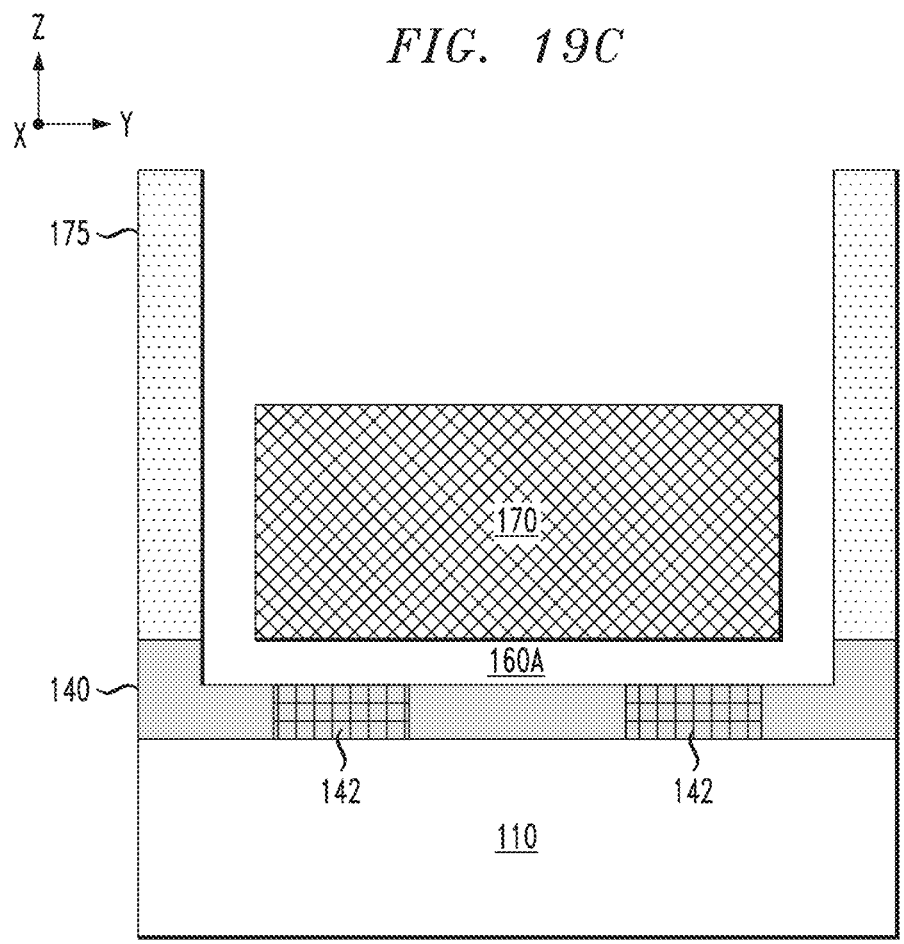

Next, FIGS. 19A, 19B, and 19C are schematic views of the semiconductor structure shown in FIGS. 18A, 18B, and 18C respectively, after removing the dummy source/drain contacts 160 to form open regions 160A between the bottom surfaces of the first and second source/drain regions 170 and 172 and the recessed surfaces of the underlying first and second isolation layers 140 and 142. In one embodiment, the material of the dummy source/drain contacts 160 can be etched selective to the materials of the surrounding structures/layers 140, 142, 170 and 175 using a wet etch process with an etch chemistry that is highly selective to the material of the dummy source/drain contacts 160.

Figure 20A:
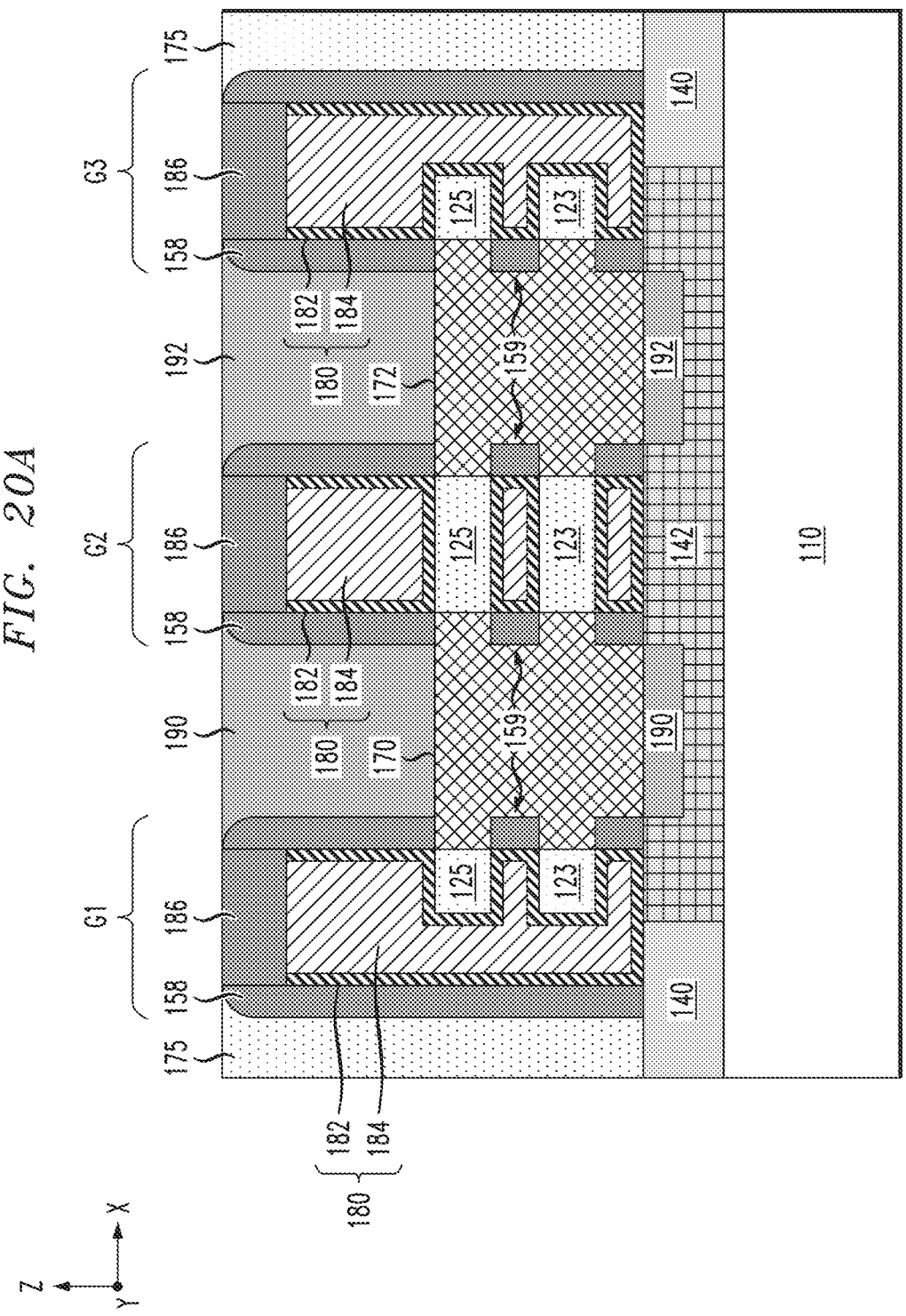

Next, FIGS. 20A and 20B are schematic views of the semiconductor structure shown in FIGS. 19A and 19B, respectively, after forming the wrap-around first and second source/drain contacts 190 and 192 which surround the upper, sidewall, and bottom surfaces of the first and second source/drain regions 170 and 172, respectively, between the gate structures G1, G2, and G3. The first and second source/drain contacts 190 and 192 can be formed by depositing a layer of metallic material, such as tungsten, cobalt, aluminum, or other conductive materials that are suitable for use in forming vertical device contacts in a middle-of-line (MOL) layer of the semiconductor device, to fill the spaces between the adjacent gate structures G1, G2, and G3, including filling the open regions 160A below the bottom surfaces of first and second source/drain regions 170 and 172. A CMP process is then performed to planarize the surface of the semiconductor structure down to the upper surfaces of the PMD layer 175 and the gate capping layers 186 to remove the overburden metallic material, thereby resulting in the semiconductor structure shown in FIGS. 20A and 20B.

Following the formation of the semiconductor structure shown in FIGS. 20A and 20B, any known sequence of processing steps can be implemented to complete the fabrication of the semiconductor integrated circuit device, the details of which are not needed to understand embodiments of the invention. Briefly, by way of example, MOL processing can continue by patterning the gate capping layer 186 of the functioning gate structure G2 to form one or more openings that are filled with metallic material to form the vertical gate contact 195 shown in FIGS. 1A, 1B, and 1C. Following formation of the device contacts (e.g., MOL contacts), a back-end-of-line (BEOL) interconnect structure is formed to provide connections to/between the vertical MOL contacts, and other active or passive devices that are formed as part of the FEOL layer.

It is to be understood that the methods discussed herein for fabricating nanowire FET devices can be readily incorporated within semiconductor processing flows for fabricating other types of non-planar FET devices such as nanosheet FET devices and FinFET devices. For example, as noted above, the process flow discussed above for fabricating nanowire FET devices would be the same or similar to the process flow for fabricating nanosheet FET devices wherein the stack structures 130 and 131 shown in FIGS. 3A and 3B, for example, would be patterned to have significantly wider profiles. The other processing steps shown throughout the figures would be similarly implemented to form nanosheet FET devices with wrap-around source/drain contacts.

In addition, for FinFET devices, the stack of layers 120 shown in FIG. 2 would include the bottom sacrificial semiconductor layer 121 (epitaxial SiGe layer) with the other layers 122, 123, 124 and 125 replaced by a single semiconductor layer (e.g., epitaxial Si layer). In this instance, the stack structures 130 and 131 shown in FIG. 3B (which are formed by patterning the stack of layers 120 of FIG. 2) would each include a vertical Si semiconductor fin disposed on top of a sacrificial SiGe semiconductor layer 121 Furthermore, the process flow discussed above would be modified such that, e.g., epitaxial source/drain regions would be formed on the portions of the Si vertical semiconductor fins which extend between adjacent dummy gate structures DG1/DG2, and DG2/DG3 (instead of removing the layer stack 122, 123, 124 and 125 as shown in FIGS. 7A and 7B). Thereafter, similar processing steps would be implemented to form recessed regions in the isolation layer(s) below the portions of the vertical Si semiconductor fins that serve as the source/drain regions, to allow the formation of wrap-around source/drain contacts.

It is to be understood that the methods discussed herein for fabricating non-planar FET devices with wrap-around source/drain contacts can be readily incorporated within semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

What is claimed is:

1. A semiconductor integrated circuit device, comprising:
a non-planar field effect transistor (FET) device disposed on a semiconductor substrate, wherein the non-planar FET device comprises a semiconductor channel layer, and a gate structure in contact with at least an upper surface and sidewall surfaces of the semiconductor channel layer;
a first epitaxial source/drain layer disposed adjacent to a first side of the gate structure and in contact with a first end of the semiconductor channel layer exposed through a gate sidewall spacer of the gate structure;
a second epitaxial source/drain layer disposed adjacent to a second side of the gate structure, opposite the first side of the gate structure, and in contact with a second end of the semiconductor channel layer exposed through the gate sidewall spacer of the gate structure;
a first recess formed in an isolation layer below a bottom surface of the first epitaxial source/drain layer;
a second recess formed in the isolation layer below a bottom surface of the second epitaxial source/drain layer;
a first source/drain contact formed in contact with an upper surface, sidewalls surfaces, and the bottom surface of the first epitaxial source/drain layer, wherein the first source/drain contact comprises metallic material that is disposed within the first recess in the isolation layer to make contact with the bottom surface of the first epitaxial source/drain layer; and
a second source/drain contact formed in contact with an upper surface, sidewalls surfaces, and the bottom surface of the second epitaxial source/drain layer, wherein the second source/drain contact comprises metallic material that is disposed within the second recess in the isolation layer to make contact with the bottom surface of the second epitaxial source/drain layer.

2. The device of claim 1, wherein the non-planar FET device comprises a nanowire FET device, wherein the semiconductor channel layer comprises at least one semiconductor nanowire that is encapsulated within the gate structure.

3. The device of claim 1, wherein the non-planar FET device comprises a nanosheet FET device, wherein the semiconductor channel layer comprises at least one semiconductor nanosheet layer that is encapsulated within the gate structure.

4. The device of claim 1, wherein the non-planar FET device comprises a FinFET, wherein the semiconductor channel layer comprises at least one vertical semiconductor fin, wherein the gate structure is formed over a portion of the vertical semiconductor fin, and wherein the first and second epitaxial source/drain layers are formed on portions of the vertical semiconductor fin which extend from the gate sidewall spacer of the gate structure.

5. The device of claim 1, wherein the first and second epitaxial source/drain layers are grown on the first and second ends of the semiconductor channel layer.

6. The device of claim 1, wherein the gate structure comprises a high-k metal gate structure comprising a conformal high-k gate dielectric layer formed on surfaces of the semiconductor channel layer, and a metallic gate electrode layer.

7. The device of claim 1, wherein the isolation layer isolates the first and second source/drain contacts from the semiconductor substrate.

8. The device of claim 1, wherein the isolation layer comprises a footprint area that is substantially similar to a footprint area of the semiconductor channel layer.

9. The device of claim 1, further comprising a shallow trench isolation layer disposed around the isolation layer.

10. The device of claim 9, wherein the shallow trench isolation layer and the isolation layer are formed of an oxide material.

11. A semiconductor integrated circuit device, comprising:
a nanowire field effect transistor (FET) device formed on a semiconductor substrate, wherein the nanowire FET device comprises a stack of nanowire channel layers, and a gate structure disposed around and in contact with the stack of nanowire channel layers;
a first epitaxial source/drain layer disposed adjacent to a first side of the gate structure and in contact with first end portions of the nanowire channel layers exposed through a gate sidewall spacer of the gate structure;
a second epitaxial source/drain layer disposed adjacent to a second side of the gate structure, opposite the first side of the gate structure, and in contact with second end portions of the nanowire channel layers exposed through the gate sidewall spacer of the gate structure;
an isolation layer disposed in the semiconductor substrate below the stack of nanowire channel layers;
a first recess formed in the isolation layer below a bottom surface of the first epitaxial source/drain layer;
a second recess formed in the isolation layer below a bottom surface of the second epitaxial source/drain layer;
a first source/drain contact formed in contact with an upper surface, sidewalls surfaces, and the bottom surface of the first epitaxial source/drain layer, wherein the first source/drain contact comprises metallic material that is disposed within the first recess in the isolation layer to make contact with the bottom surface of the first epitaxial source/drain layer; and
a second source/drain contact formed in contact with an upper surface, sidewalls surfaces, and the bottom surface of the second epitaxial source/drain layer, wherein the second source/drain contact comprises metallic material that is disposed within the second recess in the isolation layer to make contact with the bottom surface of the second epitaxial source/drain layer.

12. The device of claim 11, wherein the first and epitaxial source/drain layers are grown on the first and second end portions of the nanowire channel layers.

13. The device of claim 11, wherein the gate structure comprises a high-k metal gate structure comprising a conformal high-k gate dielectric layer formed on surfaces of the semiconductor channel layer, and a metallic gate electrode layer.

14. The device of claim 11, wherein the isolation layer isolates the first and second source/drain contacts from the semiconductor substrate.

15. The device of claim 11, wherein the isolation layer comprises a footprint area that is substantially similar to a footprint area of the stack of nanowire channel layers.

16. The device of claim 11, further comprising a shallow trench isolation layer disposed around the isolation layer.

17. The device of claim 16, wherein the shallow trench isolation layer and the isolation layer are formed of an oxide material.

18. A semiconductor integrated circuit device, comprising:
a nanosheet field effect transistor (FET) device formed on a semiconductor substrate, wherein the nanosheet FET device comprises a stack of nanosheet channel layers, and a gate structure disposed around and in contact with the stack of nanosheet channel layers;
a first epitaxial source/drain layer disposed adjacent to a first side of the gate structure and in contact with first end portions of the nanosheet channel layers exposed through a gate sidewall spacer of the gate structure;
a second epitaxial source/drain layer disposed adjacent to a second side of the gate structure, opposite the first side of the gate structure, and in contact with second end portions of the nanosheet channel layers exposed through the gate sidewall spacer of the gate structure;
an isolation layer disposed in the semiconductor substrate below the stack of nanosheet channel layers;
a first recess formed in the isolation layer below a bottom surface of the first epitaxial source/drain layer;
a second recess formed in the isolation layer below a bottom surface of the second epitaxial source/drain layer;
a first source/drain contact formed in contact with an upper surface, sidewalls surfaces, and the bottom surface of the first epitaxial source/drain layer, wherein the first source/drain contact comprises metallic material that is disposed within the first recess in the isolation layer to make contact with the bottom surface of the first epitaxial source/drain layer; and
a second source/drain contact formed in contact with an upper surface, sidewalls surfaces, and the bottom surface of the second epitaxial source/drain layer, wherein the second source/drain contact comprises metallic material that is disposed within the second recess in the isolation layer to make contact with the bottom surface of the second epitaxial source/drain layer.

19. The device of claim 18, wherein:
the first and second epitaxial source/drain layers are grown on the first and second end portions of the nanosheet channel layers; and
the gate structure comprises a high-k metal gate structure comprising a conformal high-k gate dielectric layer formed on surfaces of the semiconductor channel layer, and a metallic gate electrode layer.

20. The device of claim 18, further comprising a shallow trench isolation layer disposed around the isolation layer;
wherein the isolation layer isolates the first and second source/drain contacts from the semiconductor substrate; and
wherein the isolation layer comprises a footprint area that is substantially similar to a footprint area of the stack of nanowire channel layers.

* * * * *